US012765240B2

(12) United States Patent
Sugi

(10) Patent No.: US 12,765,240 B2
(45) Date of Patent: Oct. 13, 2026

(54) LIGHT EMITTING ELEMENT AND DISPLAY APPARATUS

(71) Applicant: SONY GROUP CORPORATION, Tokyo (JP)

(72) Inventor: Keiji Sugi, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 494 days.

(21) Appl. No.: 18/546,485

(22) PCT Filed: Feb. 7, 2022

(86) PCT No.: PCT/JP2022/004644
§ 371 (c)(1),
(2) Date: Aug. 15, 2023

(87) PCT Pub. No.: WO2022/185845
PCT Pub. Date: Sep. 9, 2022

(65) Prior Publication Data

US 2024/0196644 A1 Jun. 13, 2024

(30) Foreign Application Priority Data

Mar. 2, 2021 (JP) ................................ 2021-032330

(51) Int. Cl.
*H10K 59/80* (2023.01)
*H10K 50/00* (2023.01)
(Continued)

(52) U.S. Cl.
CPC ........... *H10K 59/878* (2023.02); *H10K 50/00* (2023.02); *H10K 50/844* (2023.02);
(Continued)

(58) Field of Classification Search
CPC .... H10K 59/878; H10K 59/00; H10K 59/127; H10K 59/876; H10K 59/877; H10K 59/879; H10K 59/8792; H10K 59/35; H10K 59/8051; H10K 50/00; H10K 50/844; H10K 50/854; H10K 50/856; H10K 50/858;
(Continued)

(56) References Cited

U.S. PATENT DOCUMENTS

2018/0331326 A1* 11/2018 Woo .................... H10K 59/879

FOREIGN PATENT DOCUMENTS

JP 2003-317931 A 11/2003
JP 2005-275142 A 10/2005
(Continued)

OTHER PUBLICATIONS

Ichinose et al., CN 102856349, Jan. 2, 2013 (Year: 2013).*
(Continued)

*Primary Examiner* — Mary Ellen Bowman
(74) *Attorney, Agent, or Firm* — CHIP LAW GROUP

(57) ABSTRACT

A light emitting element includes a light emitting unit and an optical path control unit provided above the light emitting unit, wherein a light reflection film including an opening is disposed between the light emitting unit and the optical path control unit. The light emitting element also includes a protective layer and a planarization layer between the light emitting unit and the optical path control unit from a side of the light emitting unit.

18 Claims, 51 Drawing Sheets

(51) Int. Cl.

| | |
|---|---|
| ***H10K 50/844*** | (2023.01) |
| ***H10K 50/854*** | (2023.01) |
| ***H10K 50/856*** | (2023.01) |
| ***H10K 50/858*** | (2023.01) |
| ***H10K 50/86*** | (2023.01) |
| ***H10K 59/00*** | (2023.01) |
| ***H10K 59/127*** | (2023.01) |

(52) U.S. Cl.
CPC ......... *H10K 50/854* (2023.02); *H10K 50/856* (2023.02); *H10K 50/858* (2023.02); *H10K 50/865* (2023.02); *H10K 59/00* (2023.02); *H10K 59/127* (2023.02); *H10K 59/876* (2023.02); *H10K 59/877* (2023.02); *H10K 59/879* (2023.02); *H10K 59/8792* (2023.02)

(58) Field of Classification Search
CPC .......... H10K 50/865; G02B 3/00; G02B 5/02; G02B 5/08; G02B 5/10; G02B 5/22; G02B 5/26
See application file for complete search history.

(56) References Cited

FOREIGN PATENT DOCUMENTS

| | | | |
|---|---|---|---|
| JP | 2010-146953 | A | 7/2010 |
| JP | 2013-016272 | A | 1/2013 |
| JP | 2013-016273 | A | 1/2013 |
| JP | 2015-128027 | A | 7/2015 |
| JP | 2017-123226 | A | 7/2017 |
| JP | 2019-133816 | A | 8/2019 |
| WO | 2020/111101 | A1 | 6/2020 |

OTHER PUBLICATIONS

Gu et al., CN 112130236, Dec. 25, 2020 (Year: 2020).*
Nakamura et al., JP 2010-146953, Jul. 1, 2010 (Year: 2010).*
Iwakura et al., WO 2011-118150, Sep. 29, 2011 (Year: 2011).*
Suzuki et al., WO 2020-111101, Jun. 4, 2020 (Year: 2020).*
International Search Report and Written Opinion of PCT Application No. PCT/JP2022/004644, issued on Apr. 19, 2022, 11 pages of ISRWO.

* cited by examiner

LIGHT EMITTING ELEMENT AND DISPLAY APPARATUS

CROSS REFERENCE TO RELATED APPLICATIONS

This application is a U.S. National Phase of International Patent Application No. PCT/JP2022/004644 filed on Feb. 7, 2022, which claims priority benefit of Japanese Patent Application No. JP 2021-032330 filed in the Japan Patent Office on Mar. 2, 2021. Each of the above-referenced applications is hereby incorporated herein by reference in its entirety.

FIELD

The present disclosure relates to a light emitting element and a display apparatus.

BACKGROUND

Display apparatuses (organic electroluminescence (EL) display apparatuses) in which organic EL elements are used as light emitting elements have recently been developed. The light emitting elements constituting the organic EL display apparatus have a light emitting unit. Here, the light emitting unit is formed by, for example, stacking a first electrode (lower electrode, e.g. anode electrode) formed separately for each pixel, an organic layer including at least a light emitting layer, and a second electrode (upper electrode, e.g. cathode electrode) in this order. For example, a red light emitting element in which an organic layer that emits white light or red light and a red color filter layer are combined, a green light emitting element in which an organic layer that emits white light or green light and a green color filter layer are combined, and a blue light emitting element in which an organic layer that emits white light or blue light and a blue color filter layer are combined, are each provided as a subpixel, and these subpixels constitute one pixel. Light from the organic layers is emitted outside via the second electrode (upper electrode). A structure in which a light collecting structure having a cone or pyramid shape is provided for improving light extraction efficiency is well known from, for example, JP 2003-317931 A. A structure in which a lens member is provided for improving light extraction efficiency is also known.

CITATION LIST

Patent Literature

Patent Literature 1: JP 2003-317931 A

SUMMARY

Technical Problem

The technique disclosed in the above-described patent publication has an effect of bringing light spreading in a wide angle toward the front direction of a light emitting element, but the technique hardly contributes to improvement of the front luminance in the light emitting element. In addition, when the lens member is provided, only the region of the organic layer that is reached when parallel light emitted from the lens member is traced toward the organic layer based on a ray reverse direction tracking contributes to improvement of the front luminance in the light emitting element. In other words, only light emitted from a part of the organic layer contributes to improvement of the front luminance. Therefore, it is necessary to increase, for example, the current flowing between the first electrode and the second electrode to increase the front luminance, but this leads to shortening of the life of the light emitting element. It is the same in the case of a light emitting diode (LED). In addition, when the size of the element is reduced to increase the efficiency in the light emitting diode (LED), the efficiency may decrease because of an influence on an end surface, such as process damage.

An object of the present disclosure is to provide a light emitting element having a configuration and a structure capable of increasing front luminance, and a display apparatus including the light emitting element.

Solution to Problem

A light emitting element according to the present disclosure in order to solve the above problem includes: a light emitting unit; and an optical path control unit provided above the light emitting unit, wherein a light reflection film including an opening is disposed between the light emitting unit and the optical path control unit.

A display apparatus according to a first aspect of the present disclosure in order to solve the above problem includes a plurality of light emitting elements each including: a light emitting unit; and an optical path control unit provided above the light emitting unit, wherein a light reflection film including an opening is disposed between the light emitting unit and the optical path control unit.

A display apparatus according to a second aspect of the present disclosure in order to solve the above problem includes: a first substrate and a second substrate; and a plurality of light emitting element units each including a first light emitting element, a second light emitting element, and a third light emitting element provided on the first substrate, wherein each of the light emitting elements includes a light emitting unit provided above the first substrate and an optical path control unit provided above the light emitting unit, and a light reflection film including an opening is disposed between the light emitting unit and the optical path control unit.

DESCRIPTION OF EMBODIMENTS

Figure 1:
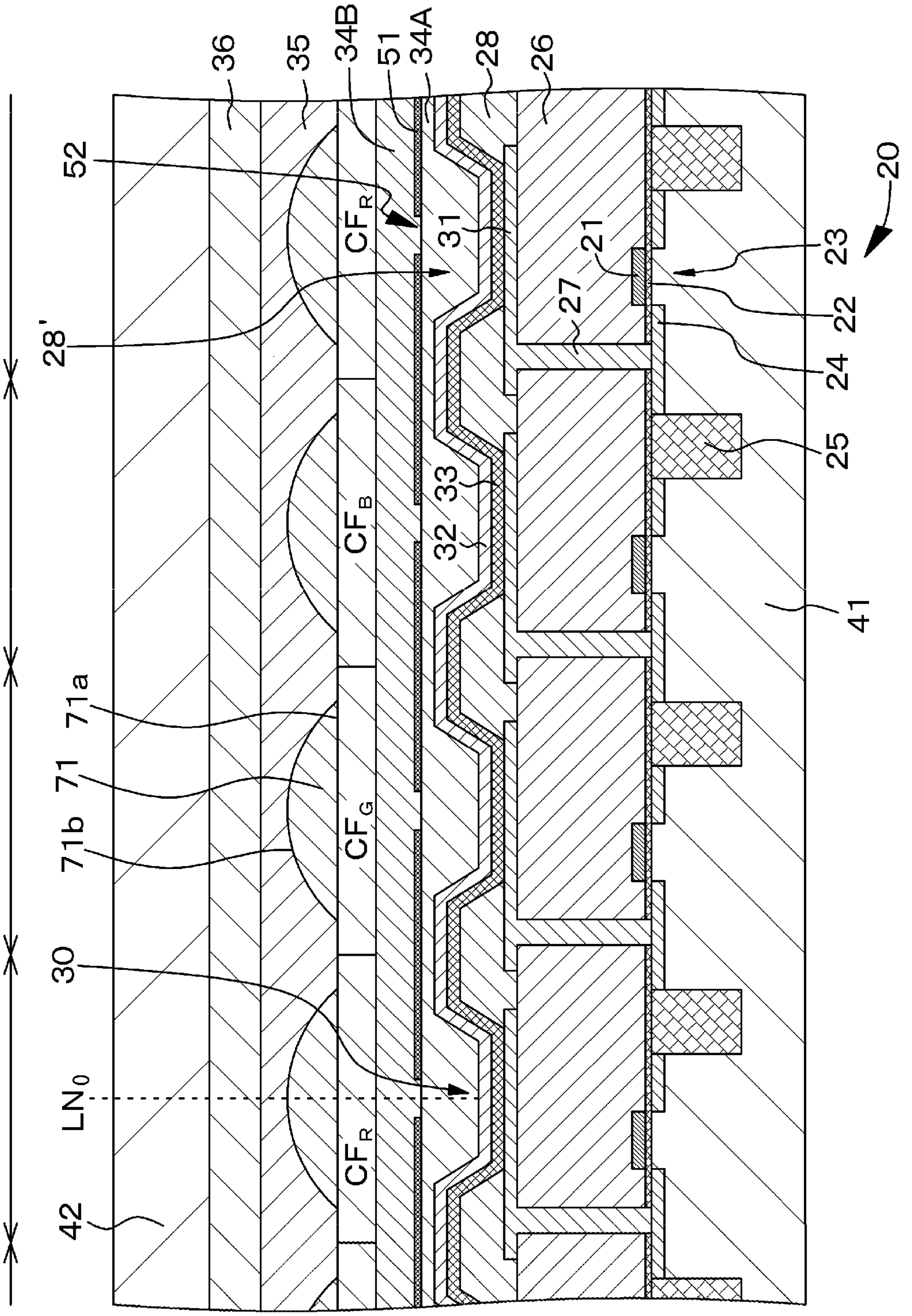
FIG. 1 is a schematic and partial sectional view of a light emitting element and a display apparatus of Example 1.

Hereinafter, the present disclosure will be described based on Examples with reference to the drawings. The present disclosure is not limited to Examples, and various numerical values and materials in Examples are examples. The description will be given in the following order.

1. General description of light emitting element of present disclosure and display apparatus according to first and second aspects of present disclosure
2. Example 1 (light emitting element of present disclosure and display apparatus according to first and second aspects of present disclosure)
3. Example 2 (modification of Example 1)
4. Example 3 (modification of Examples 1 and 2)
5. Example 4 (modification of Examples 1 to 3)
6. Example 5 (modification of Examples 1 to 4)
7. Others

[Light Emitting Element of Present Disclosure and Display Apparatus According to First and Second Aspects of Present Disclosure]

In a light emitting element of the present disclosure and light emitting elements included in a display apparatus according to a first and second aspects of the present disclosure (hereinafter, these light emitting elements may be collectively referred to as "light emitting elements of the present disclosure"), a position relatively in a direction away from a light emitting unit is expressed with "on" or "above", and a position relatively in a direction toward the light emitting unit is expressed with "beneath" or "below", in principle. The display apparatus according to the first aspect of the present disclosure and the display apparatus according to the second aspect of the present disclosure may be collectively referred to as "display apparatuses of the present disclosure".

In the light emitting elements of the present disclosure, light emitted by the light emitting unit may be emitted outside via at least an opening disposed in a light reflection film and an optical path control unit. The opening may include not only a form of a hole (space) disposed in the light reflection film but also a form of a region including a material, a structure, or a configuration having a light reflectance lower than the light reflectance of the light reflection film. The light reflection film may slightly transmit light.

In the light emitting elements of the present disclosure including the preferable forms described above, the size of the light emitting unit (light emitting region) is desirably larger than the size of the opening. That is, when an orthographic projection image referred to here is an orthographic projection image with respect to the first substrate (the same applies hereinafter), the orthographic projection image of the opening may be included in the orthographic projection image of the light emitting unit.

In the light emitting elements of the present disclosure including the preferable forms described above, $$1 \le \theta_{CA-2}/\theta_{CA-1}$$

is satisfied when $\theta_{CA-1}$ is a maximum complementary angle of an angle formed by a normal line $LN_0$ passing through a center of the light emitting unit (light emitting region) and a straight line $LL_1$ connecting the center of the light emitting unit and an end of the optical path control unit, the straight line $LL_1$ forming the angle with which the maximum complementary angle is obtained [that is, the complementary angle of an angle $\theta_{CA-1}'$ formed by the normal line $LN_0$ and the straight line $LL_1$ is $\theta_{CA-1}$ ($=90-\theta_{CA-1}'$)], and $\theta_{CA-2}$ ($=90-\theta_{CA-2}'$) is a complementary angle of an angle $\theta_{CA-2}'$ formed by a straight line $LL_2$ and the normal line $LN_0$ passing through the center of the light emitting unit, the straight line $LL_2$ connecting an end of the opening included in a virtual plane including the straight line $LL_1$ and the normal line $LN_0$ and the center of the light emitting unit. Further, $$(b/2)^2 \le \mathrm{Dist} \cdot \lambda_0$$

is preferably satisfied where b is a width of the opening, Dist is a distance from the opening to the optical path control unit, and $\lambda_0$ is a wavelength of light emitted from the light emitting unit, because light spread based on the Fraunhofer diffraction when passing through the opening enters the optical path control unit. Alternatively, $$(b/2)^2 \ge \lambda_0$$

is preferably satisfied because the light emitted from the light emitting unit is less likely to pass through the opening when the value of (½) of the width b of the opening is less than the value of the wavelength $\lambda_0$ of the light emitted from the light emitting unit.

Further, in the light emitting elements of the present disclosure including the various preferable forms described above, it is desirable that a planar shape of the opening and a planar shape of the optical path control unit have a similar relationship or an approximate relationship.

Further, in the light emitting elements of the present disclosure including the various preferable forms described above, a protective layer and a planarization layer are formed between the light emitting unit and the optical path control unit from the light emitting unit side, and the light reflection film may be disposed between the protective layer and the planarization layer. Such a form may be referred to as "light emitting element of the first form" for convenience. In this case, the light emitted by the light emitting unit may be emitted outside via at least the protective layer, the opening disposed in the light reflection film, the planarization layer, and the optical path control unit.

In the light emitting element of the first form including the various preferable forms described above, the light reflection film may have a convex shape in a direction away from the light emitting unit. In this case, a form may be taken in which the top surface of the protective layer is convex in a direction away from the light emitting unit, but the top surface of the planarization layer is flat. The protective layer corresponding to a foundation when the light reflection film is convex in a direction away from the light emitting unit may be obtained by performing melt flowing on a material constituting the protective layer, may be obtained by etching back the material, may be obtained by a combination of a photolithography technique using a gray tone mask or a halftone mask and an etching method, or may be obtained based on a nanoimprint method. Alternatively, the light emitting unit may have a convex shape in a direction away from the planarization layer. That is, the light emitting unit may have a sectional shape convex toward the first substrate. In this case, the top surface of the protective layer and the light reflection film may be flat, or the top surface of the protective layer and the light reflection film may be convex in a direction away from the light emitting unit. A method of forming the light emitting unit into a convex shape in a direction away from the planarization layer will be described later.

Examples of the sectional shape in a virtual plane including a thickness direction of the light reflection film when light reflection film is convex in a direction away from the light emitting unit and examples of the sectional shape in a virtual plane including a height direction of the light emitting unit when the light emitting unit is convex in a direction away from the planarization layer include a part of a circle, a part of a parabola, a part of a sine curve, a part of an ellipse, and a part of a catenary curve. The figure is not strictly a part of a circle in some cases, not strictly a part of a parabola in some case, not strictly a part of a sine curve in some cases, not strictly a part of an ellipse in some cases, or not strictly a part of a catenary curve in some cases. That is, the cases where the figure is substantially a part of a circle, substantially a part of a parabola, substantially a part of a sine curve, substantially a part of an ellipse, and substantially a part of a catenary curve are also included in the case where "the figure is a part of a circle, a part of a parabola, a part of a sine curve, substantially a part of an ellipse, or substantially a part of a catenary curve". A part of these curves may be replaced by a line segment.

Further, in the light emitting element of the first form including the various preferable forms described above, a transparent thin film may be formed between a portion of the protective layer positioned at a bottom of the opening and the planarization layer. This form can planarize the interfaces of the protective layer and the transparent thin film with the planarization layer. The material constituting the transparent thin film may be appropriately selected from materials that hardly absorb light emitted from the light emitting unit, and desirably $$n_1 \geq n_3 \geq n_2$$

or $$n_2 \geq n_3 \geq n_1$$

is satisfied, where $n_3$ is a refractive index of the material constituting the transparent thin film, $n_1$ is a refractive index of the material constituting the protective layer, and $n_2$ is a refractive index of the material constituting the planarization layer, from the viewpoint of preventing occurrence of reflection at the interface between the protective layer and the transparent thin film and the interface between the transparent thin film and the planarization layer. Specific examples of the material constituting the transparent thin film include an acrylic resin, an epoxy resin, and a silicone resin. In some cases, the transparent thin film may be formed on the top surface of the protective layer or may be formed beneath the bottom surface of the planarization layer.

In the light emitting elements of the present disclosure including the various preferable forms described above, a first light scattering layer may be formed beneath the light emitting unit. In the light emitting element of the first form including the various preferable forms described above, a second light scattering layer may be formed at least in a portion of the protective layer positioned at a bottom of the opening. Examples of the material constituting the first light scattering layer and the second light scattering layer include fine particles, specifically, fine particles of aluminum oxide, titanium oxide, and the like. In a form in which the first light scattering layer is formed beneath the light emitting unit, the first electrode may be appropriately selected from materials (semi-light transmitting material or light transmitting material) constituting the first electrode and the second electrode described later.

Further, in the light emitting elements of the present disclosure including the various preferable forms described above, a form may be taken in which the light reflection film is continuous in adjacent light emitting elements, or a form may be taken in which the light reflection film has an edge portion (that is, the light reflection film is discontinuous in adjacent light emitting elements). In the latter case, a light absorbing material layer may be formed on a region of the protective layer positioned outside the edge portion of the light reflection film (region where the light reflection film is discontinuous), or a groove may be formed in a region of the protective layer positioned outside the edge portion of the light reflection film (region where the light reflection film is discontinuous), and the planarization layer may be extended in the groove. When the planarization layer is extended in the groove, the light reflection film may be further extended on the side wall of the groove formed in the protective layer. Alternatively, a light absorbing material layer may be formed on a region of the protective layer positioned outside the edge portion of the light reflection film (region where the light reflection film is continuous). The light absorbing material layer may have the same configuration and structure as those of a light absorbing layer (black matrix layer) described later.

In the light emitting elements of the present disclosure including the various preferable forms and configurations described above, the light emitting unit may have a stacked structure of a first electrode, an organic layer, and a second electrode, and the light reflection film may be formed above the second electrode. In such a case, the organic layer may include a light emitting layer composed of an organic electroluminescence layer. However, the present disclosure is not limited to this configuration, and in the light emitting elements of the present disclosure including the various preferable forms and configurations described above, the light emitting unit may be composed of a light emitting diode (LED).

Examples of the material constituting the light reflection film include aluminum, an aluminum alloy (for example, Al—Nd or Al—Cu), an Al/Ti stacked structure, an Al—Cu/Ti stacked structure, chromium (Cr), silver (Ag), a silver alloy (for example, Ag—Cu, Ag—Pd—Cu, or Ag—Sm—Cu), copper, a copper alloy, gold, and a gold alloy. The light reflection film may be formed by, for example: vapor deposition methods including an electron beam vapor deposition method, a hot filament vapor deposition method, and a vacuum vapor deposition method; sputtering methods;

CVD methods; ion plating methods; plating methods, such as electroplating methods and electroless plating methods; lift-off methods; laser ablation methods; and sol-gel methods. Depending on the material constituting the light reflection film, an underlayer made of, for example, TiN, may be formed to control the crystalline state of the light reflection film to be formed. Alternatively, examples of the material constituting the light reflection film include a dielectric multilayer film, a photonic crystal layer, and a wavelength selection layer to which plasmon is applied, which is described later. In some cases, a second light reflection film may be formed beneath the first electrode or below the first electrode. In this case, the material constituting the second light reflection film may be appropriately selected from the materials constituting the above-described light reflection film, and the first electrode may be appropriately selected from materials constituting the first electrode and the second electrode (semi-light transmitting material or light transmitting material) described later.

Further, the light emitting elements of the present disclosure including the preferable forms and configurations described above may have a wavelength selection unit between the light emitting unit and the optical path control unit. More specifically, in the light emitting element of the first form, the wavelength selection unit may be formed on the planarization layer. However, the present disclosure is not limited to this form, and the wavelength selection unit may be provided above the optical path control unit (specifically, between the second substrate and the optical path control unit). That is, the wavelength selection unit is provided above the first substrate, and the wavelength selection unit may be provided on the first substrate side or the second substrate side. The size of the wavelength selection unit may be appropriately changed according to light emitted from the light emitting element.

Examples of the wavelength selection unit include a color filter layer. Examples of the color filter layer include a color filter layer that transmits not only red, green, and blue, but also specific wavelengths such as cyan, magenta, and yellow in some cases. The color filter layer is made of a resin (for example, a photocurable resin) to which a colorant including a desired pigment or dye is added, and by selecting a pigment or dye, the light transmittance of the color filter layer is adjusted to be high in a target wavelength region such as red, green, and blue and low in other wavelength regions. Such a color filter layer may be made of a known color resist material. In a light emitting element that emits white light, which will be described later, a transparent filter layer may be disposed. Alternatively, examples of the wavelength selection unit include a photonic crystal, a wavelength selection element to which plasmon is applied (for example, a wavelength selection unit having a conductor grid structure in which a grid-shaped hole structure is provided in a conductor thin film disclosed in JP 2008-177191 A, or a wavelength selection unit based on surface plasmon excitation using a diffraction grating), a wavelength selection unit with a dielectric multilayer film capable of transmitting a specific wavelength by using multiple reflection in a thin film by stacking dielectric thin films, a thin film made of an inorganic material such as thin film amorphous silicon, and a quantum dot. Hereinafter, the color filter layer may be described as a representative of the wavelength selection unit, but the wavelength selection unit is not limited to the color filter layer.

Here, the present disclosure may take (a) a form in which an orthographic projection image of the optical path control unit matches an orthographic projection image of the wavelength selection unit, (b) a form in which the orthographic projection image of the optical path control unit is included in the orthographic projection image of the wavelength selection unit, or (c) a form in which the orthogonal projection image of the wavelength selection unit is included in the orthogonal projection image of the optical path control unit.

That is, the planar shape of the wavelength selection unit may be the same as, similar to, approximate to, or different from the planar shape of the optical path control unit. Adopting a form in which the orthogonal projection image of the optical path control unit is included in the orthogonal projection image of the wavelength selection unit can reliably reduce the occurrence of color mixture between adjacent light emitting elements.

The planar shape of the wavelength selection unit may be the same as, similar to, approximate to, or different from the planar shape of a light emitting region, which will be described later. The center of the wavelength selection unit (the center when the wavelength selection unit is orthogonally projected onto the first substrate) may pass through the center of the light emitting region but does not have to pass through the center of the light emitting region. The size of the wavelength selection unit, the size of the opening provided in the light reflection film, or the size of the wavelength selection unit and the size of the opening provided in the light reflection film may be appropriately changed according to a distance (offset amount) $d_0$ (described later) between the normal line passing through the center of the light emitting region and the normal line passing through the center of the wavelength selection unit. Here, the various normal lines are vertical lines with respect to the first substrate.

The center of the wavelength selection unit refers to an area centroid point of a region occupied by the wavelength selection unit. Alternatively, when the planar shape of the wavelength selection unit is a circle, an ellipse, a square (including a square with rounded corners), a rectangle (including a rectangle with rounded corners), or a regular polygon (including a regular polygon with rounded corners), the center of these shapes corresponds to the center of the wavelength selection unit. When the planar shape has a shape in which a part of these shapes is cut out, the center of the shape with the cutout part being complemented corresponds to the center of the wavelength selection unit. When the planar shape has a shape in which these shapes are connected, the connection part is removed, and the center of the shape with the removed part being complemented corresponds to the center of the wavelength selection unit. The center of the optical path control unit refers to an area centroid point of a region occupied by the optical path control unit. When the planar shape of the optical path control unit is a circle, an ellipse, a square (including a square with rounded corners), a rectangle (including a rectangle with rounded corners), or a regular polygon (including a regular polygon with rounded corners), the center of these shapes corresponds to the center of the optical path control unit. The same applies to the center of the opening provided in the light reflection film, and the "wavelength selection unit" or the "optical path control unit" may be replaced with the "opening" in the above description regarding the center of the wavelength selection unit or the optical path control unit.

In the light emitting element of the first form, a region where the first electrode and the organic layer are in contact with each other is a light emitting region. The size of the light emitting region is the size of the region where the first electrode and the organic layer are in contact with each other. The size of the light emitting region may be changed according to the color of light to be emitted from the light emitting element. The center of the light emitting region refers to an area centroid point of the region where the first electrode and the organic layer are in contact with each other. The center of the light emitting region is the center of the light emitting unit.

In the light emitting elements of the present disclosure including the preferable forms and configurations described above, the optical path control unit may be formed of a lens member such as a plano-convex lens having a convex shape in a direction away from the light emitting unit. That is, the light emission surface of the optical path control unit (lens member) may have a convex shape, and the light incident surface may be flat, for example. Alternatively, the light incident surface of the optical path control unit (lens member) may have a convex shape, and the light emission surface may be flat, for example.

In the display apparatuses of the present disclosure, the size of the planar shape of the optical path control unit may be changed depending on the light emitting element. For example, when one light emitting element unit (pixel) is composed of three light emitting elements (subpixels), the sizes of the planar shapes of the optical path control units may have the same value in the three light emitting elements that form one light emitting element unit, may have the same value in two light emitting elements except for one light emitting element, or may have different values in the three light emitting elements. The refractive index of the material constituting the optical path control unit may be changed depending on the light emitting element. For example, when one light emitting element unit (pixel) is composed of three light emitting elements (subpixels), the refractive indexes of the materials constituting the optical path control units may have the same value in the three light emitting elements, may have the same value in two light emitting elements except for one light emitting element, or may have different values in the three light emitting elements.

In the light emitting elements of the present disclosure including the various preferable forms and configurations described above, the lens member constituting the optical path control unit may be formed in a hemispherical shape or a part of a sphere, or may be formed in a shape suitable for functioning as a lens in a broad sense. Specifically, as described above, the lens member may be formed of a convex lens member, specifically, a plano-convex lens. The lens member may be a spherical lens or an aspherical lens. The optical path control unit may be a refractive lens or a diffractive lens, or it may be formed of a fine structure, a photonic crystal, or a metal surface.

The optical path control unit may be a lens member having, as a whole, a rounded three-dimensional shape of a rectangular prism (including a cube approximated to a rectangular prism, the same applies hereinafter) having a square or rectangular bottom surface, in which the four side surfaces and one top surface of the rectangular prism have convex shapes, ridge parts where the side surfaces intersect each other are rounded, and ridge parts where the top surface intersects the side surfaces are also rounded. The optical path control units may also be a lens member having a three-dimensional shape of a rectangular prism having a square or rectangular bottom surface, in which the four side surfaces and one top surface of the rectangular prism have a planar shape. In this case, ridge parts where the side surfaces intersect each other may be rounded in some case, and ridge parts where the top surface intersects the side surfaces may also be rounded in some cases. The lens member may be formed of a lens member having a rectangular or isosceles trapezoidal sectional shape cut along a virtual plane (vertical virtual plane) including its thickness direction. In other words, the lens member may be formed of a lens member whose sectional shape is constant or changed along the thickness direction.

The height of the lens member is preferably, but not limited to, 1.5 μm or more and 2.5 μm or less. When the height of the lens member is 1.5 μm or more, the light collecting effect in the vicinity of the outer periphery of the light emitting region can be effectively enhanced. The interval between adjacent lens members (gap present between adjacent lens members) is desirably, but not limited to, 0.4 μm or more and 1.2 μm or less, preferably 0.6 μm or more and 1.2 μm or less, more preferably 0.8 μm or more and 1.2 μm or less, and still more preferably 0.8 μm or more and 1.0 μm or less. By setting the interval between adjacent lens members to 0.4 μm or more, the interval between the adjacent lens members can be set to be approximately equal to or more than the lower limit value of the wavelength band of visible light. Thus, it is possible to reduce the functional degradation of the interval between the adjacent lens members and to effectively enhance the light collection effect in the vicinity of the outer periphery of the light emitting region. When the interval between adjacent lens members is 1.2 μm or less, the size of the lens member with respect to the light emitting region can be made appropriate, and the light collecting effect in the vicinity of the outer periphery of the light emitting region can be effectively enhanced. The pitch of the lens members is not limited, but it is desirably 1 μm or more and 10 μm or less. When the pitch of the lens members is 10 μm or less, wave properties of light are remarkably generated, and thus the effect of using the lens member described above is remarkably exhibited. The distance between the light emitting region and the lens member is not limited, but it is desirably more than 0.35 μm and 7 μm or less, preferably 1.3 μm or more and 7 μm or less, more preferably 2.8 μm or more and 7 μm or less, and still more preferably 3.8 μm or more and 7 μm or less. When the distance between the light emitting region and the lens member exceeds 0.35 μm, the light collecting effect in the vicinity of the outer periphery of the light emitting region can be efficiently enhanced. When the distance between the light emitting region and the lens member is 7 μm or less, degradation in viewing angle properties can be prevented.

In the light emitting elements of the present disclosure, the optical path control unit may be formed of a light emission direction control member having a rectangular or isosceles trapezoidal sectional shape cut along a virtual plane (vertical virtual plane) including a thickness direction. In other words, the optical path control unit may be formed of the light emission direction control member whose sectional shape is constant or changed along the thickness direction. The light emission direction control member will be described later.

In the light emitting elements of the present disclosure including the various preferable forms and configurations described above, more specifically, in the light emitting element of the first form including the various preferable forms and configurations described above, the light emitting unit (organic layer) may include an organic electroluminescence layer as described above. That is, the light emitting elements of the present disclosure including the various preferable forms and configurations described above may be composed of an organic electroluminescence element (organic EL element), and the display apparatuses of the present disclosure may be composed of an organic electroluminescence display apparatus (organic EL display apparatus).

The organic EL display apparatus includes:

a first substrate and a second substrate; and a plurality of light emitting elements positioned between the first substrate and the second substrate and arrayed in a two-dimensional manner, wherein each of the light emitting elements provided on a base formed on the first substrate is any of the light emitting elements of the present disclosure including the preferable forms and configurations described above (more specifically, the light emitting element of the first form). Each of the light emitting elements includes a light emitting unit, and the light emitting unit at least includes:

a first electrode;

a second electrode; and an organic layer (including a light emitting layer composed of an organic electroluminescence layer) sandwiched between the first electrode and the second electrode, wherein light from the organic layer is emitted outside via the second substrate. That is, the display apparatuses of the present disclosure may be top emission type display apparatuses that emit light from the second substrate.

Alternatively, in other words, the display apparatuses of the present disclosure include the first substrate, the second substrate, and an image display region (display panel unit) sandwiched between the first substrate and the second substrate, and in the image display region, a plurality of light emitting elements including the preferable forms and configurations described above are arrayed in a two-dimensional matrix.

In the display apparatus according to the second aspect of the present disclosure, a first light emitting element may emit red light, a second light emitting element may emit green light, and a third light emitting element may emit blue light. Further, a fourth light emitting element that emits white light or a fourth light emitting element that emits light of a color other than red light, green light, and blue light may be added.

Examples of the array of the pixels (or subpixels) in the display apparatuses of the present disclosure include delta array, stripe array, diagonal array, rectangle array, Pentile array, and square array. The array of the wavelength selection units and the optical path control units may be in delta array, stripe array, diagonal array, rectangle array, or Pentile array in accordance with the array of the pixels (or subpixels).

That is, the light emitting element of the first form specifically includes, at least, a first electrode, an organic layer formed on the first electrode, a second electrode formed on the organic layer, a protective layer formed on the second electrode, a light reflection film, and a planarization layer. Light from the organic layer is emitted outside via the second electrode, the protective layer, the opening provided in the light reflection film, the planarization layer, the optical path control unit, the bonding member, and the second substrate, and also via the wavelength selection unit and the underlayer in a case where the wavelength selection unit is provided in the optical path of the emitted light or in a case where the underlayer is provided on an inner surface (surface facing the first substrate) of the second substrate.

The first substrate and the second substrate are bonded by a bonding member. Examples of a material constituting the bonding member include thermosetting adhesives, such as an acrylic adhesive, an epoxy adhesive, a urethane adhesive, a silicone adhesive, and a cyanoacrylate adhesive, and ultraviolet-curable adhesives. It is preferable that $$n_1' > n_0$$

is satisfied where $n_1'$ is a refractive index of the material constituting the optical path control unit, and $n_0$ is a refractive index of the material constituting the bonding member.

The first electrode is provided for each light emitting element. The organic layer including a light emitting layer made of an organic light emitting material is provided for each light emitting element or is shared by the light emitting elements. The second electrode is shared by a plurality of light emitting elements. That is, the second electrode is a so-called solid electrode and is also a common electrode. The first substrate is disposed below or beneath the base, and the second substrate is disposed above the second electrode. The light emitting elements are formed on the first substrate side, and the light emitting units are provided on the base. Specifically, each light emitting unit is provided on the base formed on or above the first substrate. In this manner, the first electrode, the organic layer (including the light emitting layer), and the second electrode constituting the light emitting unit are sequentially formed on the base.

In the light emitting element of the first form, the first electrode may be in contact with a part of the organic layer, a part of the first electrode may be in contact with the organic layer, or the first electrode may be in contact with the organic layer. In these cases, specifically, the size of the first electrode may be smaller than the size of the organic layer, the size of the first electrode may be the same as the size of the organic layer, or the size of the first electrode may be larger than the size of the organic layer. An insulating layer may be formed in a part between the first electrode and the organic layer.

In the light emitting element of the first form, the organic layer may have a stacked structure of at least two light emitting layers that emit different colors, and the color of light emitted in the stacked structure may be white light. That is, an organic layer constituting a red light emitting element (first light emitting element), an organic layer constituting a green light emitting element (second light emitting element), and an organic layer constituting a blue light emitting element (third light emitting element) may be configured to emit white light. In this case, the organic layer that emits white light may have a stacked structure of a red light emitting layer that emits red light, a green light emitting layer that emits green light, and a blue light emitting layer that emits blue light. Alternatively, the organic layer that emits white light may have a stacked structure of a blue light emitting layer that emits blue light and a yellow light emitting layer that emits yellow light, or it may have a stacked structure of a blue light emitting layer that emits blue light and an orange light emitting layer that emits orange light. Specifically, the organic layer may have a stacked structure in which three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm) are stacked, and the organic layer emits white light as a whole. Such an organic layer (light emitting unit) that emits white light and a wavelength selection unit (or a protective layer that functions as a red color filter layer) that transmits red light are combined to form a red light emitting element, an organic layer (light emitting unit) that emits white light and a wavelength selection unit (or a protective layer that functions as a green color filter layer) that transmits green light are combined to form a green light emitting element, and an organic layer (light emitting unit) that emits white light and a wavelength selection unit (or a protective layer that functions as a blue color filter layer) that transmits blue light are combined to form a blue light emitting element. One pixel (light emitting element unit) is composed of a combination of subpixels, such as a red light emitting element, a green light emitting element, and a blue light emitting element. In some cases, one pixel may be composed of a red light emitting element, a green light emitting element, a blue light emitting element, and a light emitting element that emits white light (or a light emitting element that emits complementary color light). In the form composed of at least two light emitting layers that emit different colors, there is a case where the light emitting layers that emit different colors may be mixed and not clearly separated into the respective layers in practice. The organic layer may be shared by a plurality of light emitting elements or may be individually provided for each light emitting element.

When the protective layer has a function as a color filter layer, the protective layer may be made of a known color resist material. In the light emitting element that emits white light, a transparent filter layer may be disposed. With the protective layer also functioning as a color filter layer, the organic layer and the protective layer (color filter layer) come close to each other, which can effectively prevent color mixture even with a widened angle of light emitted from the light emitting element and improve viewing angle properties.

The organic layer may also be formed of one light emitting layer. In this case, the light emitting element may be composed of, for example, a red light emitting element having an organic layer including a red light emitting layer, a green light emitting element having an organic layer including a green light emitting layer, or a blue light emitting element having an organic layer including a blue light emitting layer. That is, the organic layer constituting the red light emitting element may emit red light, the organic layer constituting the green light emitting element may emit green light, and the organic layer constituting the blue light emitting element may emit blue light. One pixel is composed of these three light emitting elements (subpixels). In the case of a color display apparatus, one pixel is composed of these three light emitting elements (subpixels). In principle, formation of a color filter layer is unnecessary, but a color filter layer may be provided for improving color purity.

When the light emitting element unit (one pixel) is composed of a plurality of light emitting elements (subpixels), the size of the light emitting region of the light emitting elements may be changed depending on the light emitting elements. Specifically, the size of the light emitting region of the third light emitting element (blue light emitting element) may be larger than the size of the light emitting region of the first light emitting element (red light emitting element) and the size of the light emitting region of the second light emitting element (green light emitting element). This allows the amount of light emission of the blue light emitting element to be larger than the amount of light emission of the red light emitting element and the amount of light emission of the green light emitting element, helps the blue light emitting element, the red light emitting element, and the green light emitting element have appropriate amounts of light emission, and can improve image quality. Alternatively, when a light emitting element unit (one pixel) composed of a white light emitting element that emits white light in addition to the red light emitting element, the green light emitting element, and the blue light emitting element is assumed, the size of the light emitting region of the green light emitting element and the size of the light emitting region of the white light emitting element are preferably larger than the size of the light emitting region of the red light emitting element and the size of the light emitting region of the blue light emitting element, from the viewpoint of luminance. The size of the light emitting region of the blue light emitting element is preferably larger than the size of the light emitting region of the red light emitting element, the size of the green light emitting element, and the size of the white light emitting element, from the viewpoint of the life of the light emitting element. However, the sizes of the light emitting regions are not limited to these configurations.

The optical path control unit may be made of, for example, a known transparent resin material such as an acrylic resin, and it may be obtained by melt-flowing the transparent resin material, may be obtained by etching back the transparent material, may be obtained by a combination of a photolithography technique using a gray tone mask or a halftone mask and an etching method based on an organic material or an inorganic material, or may be obtained by a method of forming the transparent resin material into a lens shape based on a nanoimprint method. As described above, examples of the outer shape of the optical path control unit include, but are not limited to, a circle, an ellipse, a square, and a rectangle.

Examples of the material constituting the protective layer and the planarization layer include an acrylic resin, an epoxy resin, and various inorganic materials [for example, $SiO_2$, SiN, SiON, SiC, amorphous silicon (α-Si), $Al_2O_3$, and $TiO_2$]. The protective layer and the planarization layer may have a single layer configuration or may be formed of a plurality of layers. In the latter case, in the light emitting element of the first form, the value of the refractive index of the material constituting the protective layer and the planarization layer is preferably the same or sequentially reduced from the light incident direction toward the light emission direction. The protective layer and the planarization layer may be formed by known methods, such as various CVD methods, various coating methods, various PVD methods including a sputtering method and a vacuum vapor deposition method, and various printing methods such as a screen printing method. As a method for forming the protective layer and the planarization layer, an atomic layer deposition (ALD) method may also be adopted. The protective layer and the planarization layer may be shared by a plurality of light emitting elements or may be individually provided for each light emitting element.

The first substrate or the second substrate may be formed of a silicon semiconductor substrate, a high strain point glass substrate, a soda glass ($Na_2O·CaO·SiO_2$) substrate, a borosilicate glass ($Na_2O·B_2O_3·SiO_2$) substrate, a forsterite ($2MgO·SiO_2$) substrate, a lead glass ($Na_2O·PbO·SiO_2$) substrate, various glass substrates having an insulating material layer formed on the surface thereof, a quartz substrate, a quartz substrate having an insulating material layer formed on the surface thereof, or an organic polymer (having a form of a polymer material such as a flexible plastic film, a plastic sheet, or a plastic substrate made of a polymer material) exemplified by polymethyl methacrylate (PMMA), polyvinyl alcohol (PVA), polyvinylphenol (PVP), polyethersulfone (PES), polyimide, polycarbonate, polyethylene terephthalate (PET), and polyethylene naphthalate (PEN). The materials constituting the first substrate and the second substrate may be the same or different. Since the display apparatus of the present disclosure is a top emission type display apparatus, the second substrate is required to be transparent to light from the light emitting unit.

When the first electrode functions as an anode electrode, examples of the material constituting the first electrode include a metal having a high work function, such as platinum (Pt), gold (Au), silver (Ag), chromium (Cr), tungsten (W), nickel (Ni), copper (Cu), iron (Fe), cobalt (Co), molybdenum (Mo), titanium (Ti), aluminum (Al), magnesium (Mg), or tantalum (Ta), and an alloy (for example, an Ag—Pd—Cu alloy containing silver as a main component and containing 0.3 mass % to 1 mass % of palladium (Pd) and 0.3 mass % to 1 mass % of copper (Cu), an Al—Nd alloy, an Al—Cu alloy, or an Al—Cu—Ni alloy). When a conductive material having a small work function value and a high light reflectance, such as aluminum (Al) and an alloy containing aluminum, is used, the first electrode may be used as an anode electrode by improving hole injection properties by providing an appropriate hole injection layer or the like. The thickness of the first electrode may be 0.1 μm to 1 μm, for example. When a light reflection layer constituting a resonator structure to be described later is provided, when the first light scattering layer is formed beneath the light emitting unit, when the second light reflection film is formed beneath or below the first electrode, or the like, the first electrode is required to be transparent to light from the light emitting unit. Thus, examples of the material constituting the first electrode include various transparent conductive materials, such as transparent conductive materials containing, as a base layer, indium oxide, indium-tin oxide (ITO, including Sn-doped $In_2O_3$, crystalline ITO, and amorphous ITO), indium-zinc oxide (IZO), indium-gallium oxide (IGO), indium-doped gallium-zinc oxide (IGZO, In—$GaZnO_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, spinel-type oxide, oxide having a $YbFe_2O_4$ structure, gallium oxide, titanium oxide, niobium oxide, nickel oxide, or the like. The first electrode may also have a structure in which a transparent conductive material having excellent hole injection properties, such as an oxide of indium and tin (ITO) or an oxide of indium and zinc (IZO), is stacked on a dielectric multilayer film or a reflective film having high light reflectivity, such as aluminum (Al) or an alloy thereof (for example, Al—Cu—Ni alloy). When the first electrode functions as a cathode electrode, the first electrode is desirably made of a conductive material having a small work function value and a high light reflectance. The first electrode may be used as a cathode electrode by improving electron injection properties by providing an appropriate electron injection layer in a conductive material having a high light reflectance used as an anode electrode.

When the second electrode functions as a cathode electrode, the material (semi-light transmitting material or light transmitting material) constituting the second electrode is desirably made of a conductive material having a small work function value so as to transmit emitted light and to efficiently inject electrons into the organic layer (light emitting layer). Examples thereof include a metal having a small work function, such as aluminum (Al), silver (Ag), magnesium (Mg), calcium (Ca), sodium (Na), or strontium (Sr), and an alloy of an alkali metal or an alkaline earth metal and silver (Ag) such as magnesium (Mg) and silver (Ag) (Mg—Ag alloy), an alloy of magnesium and calcium (Mg—Ca alloy), or an alloy of aluminum (Al) and lithium (Li) (Al—Li alloy). Of these, a Mg—Ag alloy is preferable, and the volume ratio between magnesium and silver may be, for example, Mg:Ag=5:1 to 30:1. The volume ratio between magnesium and calcium may be, for example, Mg:Ca=2:1 to 10:1. The thickness of the second electrode may be, for example, 4 nm to 50 nm, preferably 4 nm to 20 nm, more preferably 6 nm to 12 nm. Examples of the material of the second electrode also include at least one material selected from the group consisting of Ag—Nd—Cu, Ag—Cu, Au, and Al—Cu. The second electrode may also have a stacked structure of the above-described material layer and a so-called transparent electrode (for example, having a thickness of $3\times10^{-8}$ m to $1\times10^{-6}$ m) made of, for example, ITO or IZO from the organic layer side. A bus electrode (auxiliary electrode) made of a low-resistance material, such as aluminum, an aluminum alloy, silver, a silver alloy, copper, a copper alloy, gold, or a gold alloy may be provided to the second electrode to reduce the resistance of the second electrode as a whole. The average light transmittance of the second electrode is desirably 50% to 90%, and preferably 60% to 90%. When the second electrode functions as an anode electrode, the second electrode is desirably made of a conductive material that transmits emitted light and has a large work function value.

Examples of a method for forming the first electrode and the second electrode include: vapor deposition methods including an electron beam vapor deposition method, a hot filament vapor deposition method, and a vacuum vapor deposition method; sputtering methods; chemical vapor deposition methods (CVD methods); MOCVD methods; a combination of an ion plating method and an etching method; various printing methods such as a screen printing method, an inkjet printing method, and a metal mask printing method; plating methods, such as electroplating method and electroless plating method; lift-off methods; laser ablation methods; and sol-gel methods. With various printing methods and plating methods, it is possible to directly form the first electrode and the second electrode having a desired shape (pattern). When the second electrode is formed after the organic layer is formed, it is particularly preferable to form the second electrode based on a film forming method in which the energy of film-forming particles is small, such as a vacuum vapor deposition method, or a film forming method such as an MOCVD method, from the viewpoint of preventing occurrence of damage to the organic layer. When the organic layer is damaged, a non-light emitting pixel (or a non-light emitting subpixel) called a "dot" may be generated because of generation of a leakage current.

The organic layer includes a light emitting layer made of an organic light emitting material, as described above. Specifically, the organic layer may have, for example, a stacked structure of a hole transport layer, a light emitting layer, and an electron transport layer, a stacked structure of a hole transport layer and a light emitting layer also serving as an electron transport layer, and a stacked structure of a hole injection layer, a hole transport layer, a light emitting layer, an electron transport layer, and an electron injection layer. Examples of a method for forming the organic layer include: a physical vapor deposition method (PVD method) such as a vacuum vapor deposition method; a printing method such as a screen printing method or an inkjet printing method; a laser transfer method in which a stacked structure of a laser absorption layer and an organic layer formed on a transfer substrate is irradiated with a laser to separate the organic layer on the laser absorption layer and transfer the organic layer; and various coating methods. When the organic layer is formed based on a vacuum vapor deposition method, the organic layer may be obtained by using a so-called metal mask and depositing a material that has passed through an opening provided in the metal mask, for example.

In the organic EL display apparatus, it is desirable that the thickness of the hole transport layer (hole supply layer) and the thickness of the electron transport layer (electron supply layer) are substantially equal. Alternatively, the electron transport layer (electron supply layer) may be thicker than the hole transport layer (hole supply layer), which makes it possible to sufficiently supply electrons necessary for high efficiency at a low drive voltage to the light emitting layer. That is, supply of holes can be increased by disposing the hole transport layer between the first electrode corresponding to the anode electrode and the light emitting layer, the hole transport layer having a film thickness smaller than the electron transport layer. As a result, it is possible to obtain a carrier balance in which there is no excess or deficiency of holes and electrons and the carrier supply amount is sufficiently large, resulting in a high luminous efficiency. In addition, since there is no excess or deficiency of holes and electrons, carrier balance is hardly lost, drive deterioration is inhibited, and a light emission lifetime can be extended.

In the light emitting element or the display apparatus of the present disclosure, a base, an insulating layer, an interlayer insulating layer, and an interlayer insulating material layer (described later) are formed. Examples of the insulating material constituting them include: SiOx-based materials (materials constituting a silicon-based oxide film) such as $SiO_2$, non-doped silicate glass (NSG), boron phosphorus silicate glass (BPSG), PSG, BSG, AsSG, SbSG, PbSG, spin-on glass (SOG), low temperature oxide (LTO), low temperature CVD-$SiO_2$, low-melting-point glass, and glass paste; SiN-based materials including SiON-based materials; SiOC; SiOF; and SiCN. Examples of the material also include inorganic insulating materials, such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), and vanadium oxide ($VO_x$). Examples of the material also include various resins such as a polyimide resin, an epoxy resin, and an acrylic resin, and low dielectric constant insulating materials such as SiOCH, organic SOG, and a fluorine resin (for example, a material having a dielectric constant k ($=\varepsilon/\varepsilon_0$) of, for example, 3.5 or less, and specific examples thereof include fluorocarbon, a cycloperfluorocarbon polymer, benzocyclobutene, a cyclic fluorine resin, polytetrafluoroethylene, amorphous tetrafluoroethylene, polyaryl ether, fluorinated aryl ether, fluorinated polyimide, amorphous carbon, parylene (polyparaxylylene), and fluorinated fullerene), Silk (coating-type low-dielectric-constant interlayer insulating film material, a trademark of The Dow Chemical Company), and Flare (polyallyl ether (PAE)-based material, a trademark of Honeywell Electronic Materials Co.). These materials may be used alone or in appropriate combination. The insulating layer, the interlayer insulating layer, and the base may have a single layer structure or a stacked structure. The insulating layer, the interlayer insulating layer, the interlayer insulating material layer, and the base may be formed based on known methods, such as various CVD methods, various coating methods, various PVD methods including a sputtering method and a vacuum vapor deposition method, various printing methods such as a screen printing method, plating methods, electrodeposition methods, immersion methods, and sol-gel methods.

On the outermost surface (specifically, the outer surface of the second substrate) of the display apparatus from which light is emitted, an ultraviolet absorbing layer, a contamination preventing layer, a hard coat layer, and an antistatic layer may be formed, or a protective member (for example, cover glass) may be disposed.

Although not limited, a light emitting element drive unit (drive circuit) is provided beneath or below the base. The light emitting element drive unit includes, for example, a transistor (specifically, for example, a MOSFET) formed on a silicon semiconductor substrate constituting the first substrate, or a thin film transistor (TFT) provided on various substrates constituting the first substrate. The transistor or the TFT constituting the light emitting element drive unit may be connected to the first electrode via a contact hole (contact plug) formed in the base. The light emitting element drive unit may have a known circuit configuration. The second electrode may be connected to the light emitting element drive unit via a contact hole (contact plug) formed in the base in the outer periphery (specifically, the outer periphery of the pixel array unit) of the display apparatus, for example.

The organic EL display apparatus preferably includes a resonator structure to further improve the light extraction efficiency. The resonator structure will be described later.

Further, in the light emitting elements of the present disclosure including the preferable forms and configurations described above, a light absorbing layer (black matrix layer) may be formed between the wavelength selection units, above the space between the wavelength selection units, between the optical path control units, or above the space between the optical path control units. These forms can reliably reduce occurrence of color mixture between adjacent light emitting elements. The light absorbing layer (black matrix layer) is composed of, for example, a black resin film (specifically, for example, a black polyimide resin) mixed with a black colorant and having an optical density of 1 or more, or it includes a thin film filter using interference of a thin film. The thin film filter is formed by, for example, stacking two or more thin films made of metal, metal nitride, or metal oxide, and it attenuates light using interference of the thin films. Specific examples of the thin film filter include a thin film filter in which Cr and chromium (III) oxide ($Cr_2O_3$) are alternately stacked. The size of the light absorbing layer (black matrix layer) may be appropriately changed according to the light emitted from the light emitting element.

A light shielding unit may be provided between light emitting elements. Specific examples of the light shielding material constituting the light shielding unit include materials capable of shielding light, such as titanium (Ti), chromium (Cr), tungsten (W), tantalum (Ta), aluminum (Al), and $MoSi_2$. The light shielding unit may be formed by vapor deposition methods including an electron beam vapor deposition method, a hot filament vapor deposition method, and a vacuum vapor deposition method, sputtering methods, CVD methods, ion plating methods, and the like.

The display apparatus of the present disclosure may be used as, for example, a monitor apparatus constituting a personal computer, or may be used as a monitor apparatus incorporated in a television receiver, a mobile phone, a personal digital assistant (PDA), or a game device, or a display apparatus incorporated in a projector. The display apparatus may also be applied to an electronic view finder (EVF), a head mounted display (HMD), eyewear, AR glasses, or EVR, or may be applied to a display apparatus for virtual reality (VR), mixed reality (MR), or augmented reality (AR). It is also possible to configure an image display apparatus in an electronic book, an electronic paper such as an electronic newspaper, a bulletin board such as a signboard, a poster, or a blackboard, a rewritable paper as a substitute for printer paper, a display unit of a home appliance, a card display unit of a loyalty card or the like, an electronic advertisement, or an electronic POP advertisement. Various lighting apparatuses including a backlight device for a liquid crystal display apparatus and a planar light source device may be configured by using the display apparatus of the present disclosure as a light emitting apparatus.

Example 1

Figure 2:
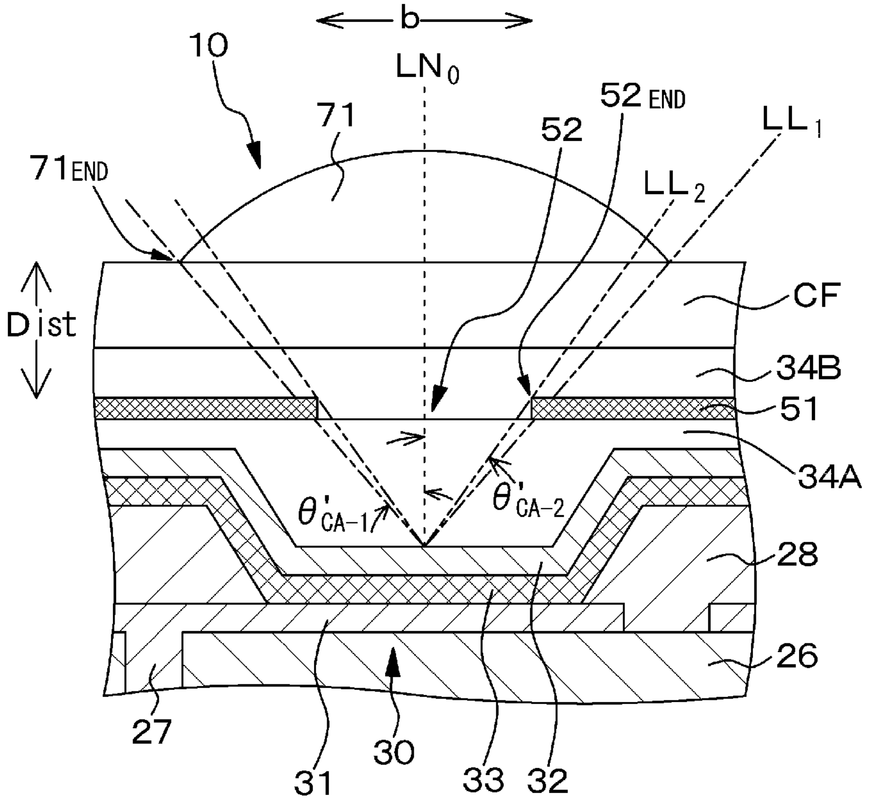
FIG. 2 is a schematic and partial sectional view in which the light emitting element of Example 1 is enlarged.

Example 1 relates to a light emitting element of the present disclosure (specifically, the light emitting element of the first form) and a display apparatus according to the first and second aspects of the present disclosure. FIG. 1 is a schematic and partial sectional view of a light emitting element and a display apparatus of Example 1. FIG. 2 is a schematic and partial sectional view of an enlarged light emitting element. FIGS. 3A, 3B, 3C, 3D, and 3E are diagrams schematically illustrating arrangements of subpixels (light emitting elements) in one pixel composed of the subpixels (light emitting elements). FIG. 4 is a schematic perspective view of an optical path control unit including a lens member. In FIG. 2, hatching lines are partially omitted for simplification of the drawing.

In Example 1 or Examples 2 to 5 described later, the display apparatus is an organic electroluminescence display apparatus (organic EL display apparatus) and is an active matrix display apparatus. The light emitting element is an electroluminescent element (organic EL element), and the light emitting layer includes an organic electroluminescence layer. The display apparatus of Example 1 or Examples 2 to 5 described later is a top emission type display apparatus that emits light from the second substrate.

A light emitting element 10 of Example 1 includes:

a light emitting unit 30 and an optical path control unit 71 provided above the light emitting unit 30, wherein a light reflection film 51 including an opening 52 is disposed between the light emitting unit 30 and the optical path control unit 71.

The display apparatus of Example 1 as described according to the first aspect of the present disclosure includes:

the light emitting unit 30 and the optical path control unit 71 provided above the light emitting unit 30, wherein a plurality of light emitting elements 10 provided with a light reflection film 51 including an opening 52 are provided between the light emitting unit 30 and the optical path control unit 71.

Further, the display apparatus of Example 1 as described according to the second aspect of the present disclosure includes:

a first substrate 41 and a second substrate 42; and a plurality of light emitting element units each including a first light emitting element $\mathbf{10}_1$, a second light emitting element $\mathbf{10}_2$, and a third light emitting element $\mathbf{10}_3$ provided on the first substrate 41, wherein each of the light emitting elements 10 includes a light emitting unit 30 provided above the first substrate 41 and an optical path control unit 71 provided above the light emitting unit 30, and a light reflection film 51 including an opening 52 is disposed between the light emitting unit 30 and the optical path control unit 71.

In the display apparatus of Example 1, the first light emitting element $\mathbf{10}_1$ emits red light, the second light emitting element $\mathbf{10}_2$ emits green light, and the third light emitting element $\mathbf{10}_3$ emits blue light. Further, a fourth light emitting element that emits white light or a fourth light emitting element that emits light of a color other than red light, green light, or blue light may be added.

In the light emitting element 10, light emitted by the light emitting unit 30 is emitted outside via at least the opening 52 disposed in the light reflection film 51 and the optical path control unit 71. Specifically, in the light emitting element 10, a protective layer 34A and a planarization layer 34B are formed between the light emitting unit 30 and the optical path control unit 71 from the light emitting unit side, and the light reflection film 51 is disposed between the protective layer 34A and the planarization layer 34B. The light emitted by the light emitting unit 30 is emitted outside via at least the protective layer 34A, the opening 52 disposed in the light reflection film 51, the planarization layer 34B, and the optical path control unit 71. More specifically, the light emitting element 10 of Example 1 includes a first electrode 31, an organic layer 33 formed on the first electrode 31, a second electrode 32 formed on the organic layer 33, the protective layer 34A formed on the second electrode 32, the light reflection film 51, the planarization layer 34B, a wavelength selection unit CF, and the optical path control unit 71. Light from the organic layer 33 is emitted outside via the second electrode 32, the protective layer 34A, the opening 52 provided in the light reflection film 51, the planarization layer 34B, the wavelength selection unit CF, the optical path control unit 71, a bonding member 35, an underlayer 36, and the second substrate 42.

The light emitting unit 30 has a stacked structure of the first electrode 31, the organic layer 33, and the second electrode 32, and the light reflection film 51 is formed above the second electrode 32. The organic layer 33 includes a light emitting layer composed of an organic electroluminescence layer.

In the display apparatus of Example 1 or Examples 2 to 5 described later, one light emitting element unit (pixel) is composed of three light emitting elements (three subpixels) of the first light emitting element (red light emitting element) $\mathbf{10}_1$, the second light emitting element (green light emitting element) $\mathbf{10}_2$, and the third light emitting element (blue light emitting element) $\mathbf{10}_3$. The organic layer 33 constituting the first light emitting element $\mathbf{10}_1$, the organic layer 33 constituting the second light emitting element $\mathbf{10}_2$, and the organic layer 33 constituting the third light emitting element $\mathbf{10}_3$ emit white light as a whole. The first light emitting element $\mathbf{10}_1$ that emits red light is composed of a combination of the organic layer 33 that emits white light and a red color filter layer $CF_R$. The second light emitting element $\mathbf{10}_2$ that emits green light is composed of a combination of the organic layer 33 that emits white light and a green color filter layer $CF_G$. The third light emitting element $\mathbf{10}_3$ that emits blue light is composed of a combination of the organic layer 33 that emits white light and a blue color filter layer $CF_B$. In some cases, in addition to the first light emitting element (red light emitting element) $\mathbf{10}_1$, the second light emitting element (green light emitting element)

$10_2$, and the third light emitting element (blue light emitting element) $10_3$, a light emitting element $10_4$ that emits white color (or fourth color) (or a light emitting element that emits complementary color light) may constitute the light emitting element unit (one pixel). The first light emitting element $10_1$, the second light emitting element $10_2$, and the third light emitting element $10_3$ have substantially the same configuration and structure except for the configuration of the color filter layer, and in some cases, except for the arrangement position of the light emitting layer in the thickness direction of the organic layer. The number of pixels is, for example, 1920×1080, one light emitting element (display device) 10 constitutes one subpixel, and the number of light emitting elements (specifically, organic EL elements) 10 is three times the number of pixels.

The organic EL display apparatus includes:

the first substrate 41, the second substrate 42, and a plurality of light emitting elements 10 positioned between the first substrate 41 and the second substrate 42 and arrayed in a two-dimensional manner, wherein each of the light emitting elements 10 provided on a base formed on the first substrate 41 is composed of the light emitting element 10 of Example 1. Each of the light emitting elements 10 includes the light emitting unit 30, and the light emitting unit 30 at least includes:

the first electrode 31;

the second electrode 32; and the organic layer 33 (including a light emitting layer composed of an organic electroluminescence layer) sandwiched between the first electrode 31 and the second electrode 32, wherein light from the organic layer 33 is emitted outside via the second substrate 42.

Alternatively, in other words, the display apparatus of Example 1 includes the first substrate 41, the second substrate 42, and an image display region (display panel unit) sandwiched between the first substrate 41 and the second substrate 42, and in the image display region, a plurality of the light emitting elements 10 of Example 1 are arrayed in a two-dimensional matrix.

That is, in the display apparatus of Example 1 or Examples 2 to 5 described later, the light emitting element 10 specifically includes:

the first electrode 31;

the organic layer 33 formed on the first electrode 31;

the second electrode 32 formed on the organic layer 33;

the protective layer 34A formed on the second electrode 32, the light reflection film 51 including the opening 52 formed on the protective layer 34A;

the planarization layer 34B formed on the protective layer 34A positioned at a bottom of the opening 52 and the light reflection film 51;

the color filter layer CF ($CF_R$, $CF_G$, $CF_B$) formed on the planarization layer 34B; and the optical path control unit 71 formed on the color filter layer CF. The light emitting element 10 is formed on the first substrate side. The color filter layer CF is disposed above the second electrode 32, and the second substrate 42 is disposed above the color filter layer CF in this manner. The following description may be appropriately applied to Examples 2 to 5 described later in principle, except for the disposition of the color filter layer CF and the optical path control unit 71.

Figure 3A:
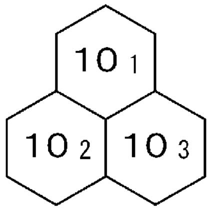
FIG. 3A is a diagram schematically illustrating an arrangement of subpixels (light emitting elements) in one pixel composed of the subpixels (light emitting elements).
Figure 3B:
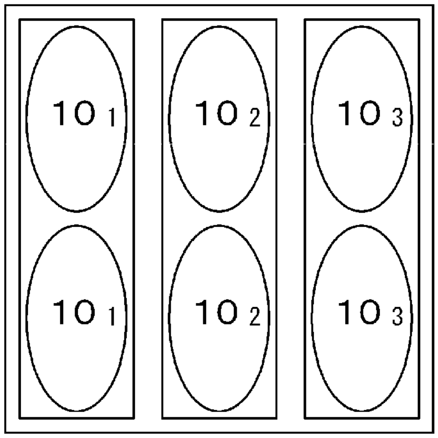
FIG. 3B is a diagram schematically illustrating an arrangement of subpixels (light emitting elements) in one pixel composed of the subpixels (light emitting elements).
Figure 3C:
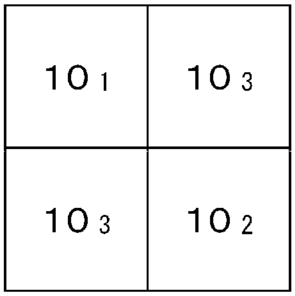
FIG. 3C is a diagram schematically illustrating an arrangement of subpixels (light emitting elements) in one pixel composed of the subpixels (light emitting elements).
Figure 3D:
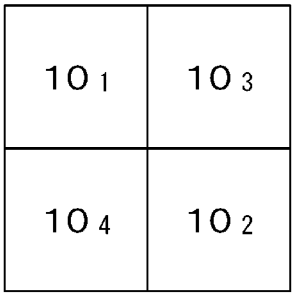
FIG. 3D is a diagram schematically illustrating an arrangement of subpixels (light emitting elements) in one pixel composed of the subpixels (light emitting elements).
Figure 3E:
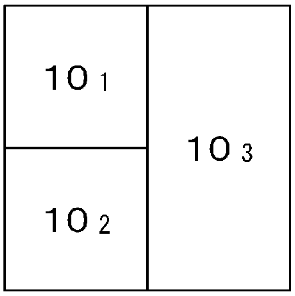
FIG. 3E is a diagram schematically illustrating an arrangement of subpixels (light emitting elements) in one pixel composed of the subpixels (light emitting elements).
Figure 4:
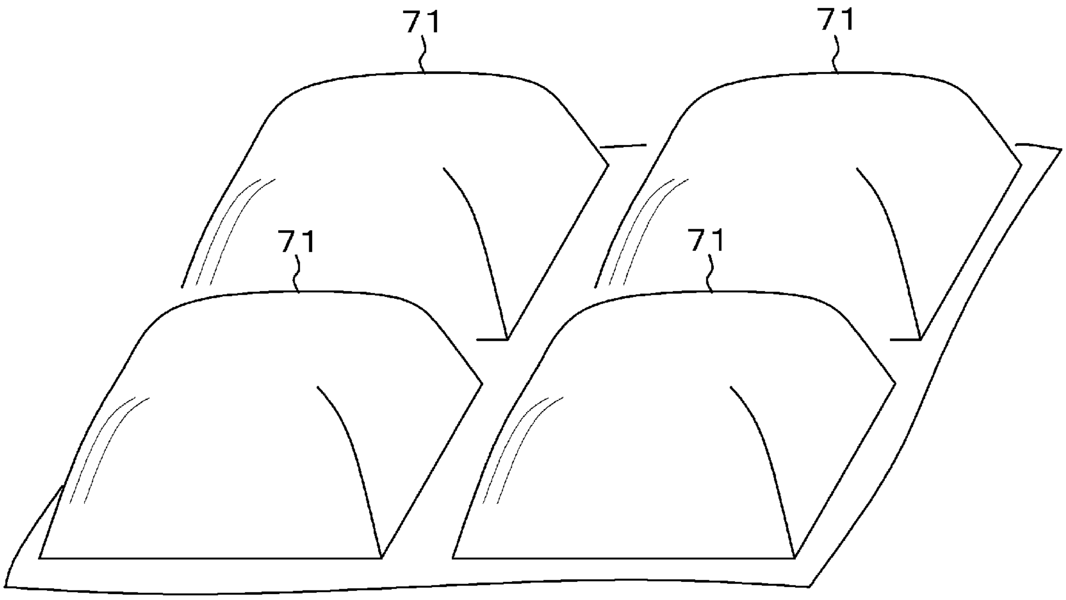
FIG. 4 is a schematic perspective view of an optical path control unit formed of a lens member.

In the display apparatus of Example 1, the array of the subpixels may be a delta array as illustrated in FIG. 3A, a stripe array as illustrated in FIG. 3B, a diagonal array as illustrated in FIG. 3C, or a rectangle array. In some cases, as illustrated in FIG. 3D, one pixel may be composed of the first light emitting element $10_1$, the second light emitting element $10_2$, the third light emitting element $10_3$, and a fourth light emitting element $10_4$ that emits white light (or a fourth light emitting element that emits complementary color light). In the fourth light emitting element $10_4$ that emits white light, a transparent filter layer may be provided instead of providing the color filter layer. A square array as illustrated in FIG. 3E may also be adopted. The example illustrated in FIG. 3E satisfies (the area of the first light emitting element $10_1$): (the area of the second light emitting element $10_2$): (the area of the third light emitting element $10_3$)=1:1:2, but it may be 1:1:1.

In the display apparatus of Example 1 or Examples 2 to 5 described later, the array of the first light emitting element $10_1$, the second light emitting element $10_2$, and the third light emitting element $10_3$ is specifically a delta array, but the array is not limited to the delta array. To simplify the drawings, the schematic and partial sectional views of the display apparatus illustrated in FIG. 1 and FIGS. 6, 7, 8, 9, 10, 11, 12, 18, 19, 20, 21, 22, 23, 24, 25, 26, 27, 28, 29, 34, 42, 47, and 50 described later are different from the schematic and partial sectional views of the display apparatus in which the light emitting elements 10 are arrayed in a delta array.

The light emitting element 10 includes the wavelength selection unit CF between the light emitting unit 30 and the optical path control unit 71. Specifically, the wavelength selection unit CF includes color filter layers $CF_R$, $CF_G$, and $CF_B$, and it is provided on the first substrate side. In this manner, the color filter layer CF has an on-chip color filter layer structure (OCCF structure). This can shorten the distance between the organic layer 33 and the wavelength selection unit CF and can reduce occurrence of color mixture caused by light emitted from the organic layer 33 entering an adjacent wavelength selection unit CF of another color.

The optical path control unit 71 is formed of a lens member such as a plano-convex lens having a convex shape in a direction away from the light emitting unit 30. That is, a light emission surface 71*b* of the optical path control unit (lens member) 71 has a convex shape, and a light incident surface 71*a* is, for example, flat. The outer shape of the optical path control unit 71 may be a circle or an ellipse, but the shape is not limited to such a shape, and it may be a rectangle as illustrated in FIG. 4. The outer shape may be appropriately determined based on the planar shapes of the light emitting region and the opening 52.

The size of the light emitting unit (light emitting region) 30 is desirably larger than the size of the opening 52. The orthographic projection image of the opening 52 is desirably included in the orthographic projection image of the light emitting unit (light emitting region) 30.

The first substrate 41 and the second substrate 42 are bonded by the bonding member (sealing resin layer) 35. Specifically, the underlayer 36 is formed on an inner surface (surface facing the first substrate 41) of the second substrate 42, and the underlayer 36, a part of the wavelength selection unit CF, and the optical path control unit 71 are bonded by the bonding member 35. Examples of the material constituting the bonding member 35 include thermosetting adhesives, such as an acrylic adhesive, an epoxy adhesive, a urethane adhesive, a silicone adhesive, and a cyanoacrylate adhesive, and ultraviolet-curable adhesives.

As illustrated in FIG. 2, in the light emitting element 10 of Example 1, $$1 \leq \theta_{CA\text{-}2}/\theta_{CA\text{-}1}$$

is satisfied when $\theta_{CA\text{-}1}$ is a maximum complementary angle of an angle formed by a normal line $LN_0$ passing through a center of the light emitting unit (light emitting region) 30 and a straight line $LL_1$ connecting the center of the light emitting unit 30 (in the illustrated example, the center of the part of the second electrode 32 constituting the light emitting unit 30, the same applies hereinafter) and an end $\mathbf{71}_{END}$ of the optical path control unit 71, the straight line $LL_1$ forming the angle with which the maximum complementary angle is obtained [that is, the complementary angle of an angle $\theta_{CA\text{-}1}'$ formed by the normal line $LN_0$ and the straight line $LL_1$ is $\theta_{CA\text{-}1}$ $(=90-\theta_{CA\text{-}1}')$], and $\theta_{CA\text{-}2}$ $(=90-\theta_{CA\text{-}2}')$ is a complementary angle of an angle $\theta_{CA\text{-}2}'$ formed by a straight line $LL_2$ and the normal line $LN_0$ passing through the center of the light emitting unit 30, the straight line $LL_2$ connecting an end $\mathbf{52}_{END}$ of the opening 52 included in a virtual plane including the straight line $LL_1$ and the normal line $LN_0$ and the center of the light emitting unit 30. Alternatively, $$1 \leq \theta_{CA\text{-}2}/\theta_{CA\text{-}1}$$

is satisfied when $\theta_{CA\text{-}1}$ $(=90-\theta_{CA\text{-}1}')$ is a complementary angle of an angle $\theta_{CA\text{-}1}'$ formed by the normal line $LN_0$ passing through the center of the light emitting unit (light emitting region) 30 and the straight line $LL_1$ connecting the center of the light emitting unit 30 and the end $\mathbf{71}_{END}$ of the optical path control unit 71, and $\theta_{CA\text{-}2}$ $(=90-\theta_{CA\text{-}2}')$ is a complementary angle of an angle $\theta_{CA\text{-}2}'$ formed by the straight line $LL_2$ and the normal line $LN_0$ passing through the center of the light emitting unit 30, the straight line $LL_2$ connecting the end $\mathbf{52}_{END}$ of the opening 52 included in a virtual plane including the straight line $LL_1$ and the normal line $LN_0$ and the center of the light emitting unit 30. Further, $$(b/2)^2 \leq Dist \cdot \lambda_0$$

is preferably satisfied, and $$(b/2) \geq \lambda_0$$

is preferably satisfied.

In the light emitting element 10 of Example 1, it is desirable that the planar shape of the opening 52 and the planar shape of the optical path control unit 71 have a similar relationship or an approximate relationship. The planar shape of the wavelength selection unit CF may be the same as, similar to, approximate to, or different from the planar shape of the optical path control unit 71. Adopting a form in which the orthogonal projection image of the optical path control unit 71 is included in the orthogonal projection image of the wavelength selection unit CF can reliably reduce occurrence of color mixture between adjacent light emitting elements 10. The planar shape of the wavelength selection unit CF may be the same as, similar to, approximate to, or different from the planar shape of the light emitting region, but the wavelength selection unit CF is preferably larger than the light emitting region. The relationship between the orthogonal projection image of the optical path control unit 71 and the orthogonal projection image of the wavelength selection unit CF is as described above.

In Example 1, the center of the wavelength selection unit CF (the center when orthogonally projected onto the first substrate 41) passes through the center of the light emitting region, and the center of the optical path control unit 71 (the center when orthogonally projected onto the first substrate 41) and the center of the opening 52 provided in the light reflection film 51 (the center when orthogonally projected onto the first substrate 41) also passes through the center of the light emitting region. That is, the center of the opening 52 provided in the light reflection film 51, the center of the wavelength selection unit CF, and the center of the optical path control unit 71 are positioned on the normal line $LN_0$ passing through the center of the light emitting region. However, as will be described in Example 4 and Example 5 described later, a form of not passing through the center of the light emitting region may also be adopted. The sizes of the wavelength selection unit CF, the optical path control unit 71, and the opening 52 may be appropriately changed according to a distance (offset amount) $d_0$ (described later) between the normal line passing through the center of the light emitting region and the normal line passing through the center of the wavelength selection unit CF.

A light emitting element drive unit (drive circuit) is provided below a base 26 made of an insulating material formed based on a CVD method. The light emitting element drive unit may have a known circuit configuration. The light emitting element drive unit is composed of a transistor (specifically, a MOSFET) formed on a silicon semiconductor substrate corresponding to the first substrate 41. A transistor 20 composed of a MOSFET includes a gate insulating layer 22 formed on the first substrate 41, a gate electrode 21 formed on the gate insulating layer 22, source/drain regions 24 formed on the first substrate 41, a channel formation region 23 formed between the source/drain regions 24, and an element isolation region 25 surrounding the channel formation region 23 and the source/drain regions 24. The transistor 20 and the first electrode 31 are electrically connected via a contact plug 27 provided in the base 26. In the drawings, one transistor 20 is illustrated for one light emitting element drive unit. Examples of the material constituting the base 26 include $SiO_2$, SiN, and SiON.

The light emitting unit 30 is provided on the base 26. Specifically, the first electrode 31 of each light emitting element 10 is provided on the base 26. An insulating layer 28 having an opening region 28' in which the first electrode 31 is exposed at the bottom is formed on the base 26, and the organic layer 33 is formed at least on the first electrode 31 exposed at the bottom of the opening region 28'. Specifically, the organic layer 33 is formed from the top of the first electrode 31 exposed at the bottom of the opening region 28' to the top of the insulating layer 28, and the insulating layer 28 is formed from the first electrode 31 to the top of the base 26. The part of the organic layer 33 that actually emits light is surrounded by the insulating layer 28. That is, the light emitting region includes the first electrode 31 and a region of the organic layer 33 formed on the first electrode 31, and it is provided on the base 26. In other words, the region of the first electrode 31 or the organic layer 33 surrounded by the insulating layer 28 corresponds to the light emitting region. The insulating layer 28 and the second electrode 32 are covered with the protective layer 34A made of SiN. The light reflection film 51 provided with the opening 52 is formed on the protective layer 34A by a known method, the planarization layer 34B is formed on the protective layer 34A exposed at the bottom of the opening 52 and the light reflection film 51, the wavelength selection unit CF (color filter layers $CF_R$, $CF_G$, $CF_B$) made of a known material is formed on the planarization layer 34B, and the optical path control unit 71 is formed on the wavelength selection unit CF.

The first electrode 31 is provided for each light emitting element 10. The organic layer 33 including a light emitting layer made of an organic light emitting material is provided for each light emitting element 10 or is shared by light emitting elements 10. The second electrode 32 is shared by a plurality of light emitting elements 10. That is, the second electrode 32 is a so-called solid electrode and is also a common electrode. The first substrate 41 is disposed below or beneath the base 26, and the second substrate 42 is disposed above the second electrode 32. The light emitting elements 10 are formed on the first substrate side, and the light emitting unit 30 is provided on the base 26. Specifically, the light emitting unit 30 is provided on the base 26 formed on or above the first substrate 41. In this manner, the first electrode 31, the organic layer 33 (including the light emitting layer), and the second electrode 32 constituting the light emitting unit 30 are sequentially formed on the base.

The first electrode 31 functions as an anode electrode, and the second electrode 32 functions as a cathode electrode. The first electrode 31 is formed of a light reflection material layer, specifically, for example, an Al—Nd alloy layer, an Al—Cu alloy layer, or a stacked structure of an Al—Ti alloy layer and an ITO layer, and the second electrode 32 is made of a transparent conductive material, such as ITO. The first electrode 31 is formed on the base 26 based on a combination of a vacuum vapor deposition method and an etching method. The second electrode 32 is formed by a film forming method in which the energy of film-forming particles is small, such as a vacuum vapor deposition method, and the electrode is not patterned. The organic layer 33 is not patterned either. That is, the organic layer 33 is shared by a plurality of light emitting elements 10. However, the present disclosure is not limited to this configuration. The first substrate 41 is a silicon semiconductor substrate, and the second substrate 42 is a glass substrate.

As described above, the second electrode 32 is a common electrode for a plurality of light emitting elements 10. That is, the second electrode 32 is a so-called solid electrode. The second electrode 32 is connected to the light emitting element drive unit via a contact hole (contact plug) not illustrated but formed in the base 26 at the outer periphery of the display apparatus (specifically, the outer periphery of the pixel array unit). In the outer periphery of the display apparatus, an auxiliary electrode connected to the second electrode 32 may be provided below the second electrode 32, and the auxiliary electrode may be connected to the light emitting element drive unit.

In Example 1, the organic layer 33 has a stacked structure of a hole injection layer (HIL), a hole transport layer (HTL), a light emitting layer, an electron transport layer (ETL), and an electron injection layer (EIL). The light emitting layer includes at least two light emitting layers that emit different colors, and the light emitted from the organic layer 33 is white. Specifically, the organic layer has a structure in which three layers of a red light emitting layer that emits red light, a green light emitting layer that emits green light, and a blue light emitting layer that emits blue light are stacked. The organic layer may have a structure in which two layers of a blue light emitting layer that emits blue light and a yellow light emitting layer that emits yellow light are stacked (emitting white light as a whole), or a structure in which two layers of a blue light emitting layer that emits blue light and an orange light emitting layer that emits orange light are stacked (emitting white light as a whole). As described above, the first light emitting element $10_1$ to display red is provided with the red color filter layer $CF_R$, the second light emitting element $10_2$ to display green is provided with the green color filter layer $CF_G$, and the third light emitting element $10_3$ to display blue is provided with the blue color filter layer $CF_B$.

The hole injection layer is a layer that improves hole injection efficiency and functions as a buffer layer that prevents leakage. The hole injection layer has a thickness of, for example, about 2 nm to 10 nm. The hole injection layer is made of, for example, a hexaazatriphenylene derivative represented by the following Formula (A) or Formula (B). An end surface of the hole injection layer contacting the second electrode is a main cause of occurrence of luminance variation between pixels, leading to deterioration of display image quality.

(A)

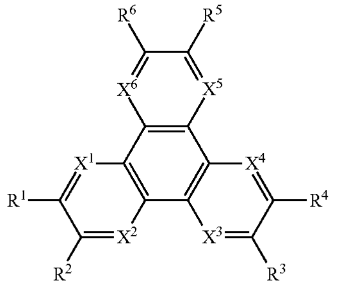

Here, $R^1$ to $R^6$ are each independently a substituent selected from hydrogen, halogen, a hydroxy group, an amino group, an arylamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, or a silyl group, and adjacent $R^m$ (m=1 to 6) may be bonded to each other via a cyclic structure. $X^1$ to $X^6$ are each independently a carbon atom or a nitrogen atom.

(B)

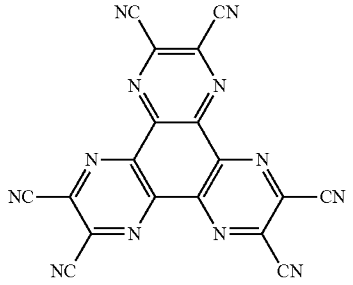

The hole transport layer is a layer that improves hole transport efficiency to the light emitting layer. In the light emitting layer, application of an electric field causes electrons and holes to recombine and generate light. The electron transport layer is a layer that improves electron transport efficiency to the light emitting layer, and the electron injection layer is a layer that improves electron injection efficiency to the light emitting layer.

The hole transport layer is made of, for example, 4,4',4"-tris(3-methylphenylphenylamino)triphenylamine (m-MTDATA) or α-naphthylphenyldiamine (ONPD) with a thickness of about 40 nm.

The light emitting layer is a light emitting layer that generates white light through color mixture, and it is formed by, for example, stacking a red light emitting layer, a green light emitting layer, and a blue light emitting layer, as described above.

In the red light emitting layer, application of an electric field causes some of the holes injected from the first electrode 31 and some of the electrons injected from the second electrode 32 to recombine and generate red light. Such a red light emitting layer contains, for example, at least one material among a red light emitting material, a hole transporting material, an electron transporting material, and a positive and negative charge transporting material. The red light emitting material may be a fluorescent material or a phosphorescent material. The red light emitting layer having a thickness of about 5 nm is made of a material formed by mixing 30 mass % of 2,6-bis [(4'-methoxydiphenylamino) styryl]-1,5-dicyanonaphthalene (BSN) with 4,4-bis(2,2-diphenylvinin) biphenyl (DPVBi), for example.

In the green light emitting layer, application of an electric field causes some of the holes injected from the first electrode 31 and some of the electrons injected from the second electrode 32 to recombine and generate green light. Such a green light emitting layer contains, for example, at least one material among a green light emitting material, a hole transporting material, an electron transporting material, and a positive and negative charge transporting material. The green light emitting material may be a fluorescent material or a phosphorescent material. The green light emitting layer having a thickness of about 10 nm is made of a material formed by mixing 5 mass % of coumarin 6 with DPVBi, for example.

In the blue light emitting layer, application of an electric field causes some of the holes injected from the first electrode 31 and some of the electrons injected from the second electrode 32 to recombine and generate blue light. Such a blue light emitting layer contains, for example, at least one material among a blue light emitting material, a hole transporting material, an electron transporting material, and a positive and negative charge transporting material. The blue light emitting material may be a fluorescent material or a phosphorescent material. The blue light emitting layer having a thickness of about 30 nm is made of a material formed by mixing 2.5 mass % of 4,4'-bis [2-{4-(N, N-diphenylamino) phenyl}vinyl]biphenyl (DPAVBi) with DPVBi, for example.

The electron transport layer having a thickness of about 20 nm is made of, for example, 8-hydroxyquinoline aluminum (Alq3). The electron injection layer having a thickness of about 0.3 nm is made of, for example, LiF or $Li_2O$.

The materials constituting each layer are merely examples and are not limited to these materials. The light emitting layer may be composed of a blue light emitting layer and a yellow light emitting layer or may be composed of a blue light emitting layer and an orange light emitting layer, for example.

In Example 1 or Examples 2, 4, and 5 described later, the light emitting element 10 may have a resonator structure in which the organic layer 33 serves as a resonance unit. To appropriately adjust the distance from the light emitting surface to the light reflection surface (specifically, for example, the distance from the light emitting surface to the first electrode 31 and the second electrode 32), the thickness of the organic layer 33 is preferably $8\times10^{-8}$ m or more and $5\times10^{-7}$ m or less, and more preferably $1.5\times10^{-7}$ m or more and $3.5\times10^{-7}$ m or less. In practice, in an organic EL display apparatus having a resonator structure, the first light emitting element (red light emitting element) $\mathbf{10}_1$ causes light emitted from the light emitting layer to resonate, and emits reddish light (light having a light spectrum peak in a red region) from the second electrode 32. The second light emitting element (green light emitting element) $\mathbf{10}_2$ causes light emitted from the light emitting layer to resonate, and emits greenish light (light having a light spectrum peak in a green region) from the second electrode 32. The third light emitting element (blue light emitting element) $\mathbf{10}_3$ causes light emitted from the light emitting layer to resonate, and emits bluish light (light having a light spectrum peak in a blue region) from the second electrode 32. The resonator structure will be described in detail in Example 3.

Hereinafter, an outline of a method for producing the light emitting element of Example 1 illustrated in FIG. 1 will be described.

[Step-100]

First, form the light emitting element drive unit on a silicon semiconductor substrate (the first substrate 41) based on a known MOSFET production process.

[Step-110]

Next, form the base 26 on the entire surface based on a CVD method.

[Step-120]

Next, form a connection hole in the part of the base 26 positioned above one of the source/drain regions of the transistor 20 based on a photolithography technique and an etching technique. Thereafter, form a metal layer on the base 26 including the connection hole based on, for example, a sputtering method, and then pattern the metal layer based on a photolithography technique and an etching technique. The first electrode 31 may be thus formed on a part of the base 26. The first electrode 31 is separated for each light emitting element. A contact hole (contact plug) 27 that electrically connects the first electrode 31 and the transistor 20 may be formed in the connection hole at the same time.

[Step-130]

Then, after the insulating layer 28 is formed on the entire surface based on, for example, a CVD method, form the opening region 28' in a part of the insulating layer 28 on the first electrode 31 based on a photolithography technique and an etching technique. The first electrode 31 is exposed at the bottom of the opening region 28'.

[Step-140]

Next, form the organic layer 33 on the first electrode 31 and the insulating layer 28 through, for example, a PVD method such as a vacuum vapor deposition method or a sputtering method, or a coating method such as a spin coating method or a die coating method. Next, form the second electrode 32 on the entire surface based on, for example, a vacuum vapor deposition method. The organic layer 33 and the second electrode 32 may be thus formed on the first electrode 31. The organic layer 33 may be patterned into a desired shape in some cases.

[Step-150]

Thereafter, form the protective layer 34A on the entire surface though, for example, a CVD method, a PVD method, or a coating method, and perform a planarization treatment on the top surface of the protective layer 34A. Forming the protective layer 34A based on a coating method has few in-process restrictions and has wide selection of material, with which a high refractive index material can be used. Then, form the light reflection film 51 on the protective layer 34A based on a known method, and further form the opening 52 in the light reflection film 51 based on a known method. Next, form the planarization layer 34B on the light reflection film 51 including the protective layer 34A exposed at the bottom of the opening 52.

[Step-160]

Next, form the wavelength selection unit CF (color filter layers $CF_R$, $CF_G$, $CF_B$) on the planarization layer 34B based on a known method.

[Step-170]

Next, form a resist material layer for forming the optical path control unit 71 on the color filter layer CF ($CF_R$, $CF_G$, $CF_B$). Then, pattern the resist material layer and further perform a heat treatment thereon to form the resist material layer into a lens shape. The optical path control unit 71 (lens member) may be thus obtained.

[Step-180]

Form the underlayer 36 on the second substrate 42. Then, bond the first substrate 41 and the second substrate 42 with the bonding member (sealing resin layer) 35, specifically, bond the underlayer 36, a part of the wavelength selection unit CF, and the optical path control unit 71 with the bonding member 35. The display apparatus (organic EL display apparatus) illustrated in FIG. 1 may be thus obtained.

The front radiation intensity (unit: watt/steradian) of light emitted from a light source having a diameter of 0.1 μm was obtained based on a simulation. The light source is a surface light source with Lambertian radiation. The wavelength of the light emitted from the light source was 550 nm, and the intensity was 1 watt. The distance from the light source to the light incident surface of the lens member was 3 μm, the lens member was a lens member having a hemispherical shape with a diameter of 3.2 μm and a height of 1.6 μm, and the refractive indexes of the protective layer, the planarization layer, and the lens member were 1.52. The light emission side of the lens member was covered with a material having a refractive index of 1.38.

Figure 5:
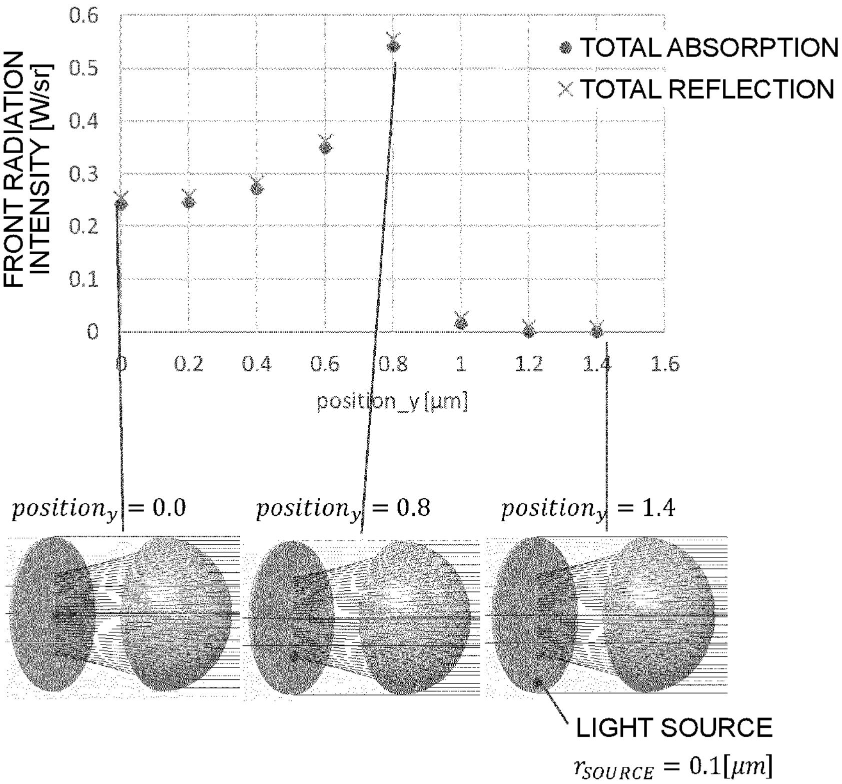
FIG. 5 is a diagram illustrating simulation results of obtaining front radiation intensity of light emitted from a light source having a diameter of 1 μm.

The results of the simulation are illustrated in FIG. 5, where the horizontal axis in FIG. 5 indicates the distance (unit: μm) from the center of the light emitting region to the light source along the y direction, and the vertical axis indicates the front radiation intensity. "Total reflection" and "total absorption" indicate a case where all the light emitted from the light source toward the side opposite to the lens member is reflected and a case where all the light is absorbed, respectively. In FIG. 5, the front radiation intensity is increased by the light source positioned up to 0.8 μm from the center of the light emitting region. That is, it is found that a light source positioned within 0.8 μm from the center of the light emitting region in the light emitting region contributes to the front radiation intensity, but a light source positioned in a region exceeding 1.0 μm from the center of the light emitting region does not contribute to the front radiation intensity. From the above results, it is found that, when the optical path control unit is simply disposed above the light emitting region, only a part of the light emitting region (only a part close to the center of the light emitting region) contributes to an increase in the front luminance. In other words, the contribution of light emitted from the periphery of the light emitting region to the improvement of the front luminance is small, and the front luminance is not improved by simply increasing the amount of light entering the optical path control unit. Collecting light to the vicinity of the center of the light emitting region can significantly improve the front luminance and can increase the effect of the optical path control unit. In Example 1, the light reflection film is provided, and further, light emitted in the light emitting region is emitted toward the outside through the opening formed in the light reflection film. Thus, it is equivalent to collecting the light to the vicinity of the center of the light emitting region, and the front luminance can be greatly improved. Meanwhile, when the light emitting region is reduced, the front luminance can be improved, but the total amount of light emitted from the light emitting elements is reduced. Therefore, it is necessary to increase, for example, the current flowing between the first electrode and the second electrode to increase the front luminance, but this leads to shortening of the life of the light emitting element. In Example 1, the light emitting region is not narrowed, but the light reflection film is provided, and further, light emitted in the light emitting region is emitted toward the outside through the opening formed in the light reflection film. Thus, it is not necessary to increase the current flowing between the first electrode and the second electrode, and the life of the light emitting elements is not shortened.

Moreover, in the light emitting element and the display apparatus of Example 1, since the light reflection film including an opening is provided between the light emitting unit and the optical path control unit, light generated in the light emitting region is emitted toward the optical path control unit via the opening provided in the light reflection film while being repeatedly reflected between the light reflection film and the second electrode or between the light reflection film and the first electrode. That is, light generated in the light emitting region is emitted toward the optical path control unit in a controlled state and with high efficiency. Thus, light emitted from the optical path control unit toward the outside can approximate parallel light, the front luminance can increase, and the luminance of the entire display apparatus can improve. The chromaticity viewing angle also improves. A phenomenon in which light generated in the light emitting region repeats reflection between the light reflection film and the second electrode or between the light reflection film and the first electrode may be referred to as "reflection of light between the light reflection film and the second electrode or the like" for convenience.

Hereinafter, modifications of the light emitting element and the display apparatus of Example 1 will be described.

Figure 6:
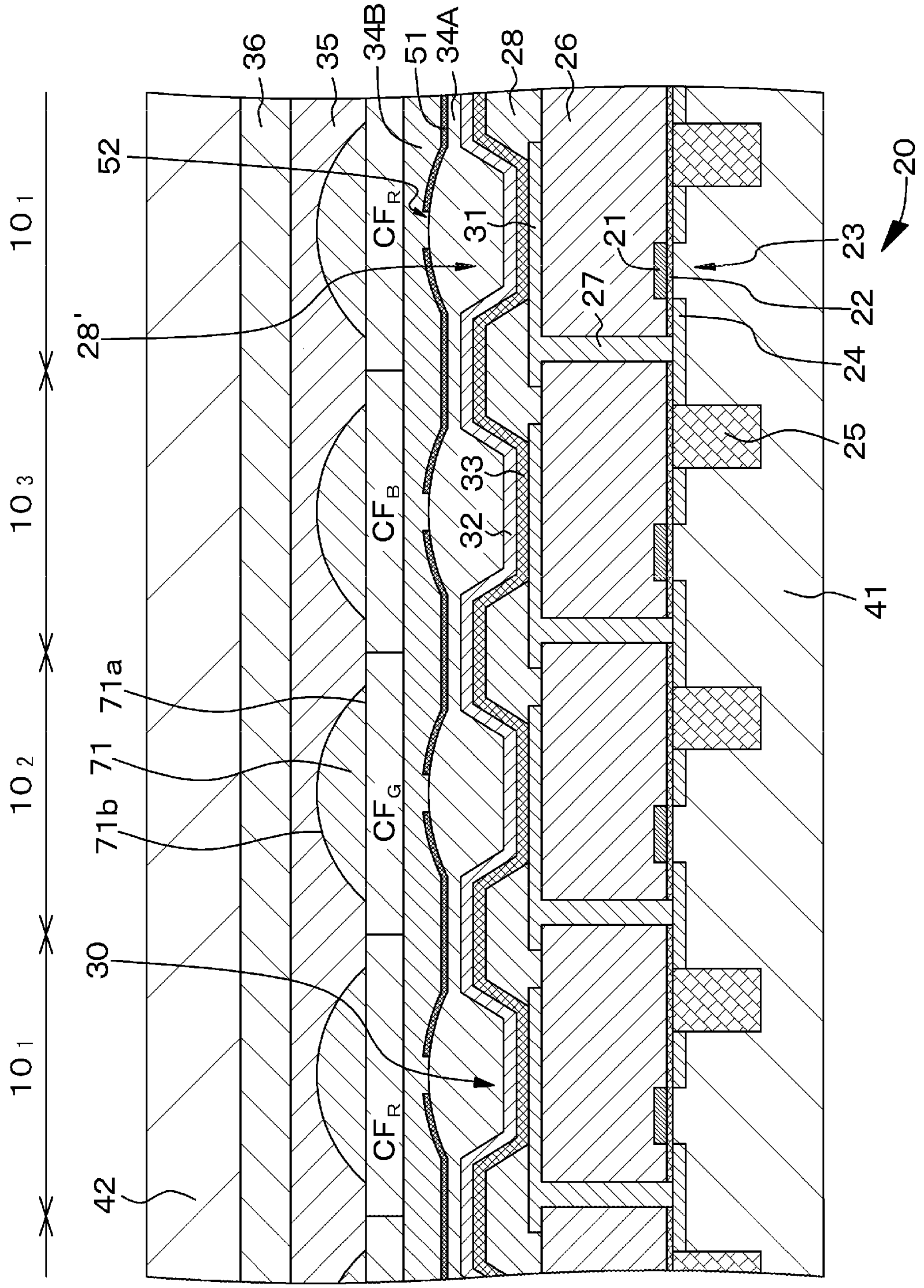
FIG. 6 is a schematic and partial sectional view of Modification-1 of the light emitting element and display apparatus of Example 1.

In Modification-1 of Example 1 illustrated in the schematic and partial sectional view of FIG. 6, the light reflection film 51 has a convex shape in a direction away from the light emitting unit 30. In this case, the top surface of the protective layer 34A is convex in a direction away from the light emitting unit 30, but the top surface of the planarization layer 34B is flat. Forming the light reflection film 51 in a convex shape in a direction away from the light emitting unit 30 like this causes light to be repeatedly reflected between the light reflection film and the second electrode or the like and to be emitted toward the optical path control unit 71 through the opening 52 provided in the light reflection film 51 in a further efficient manner.

Figure 7:
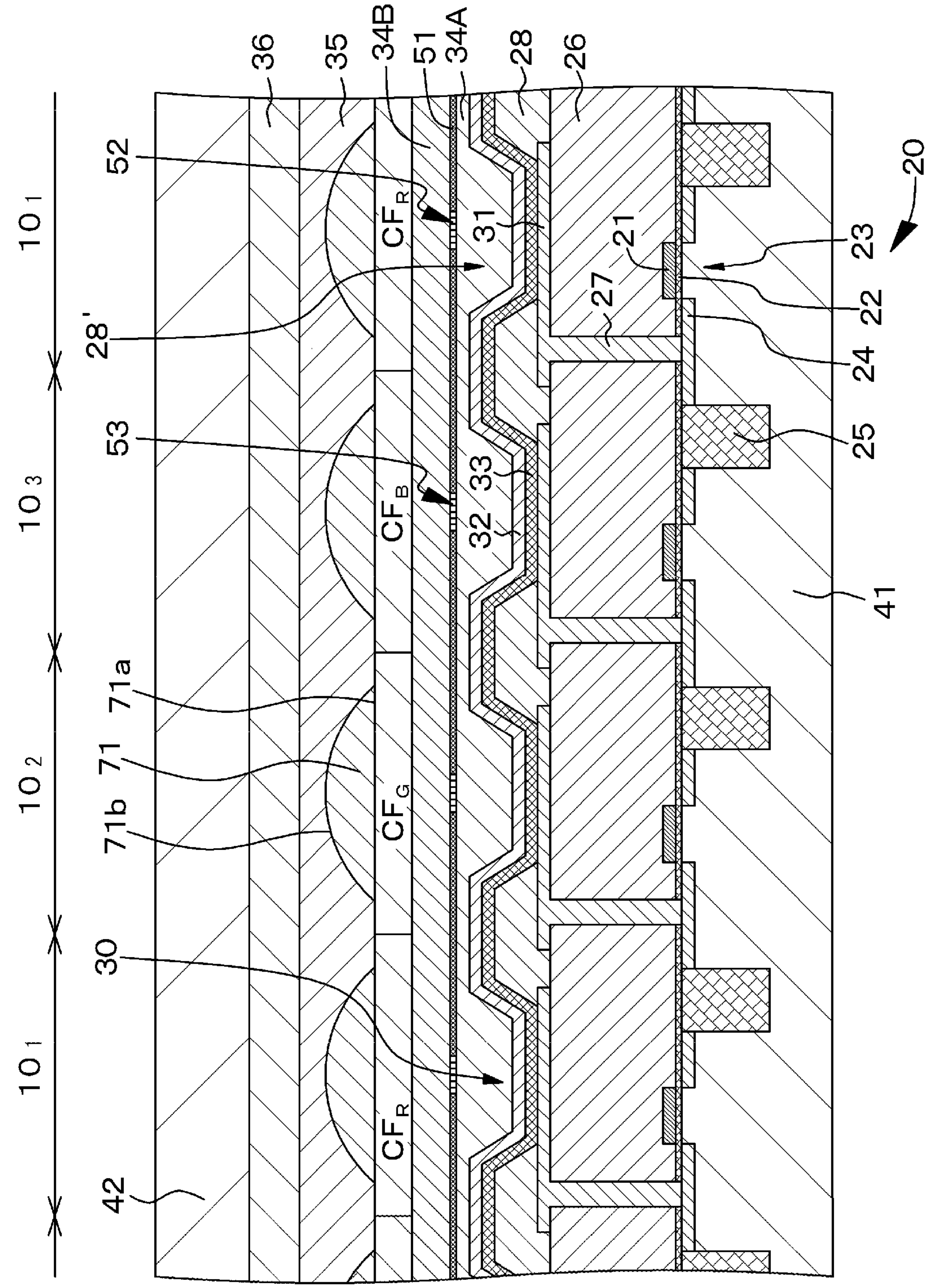
FIG. 7 is a schematic and partial sectional view of Modification-2 of the light emitting element and display apparatus of Example 1.

In addition, as illustrated in the schematic and partial sectional view of Modification-2 of Example 1 in FIG. 7, the light reflection film 51 may be composed of a photonic crystal layer 53, and the light reflection film 51 may be composed of a dielectric multilayer film or a wavelength selection layer to which plasmon is applied.

Figure 8:
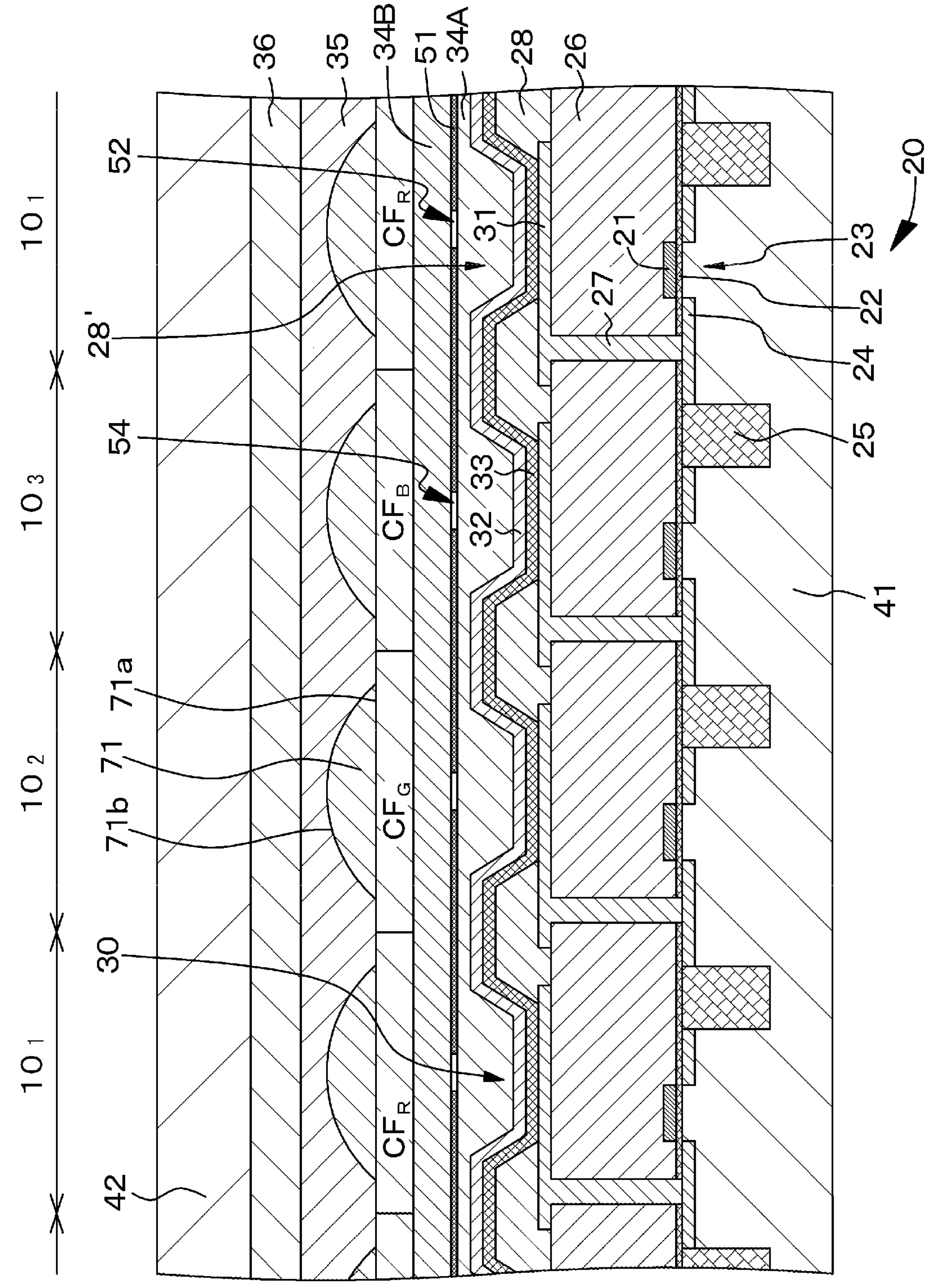
FIG. 8 is a schematic and partial sectional view of Modification-3 of the light emitting element and display apparatus of Example 1.

In Modification-3 of Example 1 illustrated in the schematic and partial sectional view of FIG. 8, a transparent thin film 54 is formed between a portion of the protective layer 34A positioned at the bottom of the opening 52 and the planarization layer 34B, with which the interfaces of the protective layer 34A and the transparent thin film 54 with the planarization layer 34B can be planarized. The material constituting the transparent thin film may be appropriately selected from materials that hardly absorb light emitted from the light emitting unit 30. Examples thereof include an acrylic resin, an epoxy resin, and a silicone resin.

Figure 9:
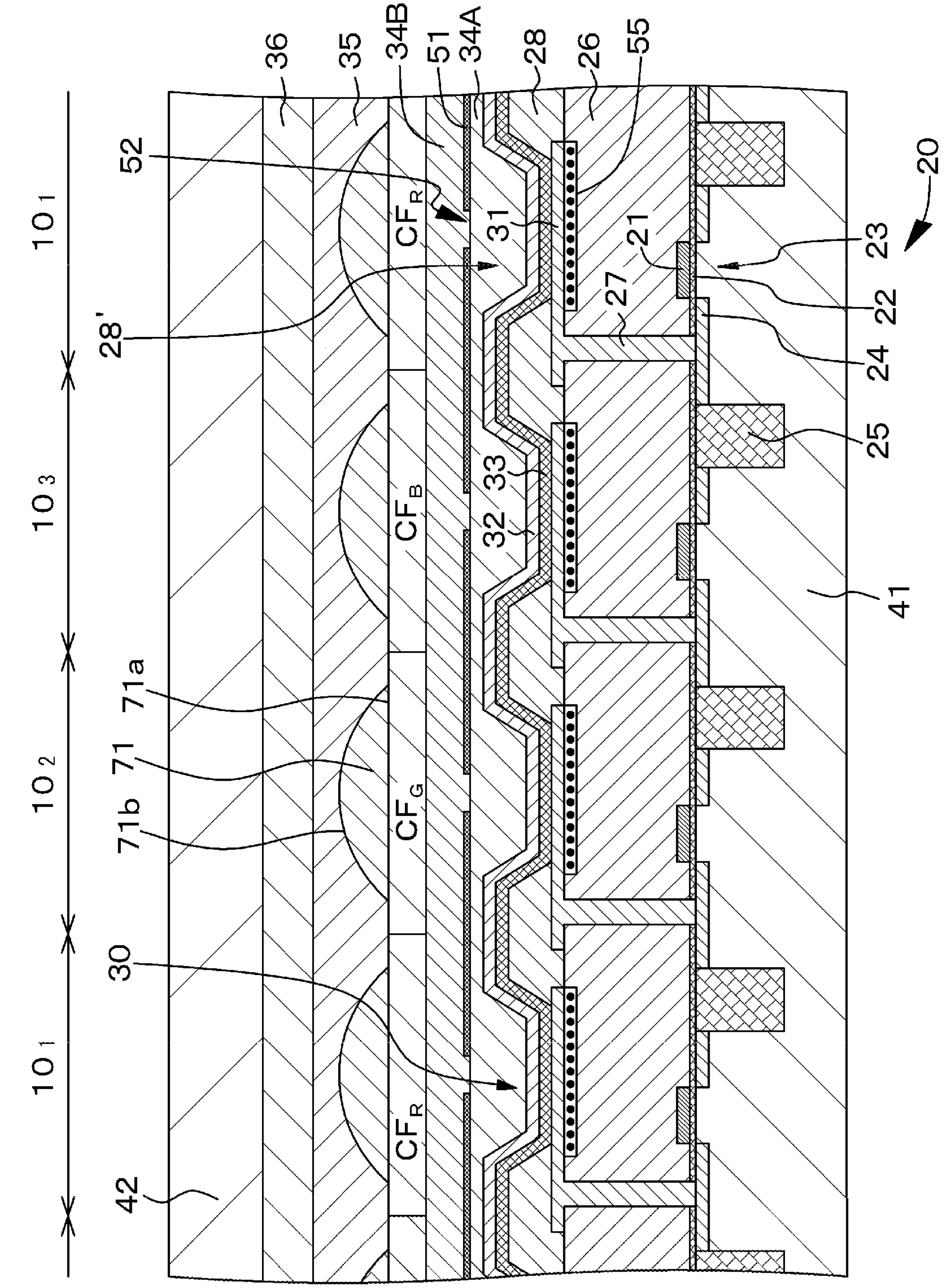
FIG. 9 is a schematic and partial sectional view of Modification-4 of the light emitting element and display apparatus of Example 1.
Figure 10:
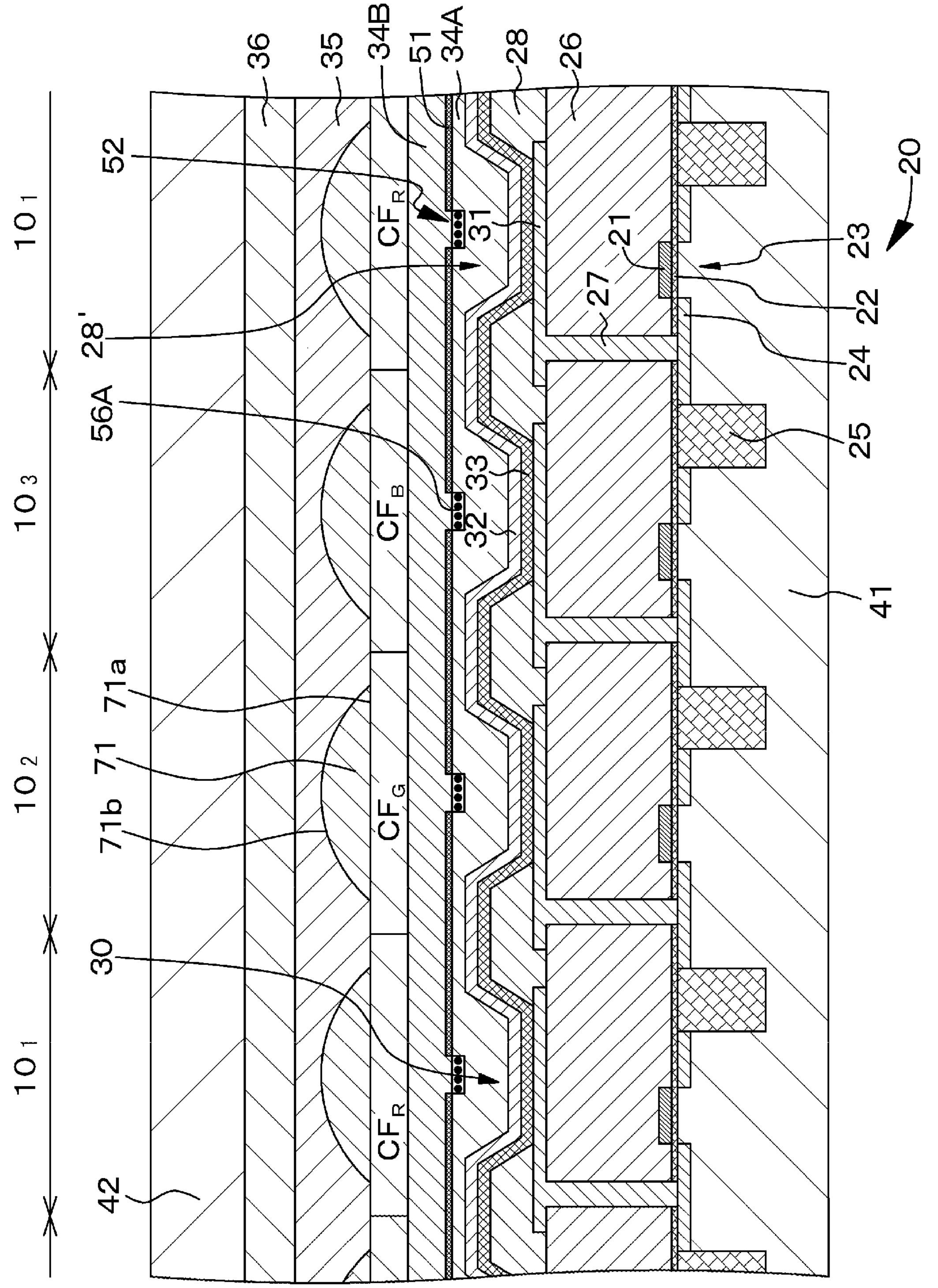
FIG. 10 is a schematic and partial sectional view of Modification-5 of the light emitting element and display apparatus of Example 1.
Figure 11:
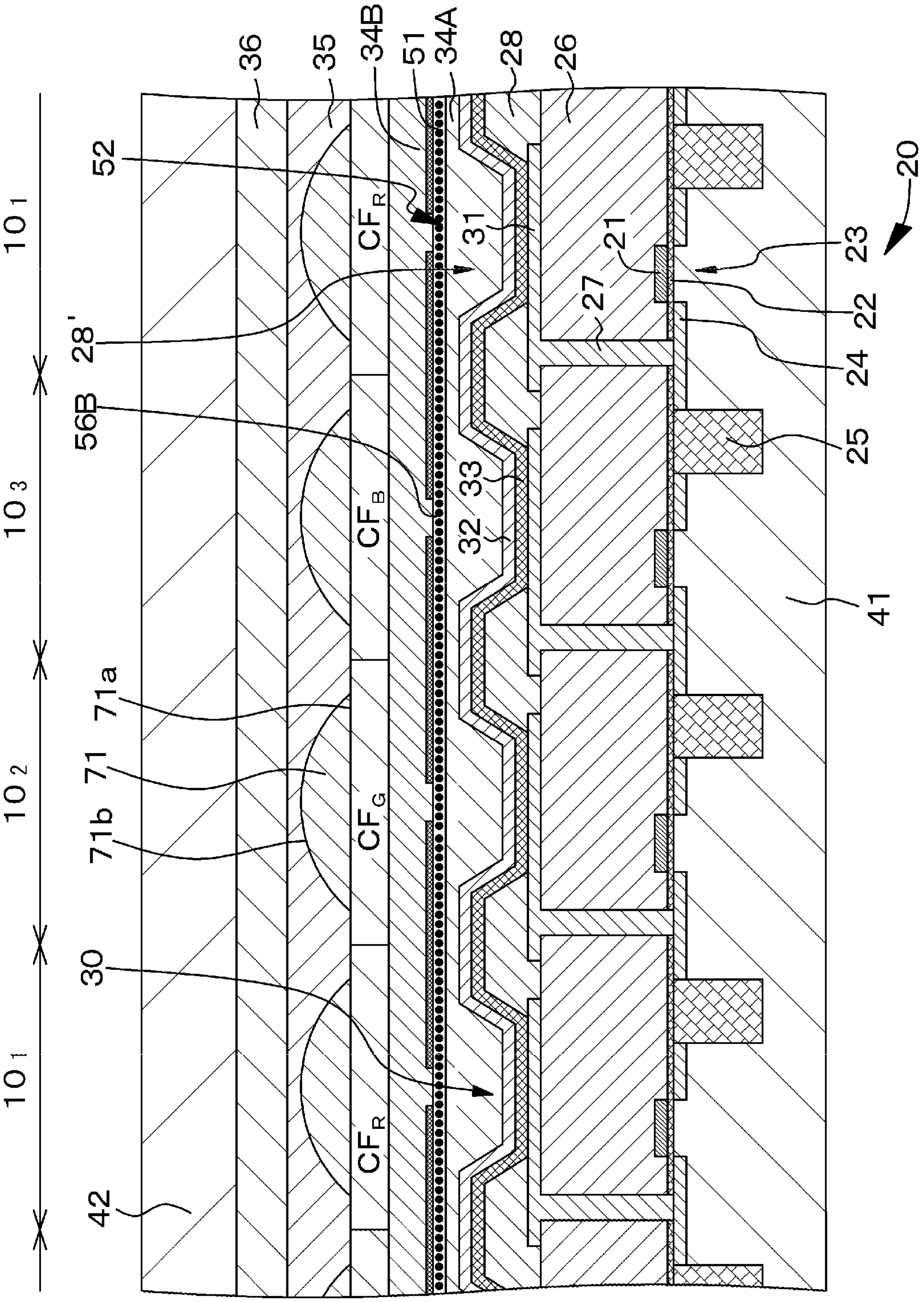
FIG. 11 is a schematic and partial sectional view of Modification-6 of the light emitting element and display apparatus of Example 1.

In Modification-4 of Example 1 illustrated in the schematic and partial sectional view of FIG. 9, a first light scattering layer 55 is formed beneath the light emitting unit 30. Alternatively, in Modification-5 and Modification-6 of Example 1 respectively illustrated in the schematic and partial sectional views of FIGS. 10 and 11, second light scattering layers 56A and 56B are formed at least in a portion of the protective layer 34A positioned at the bottom of the opening 52. That is, in Modification-5 of Example 1, the second light scattering layer 56A is formed in the portion of the protective layer 34A positioned at the bottom of the opening 52 provided in the light reflection film 51 (see FIG. 10). In Modification-6 of Example 1, the second light scattering layer 56B is formed in the portion of the protective layer 34A positioned at the bottom of the opening 52 provided in the light reflection film 51 and the portion of the protective layer 34A beneath the light reflection film 51 (that is, at the portion of the top surface of the protective layer 34A) (see FIG. 11). Examples of the material constituting the first light scattering layer 55 and the second light scattering layers 56A and 56B include fine particles, specifically, fine particles of aluminum oxide, titanium oxide, and the like. When the first light scattering layer 55 is formed beneath the light emitting unit 30, the first electrode 31 may be appropriately selected from materials (semi-light transmitting material or light transmitting material) constituting the second electrode 32. The first light scattering layer 55 and the second light scattering layers 56A and 56B may be combined. Providing the light scattering layers 55, 56A, and 56B enables light emitted from the opening 52 to have Lambertian radiation.

Figure 12:
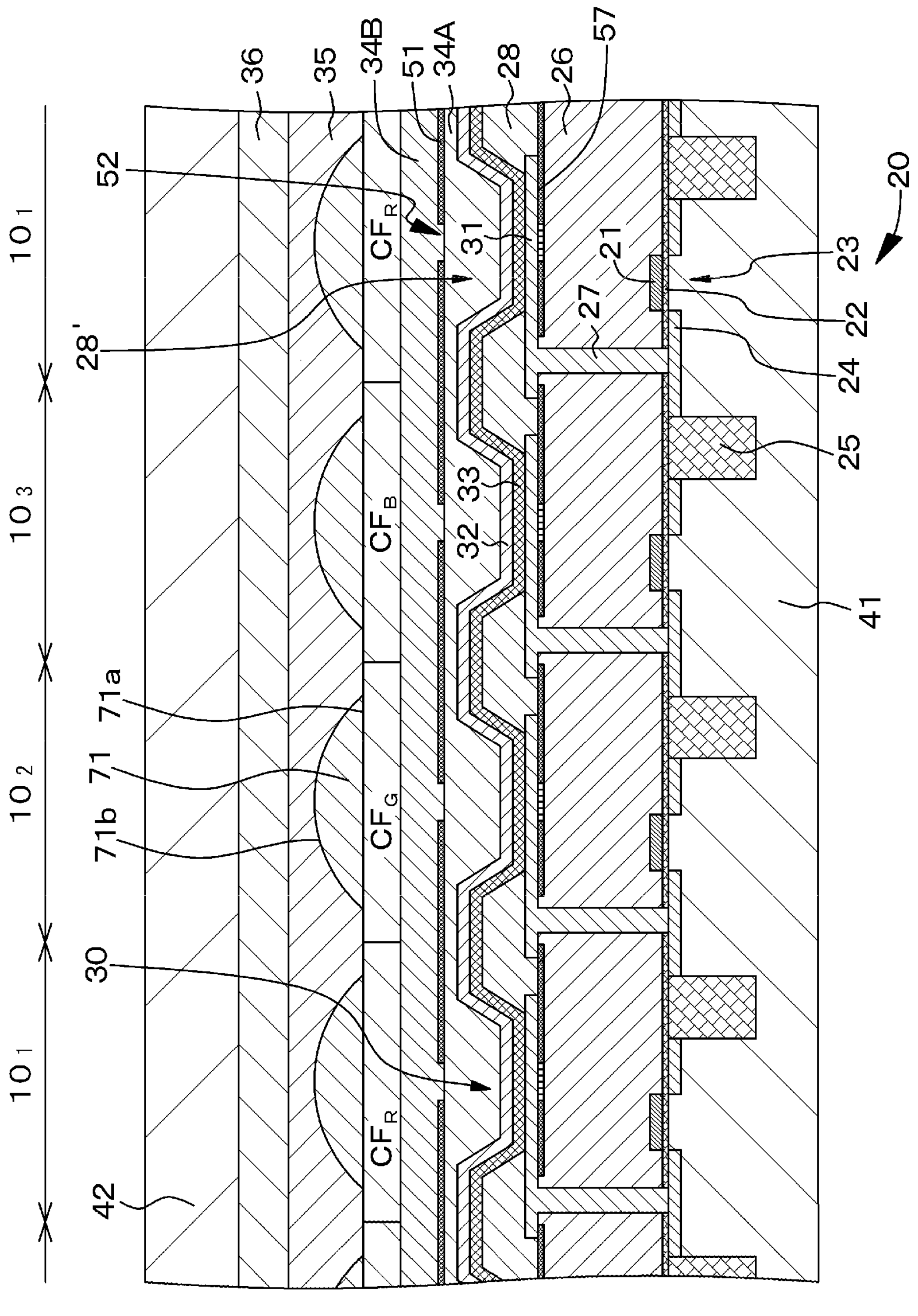
FIG. 12 is a schematic and partial sectional view of Modification-7 of the light emitting element and display apparatus of Example 1.

As illustrated in the schematic and partial sectional view of Modification-7 of Example 1 in FIG. 12, a second light reflection film composed of a photonic crystal layer 57 may be formed beneath the first electrode 31, with which a reflection function with high reflectance can be provided, and light with high efficiency and enhanced directivity in the front direction can be emitted. In this case, emission of light toward the first substrate can be reduced by forming the photonic crystal layer based on a metal that reflects light or by adding a reflective film beneath the photonic crystal layer. When the photonic crystal layer 57 (second light reflection film) is formed beneath the light emitting unit 30, the first electrode 31 may be appropriately selected from materials (semi-light transmitting material or light transmitting material) constituting the second electrode 32.

Figure 13:
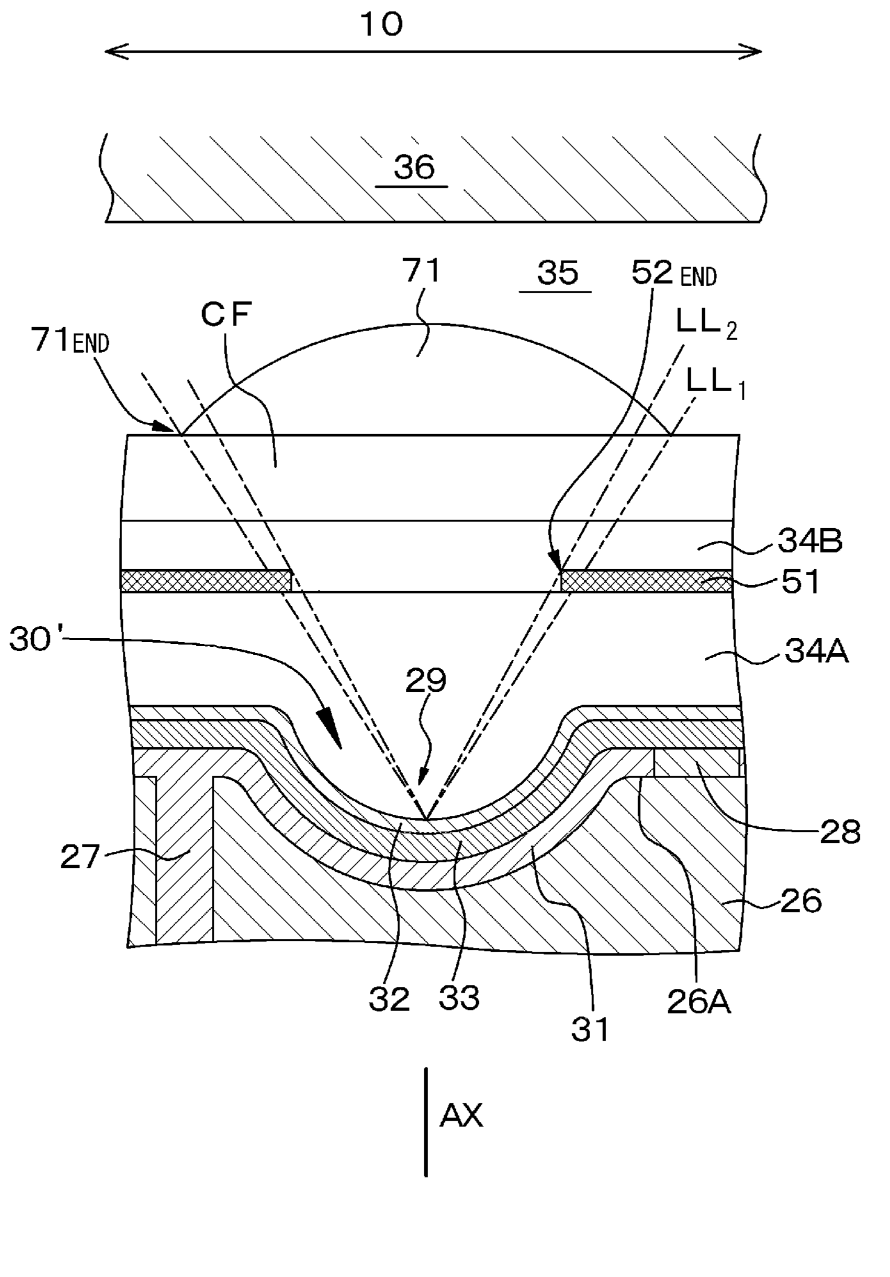
FIG. 13 is a schematic and partial sectional view of a light emitting element in Modification-8 of the light emitting element and display apparatus of Example 1.

In Modification-8 of Example 1 illustrated in the schematic and partial sectional view of FIG. 13, a light emitting unit 30' is convex in a direction away from the planarization layer 34B. That is, the light emitting unit 30' has a convex sectional shape toward the first substrate 41. In this case, the top surface of the protective layer 34A and the light reflection film 51 are flat. Alternatively, the top surface of the protective layer 34A and the light reflection film 51 may be convex in a direction away from the light emitting unit 30'. That is, Modification-1 and Modification-8 may be combined. In FIG. 13, hatching lines are partially omitted for simplification of the drawing.

Specifically, in Modification-8 of Example 1, a surface 26A of the base 26 is provided with a recess 29, at least a part of the first electrode 31 is formed to follow the shape of the top surface of the recess 29, at least a part of the organic layer 33 is formed on the first electrode 31 to follow the shape of the top surface of the first electrode 31, the second electrode 32 is formed on the organic layer 33 to follow the shape of the top surface of the organic layer 33, and the protective layer 34A is formed on the second electrode 32.

In the light emitting element 10 of Modification-8 of Example 1, in the recess 29, the entire first electrode 31 is formed following the shape of the top surface of the recess 29, and the entire organic layer 33 is formed on the first electrode 31 following the shape of the top surface of the first electrode 31.

A second protective layer (not illustrated) may be formed between the second electrode 32 and the protective layer 34A. Here, the refractive index of the material constituting the second protective layer is preferably smaller than the refractive index of the material constituting the protective layer 34A. Examples of the value of the refractive index difference include, but are not limited to, 0.1 to 0.6. Specifically, the material constituting the protective layer 34A includes a material in which $TiO_2$ is added to a base material made of an acrylic resin to adjust (enhance) the refractive index or a material in which $TiO_2$ is added to a base material made of the same type of material as the color resist material (a colorless transparent material to which no pigment is added) to adjust (enhance) the refractive index, and the material constituting the second protective layer includes SiN, SiON, $Al_2O_3$, or $TiO_2$. For example, the refractive index of the protective layer 34A is 2.0, and the refractive index of the second protective layer is 1.6. Forming such a second protective layer allows part of light emitted from the organic layer 33 to pass through the second electrode 32 and the second protective layer and enter the protective layer 34A, and part of light emitted from the organic layer 33 to be reflected by the first electrode 31, to pass through the second electrode 32 and the second protective layer, and to enter the protective layer 34A. In this manner, as a result of formation of an internal lens with the second protective layer and the protective layer 34A, light emitted from the organic layer 33 can be collected in a direction toward the opening 52.

Alternatively, in the light emitting element 10 of Example 1, $$|\theta_i| > |\theta_r|$$

is satisfied where $\theta_i$ is an incident angle of light emitted from the organic layer 33 and entering the protective layer 34A through the second electrode 32, $\theta_r$ is a refraction angle of light incident on the protective layer 34A, and $|\theta_r| \neq 0$. Satisfying such conditions allows part of light emitted from the organic layer 33 to pass through the second electrode 32 and enter the protective layer 34A, and part of light emitted from the organic layer 33 to be reflected by the first electrode 31, to pass through the second electrode 32, and to enter the protective layer 34A. As a result of forming an internal lens in this manner, light emitted from the organic layer 33 can be collected in a direction toward the central part of the light emitting element 10.

Forming the recess as described above can further increase the front luminance as compared with a case where the first electrode, the organic layer, and the second electrode have a flat stacked structure.

Figure 14A:
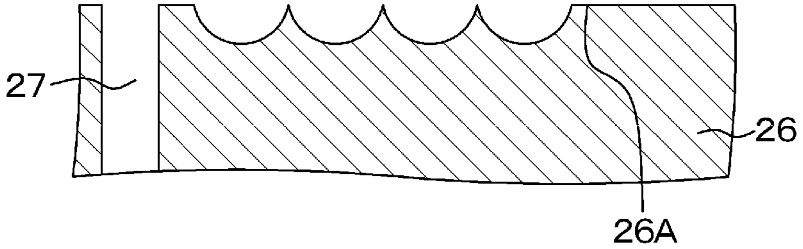
FIG. 14A is a schematic and partial sectional view of a base portion for explaining a modification of the light emitting element in Modification-8 of the light emitting element and display apparatus of Example 1.
Figure 14B:
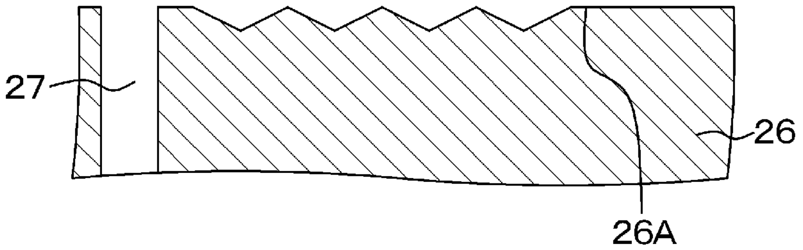
FIG. 14B is a schematic and partial sectional view of a base portion for explaining a modification of the light emitting element in Modification-8 of the light emitting element and display apparatus of Example 1.

FIGS. 14A and 14B are schematic and partial sectional views of the base 26 before the first electrode 31 and the like are formed. The light emitting unit 30' may have an uneven sectional shape toward the first substrate 41. After the state of the base 26 illustrated in FIGS. 14A and 14B is formed, the first electrode 31, the organic layer 33, and the second electrode 32 may be sequentially formed.

Figure 15A:
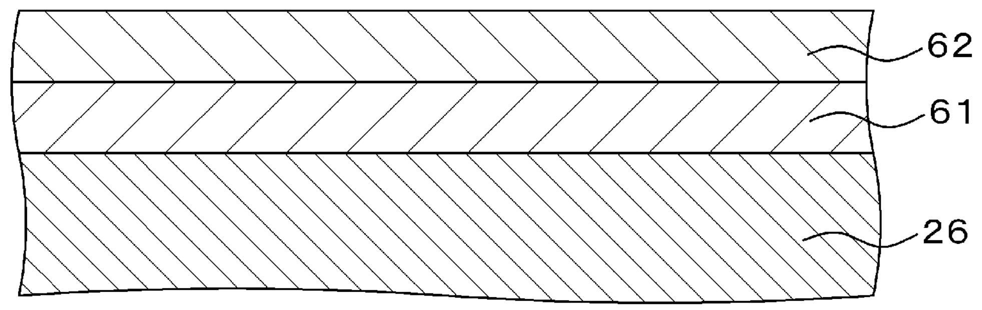
FIG. 15A is a schematic and partial end view of a base and the like for explaining a method for producing the light emitting element of Modification-8 illustrated in FIG. 13.
Figure 15B:
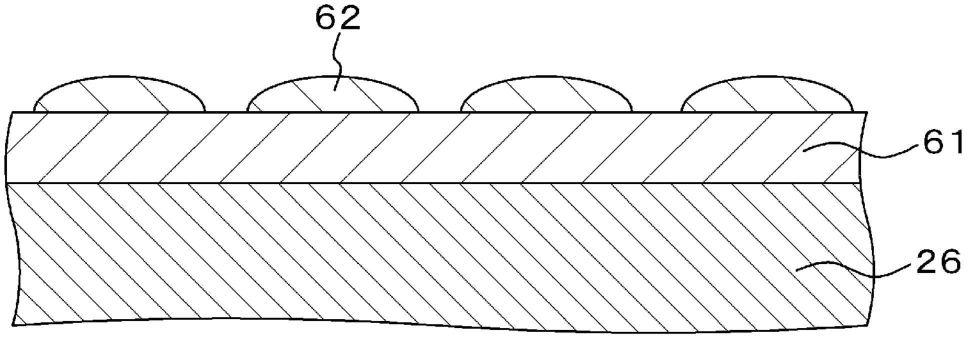
FIG. 15B is a schematic and partial end view of the base and the like for explaining the method for producing the light emitting element of Modification-8 illustrated in FIG. 13.
Figure 15C:
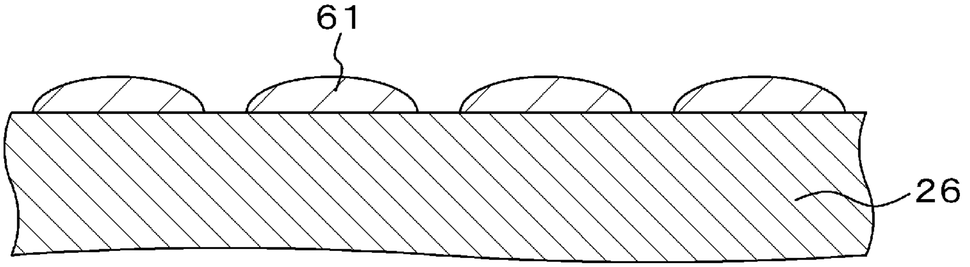
FIG. 15C is a schematic and partial end view of the base and the like for explaining the method for producing the light emitting element of Modification-8 illustrated in FIG. 13.
Figure 16A:
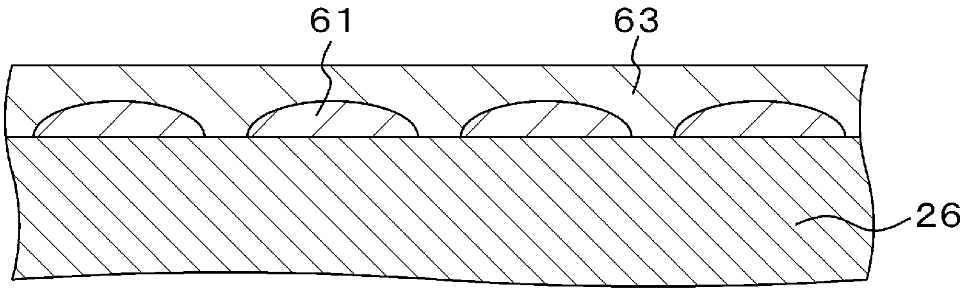
FIG. 16A is a schematic and partial end view of the base and the like for explaining the method for producing the light emitting element of Modification-8 illustrated in FIG. 13 following FIG. 15C.
Figure 16B:
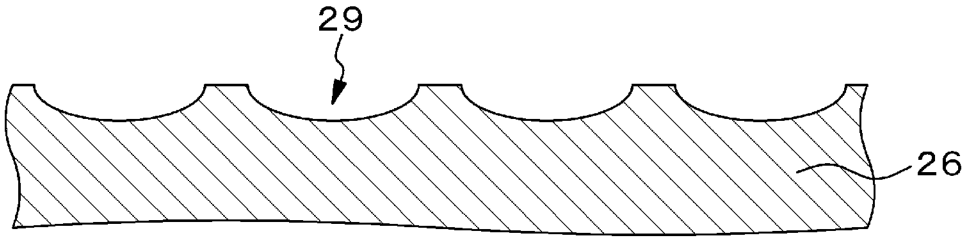
FIG. 16B is a schematic and partial end view of the base and the like for explaining the method for producing the light emitting element of Modification-8 illustrated in FIG. 13 following FIG. 15C.

To form the recess 29 in the part of the base 26 where the light emitting element 10 is to be formed, specifically, form a mask layer 61 made of SiN on the base 26 made of $SiO_2$, and form a resist layer 62 to which a shape for forming the recess is imparted on the mask layer 61 (see FIGS. 15A and 15B). Then, etch back the resist layer 62 and the mask layer 61 to transfer the shape formed on the resist layer 62 to the mask layer 61 (see FIG. 15C). Next, after the resist layer 63 is formed on the entire surface (see FIG. 16A), etch back the resist layer 63, the mask layer 61, and the base 26, whereby the recess 29 may be formed in the base 26 (see FIG. 16B). The recess 29 may be formed in the base 26 by appropriately selecting the material of the resist layer 63 and appropriately setting the etching conditions for etching back the resist layer 63, the mask layer 61, and the base 26, specifically, by selecting a material system and etching conditions with which the etching speed of the resist layer 63 is lower than the etching speed of the mask layer 61.

Figure 17A:
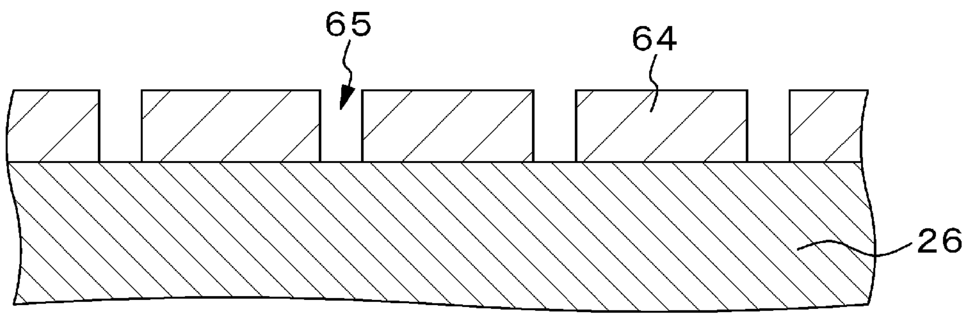
FIG. 17A is a schematic and partial end view of a base and the like for explaining another method for producing the light emitting element of Modification-8 illustrated in FIG. 13.
Figure 17B:
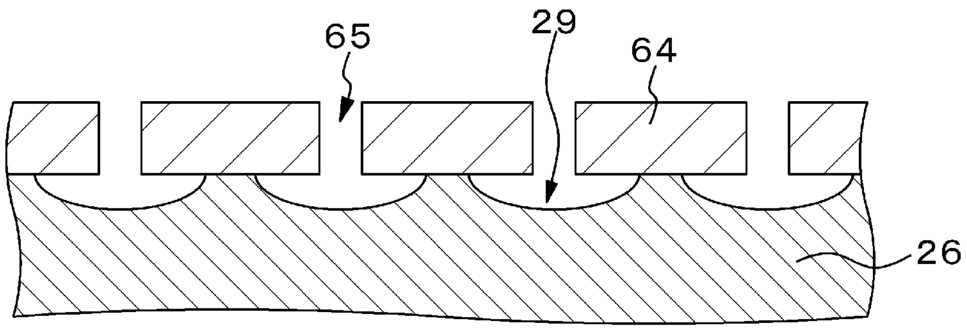
FIG. 17B is a schematic and partial end view of the base and the like for explaining the other method for producing the light emitting element of Modification-8 illustrated in FIG. 13.
Figure 18:
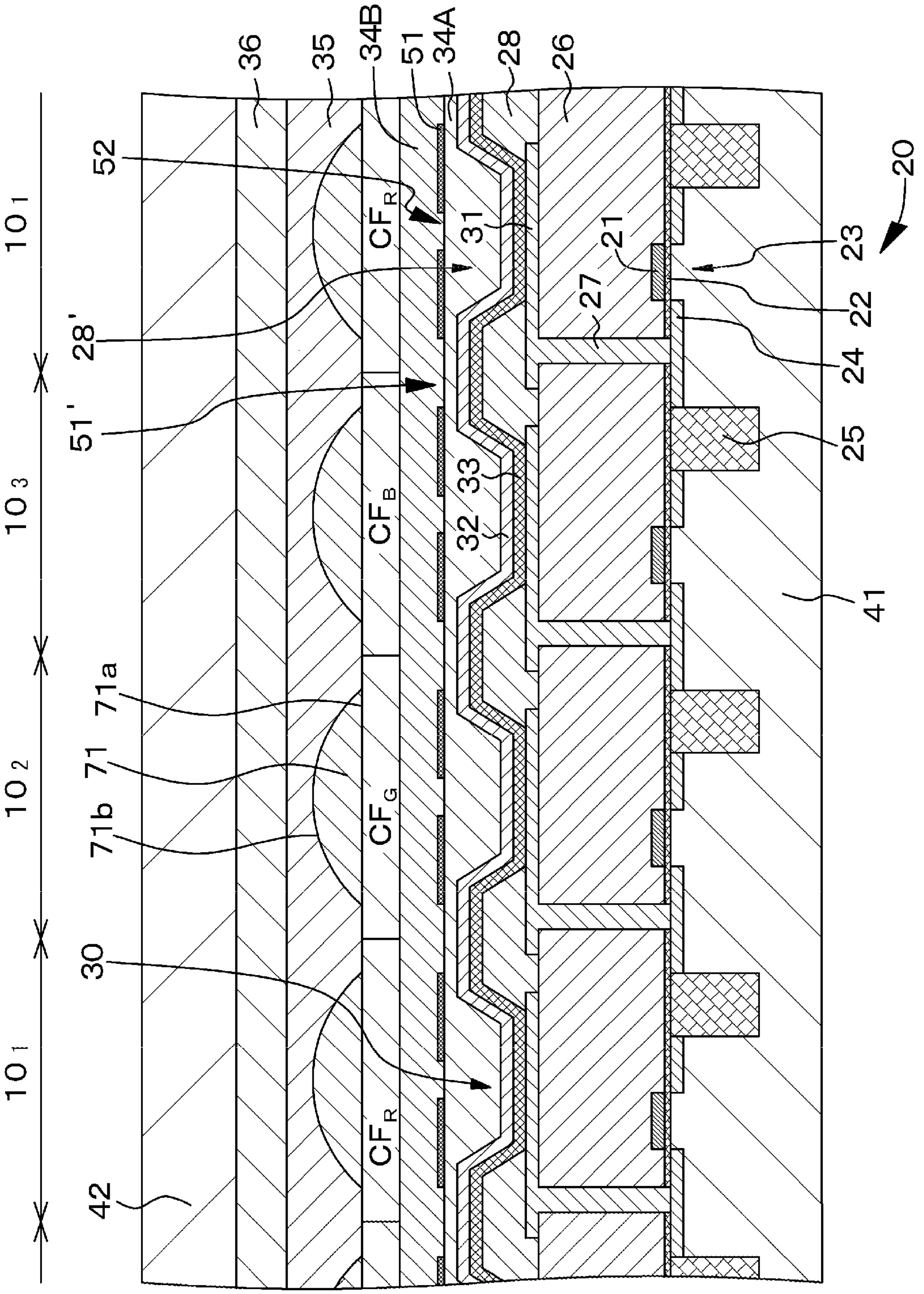
FIG. 18 is a schematic and partial sectional view of Modification-9 of the light emitting element and display apparatus of Example 1.

Alternatively, form a resist layer 64 having an opening region 65 on the base 26 (see FIG. 17A). Then, perform wet etching on the base 26 via the opening region 65, whereby the recess 29 may be formed in the base 26 (see FIG. 17B).

The second protective layer may be formed on the entire surface based on, for example, an ALD method. The second protective layer is formed on the second electrode 32 following the shape of the top surface of the second electrode 32 and has a constant thickness in the recess 29. Subsequently, after the protective layer 34A is formed on the entire surface based on a coating method, a planarization treatment may be performed on the top surface of the protective layer 34A.

In this manner, in the light emitting element 10 of Modification-8 of Example 1, a recess is provided on the surface of the base, and the first electrode, the organic layer, and the second electrode are formed substantially following the shape of the top surface of the recess. Since the recess is formed as described above, the recess can function as a kind of concave mirror. As a result, the front luminance can further increase, the current-light emission efficiency remarkably improves, and the production process does not significantly increase. In addition, since the organic layer has a constant thickness, the resonator structure can be easily formed. Further, since the first electrode has a constant thickness, it is possible to reduce occurrence of a phenomenon such as coloring or luminance change of the first electrode depending on the angle at which the display apparatus is viewed, the phenomenon being caused by a thickness change of the first electrode.

Since the region other than the recess 29 is also formed of the stacked structure of the first electrode 32, the organic layer 33, and the second electrode 32, light is also emitted from this region. This may cause a decrease in light collection efficiency and a decrease in monochromaticity due to light leakage from adjacent pixels. Here, since the boundary between the insulating layer 28 and the first electrode 31 is an end of the light emitting area, the region where light is emitted may be optimized by optimizing this boundary.

In particular, in a microdisplay having a small pixel pitch, the front luminance can be further increased even when an organic layer is formed in a recess with a reduced depth, which is suitable for application to future mobile applications. In the light emitting element of Modification-8 of Example 1, the current-light emission efficiency is further improved as compared with the conventional light emitting element, and it is possible to realize long life and high luminance of the light emitting element and the display apparatus. In addition, the light emitting element can be applied to a remarkably expanded range of eyewear, augmented reality (AR) glasses, and EVR.

The larger the depth of the recess is, the more the light emitted from the organic layer and reflected by the first electrode can be collected in a direction toward the central part of the light emitting element. However, when the depth of the recess is large, it may be difficult to form the organic layer in the upper part of the recess. In this regard, forming an internal lens by using the second protective layer and the protective layer can collect light reflected by the first electrode in a direction toward the central part of the light emitting element even when the depth of the recess is small, and the front luminance can be further increased. Moreover, since the internal lens is formed in a self-alignment manner with respect to the organic layer, there is no misalignment between the organic layer and the internal lens. In addition, since the distance between the internal lens and the organic layer is very short, the range of design and design freedom of the light emitting element are expanded, and appropriately selecting the thicknesses and materials of the protective layer and the second protective layer can change the distance between the internal lens and the organic layer and the curvature of the internal lens, which further expands the range of design and design freedom of the light emitting element. Further, since no heat treatment is required to form the internal lens, the organic layer is not damaged.

In the example illustrated in FIG. 13, the sectional shape of the recess 29 when the recess 29 is cut along a virtual plane including the axis AX of the recess 29 has a smooth curve. However, the sectional shape may be a part of a trapezoid or a combination of a linear slope and a bottom formed of a smooth curve. By forming the sectional shape of the recess 29 into these shapes, the inclination angle of the slope can be increased. As a result, even when the depth of the recess 29 is small, extraction of light emitted from the organic layer 33 and reflected by the first electrode 31 can improve in the front direction.

In Example 1 or Modification-1 to Modification-8 described above, the light reflection film 51 is continuous in adjacent light emitting elements 10. On the other hand, in Modification-9 to Modification-12 of Example 1, the light reflection film 51 has an edge portion. In Modification-9 of Example 1 illustrated in the schematic and partial sectional view of FIG. 18, the light reflection film 51 is discontinuous specifically in adjacent light emitting elements 10. Such a configuration, in which the light repeatedly reflected between the light reflection film and the second electrode or the like in a certain light emitting element is emitted from a discontinuous portion 51' of the light reflection film 51 to the planarization layer 34B, reduces reflection of light entering a light emitting element adjacent to the certain light emitting element between the light reflection film and the second electrode or the like, and can prevent occurrence of so-called optical crosstalk. Modification-10, Modification-11, and Modification-12 of Example 1 described below also can reduce reflection of light entering a light emitting element adjacent to the certain light emitting element between the light reflection film and the second electrode or the like and can prevent occurrence of so-called optical crosstalk.

Figure 19:
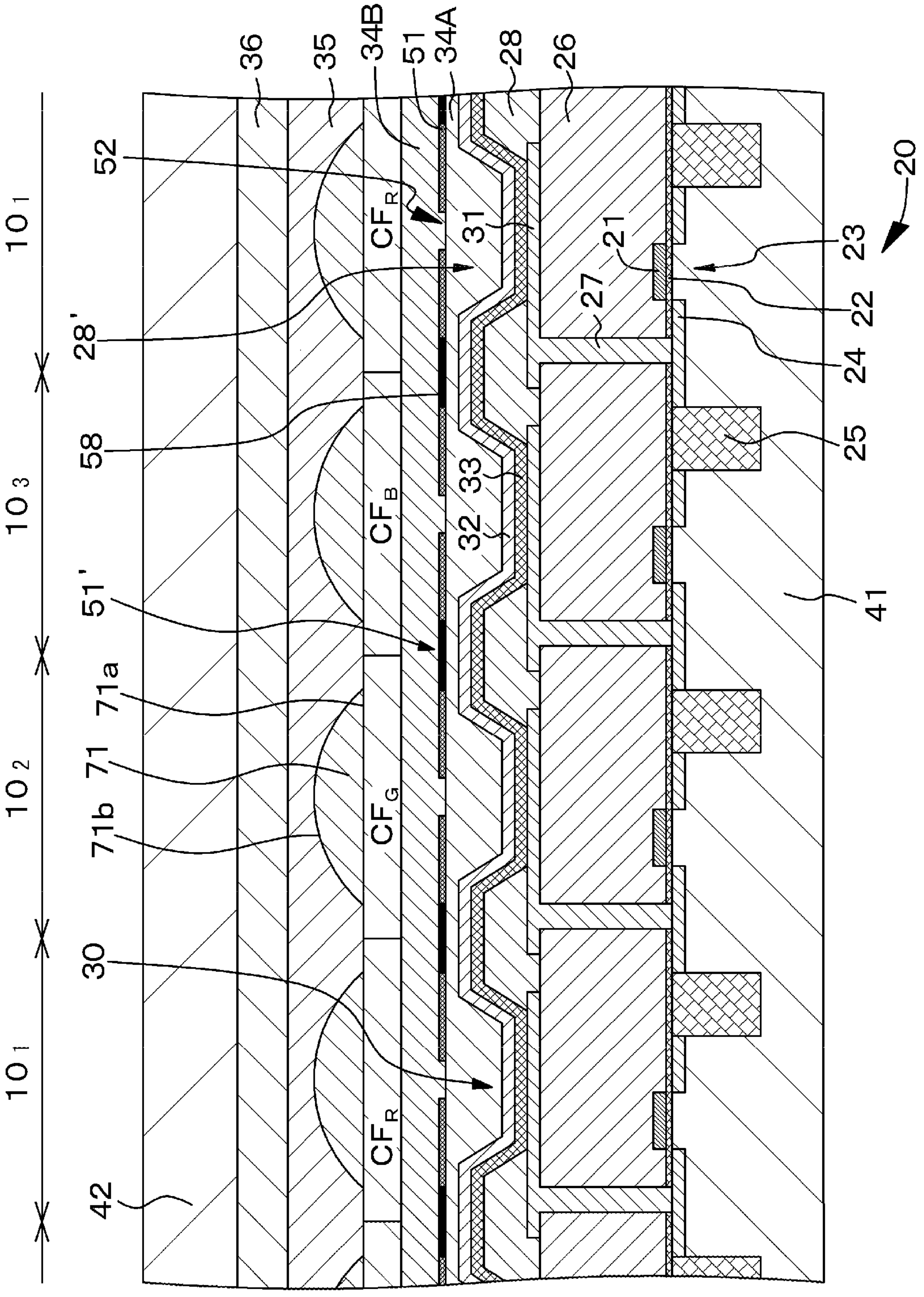
FIG. 19 is a schematic and partial sectional view of Modification-10 of the light emitting element and display apparatus of Example 1.

In Modification-10 of Example 1 illustrated in the schematic and partial sectional view of FIG. 19, a light absorbing material layer 58 is formed on a portion of the protective layer 34A positioned at the discontinuous portion 51' of the light reflection film 51 in adjacent light emitting elements 10 (that is, on the region of the protective layer 34A positioned outside the edge portion of the light reflection film 51 (region where the light reflection film 51 is discontinuous)). Alternatively, a light absorbing material layer may be formed on a region of the protective layer positioned outside the edge portion of the light reflection film (region where the light reflection film is continuous).

Figure 20:
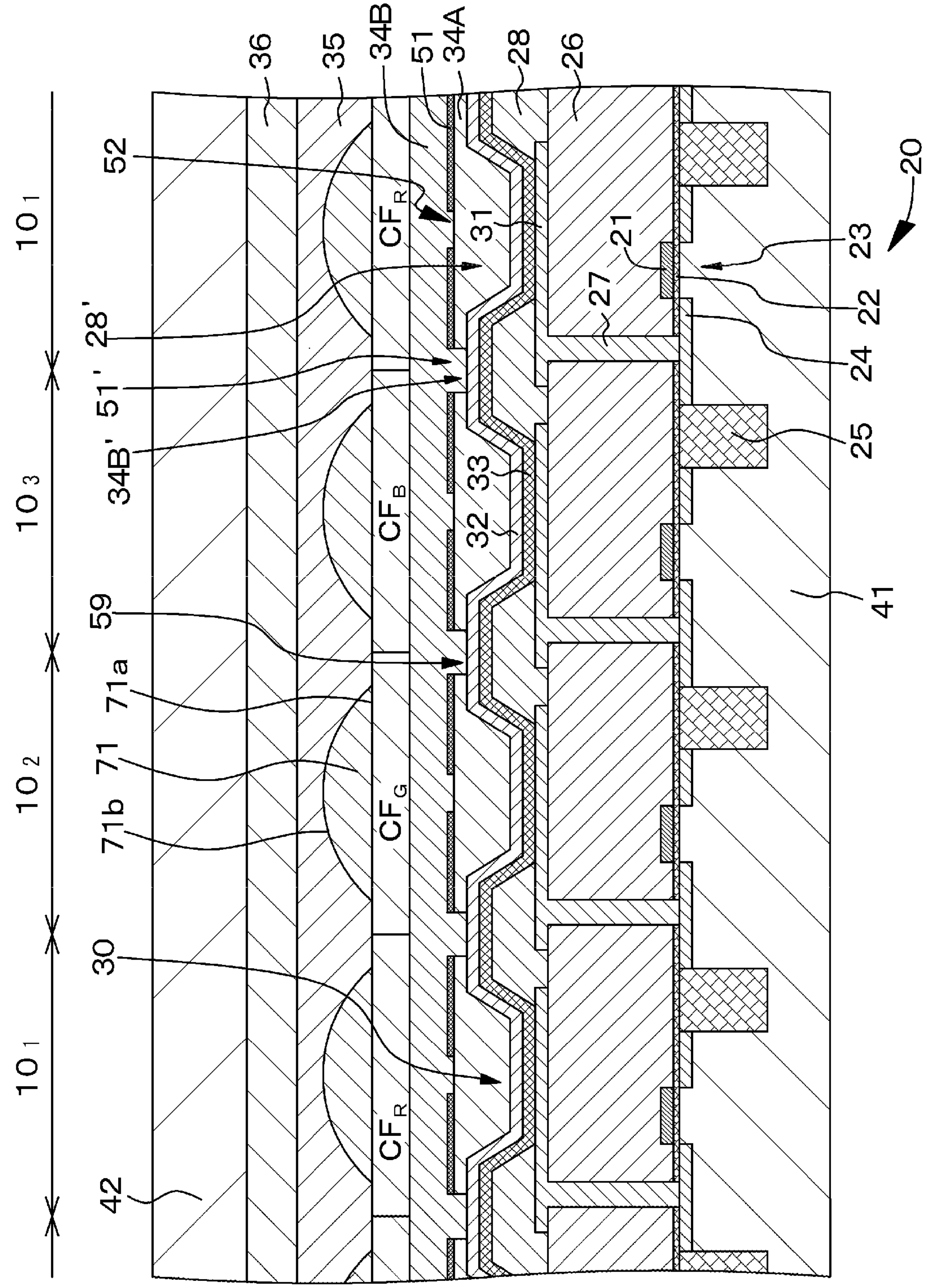
FIG. 20 is a schematic and partial sectional view of Modification-11 of the light emitting element and display apparatus of Example 1.
Figure 21:
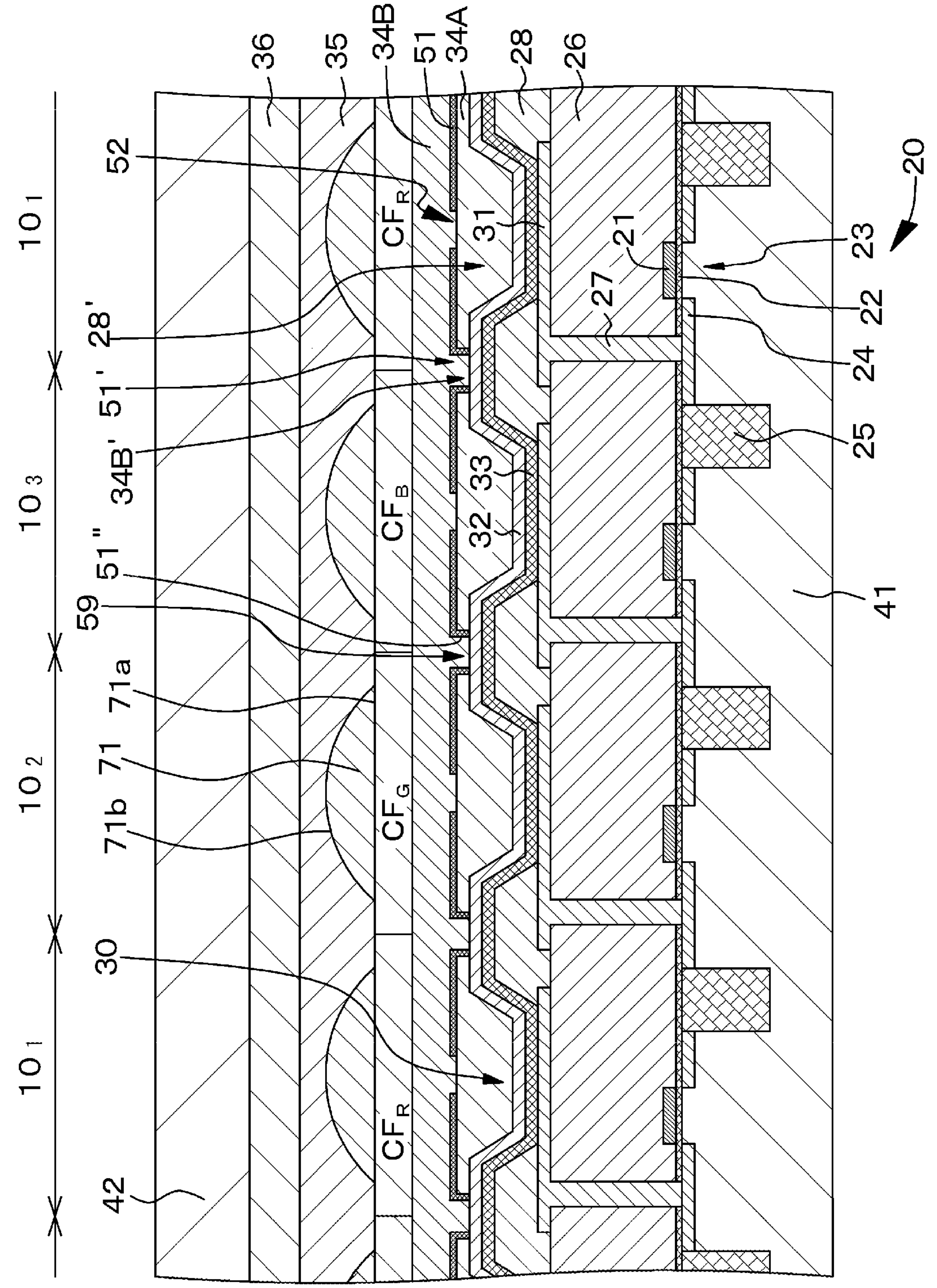
FIG. 21 is a schematic and partial sectional view of Modification-12 of the light emitting element and display apparatus of Example 1.

In Modification-11 of Example 1 illustrated in the schematic and partial sectional view of FIG. 20, a groove 59 is formed in the region of the protective layer 34A positioned outside the edge portion of the light reflection film 51 (region 51' where the light reflection film 51 is discontinuous), and the planarization layer 34B is extended in the groove 59. An extending part of the planarization layer 34B is denoted by reference numeral 34B'. Further, in Modification-12 of Example 1 illustrated in the schematic and partial sectional view of FIG. 21, the light reflection film 51 is extended on a side wall of the groove 59 formed in the protective layer 34A. An extension part of the light reflection film 51 is denoted by reference numeral 51".

The protective layer may have a function as a color filter layer. That is, the protective layer having such a function may be made of a known color resist material. With the protective layer also functioning as a color filter layer, the organic layer and the protective layer can be disposed close to each other, color mixture can be effectively prevented even with a widened angle of light emitted from the light emitting element, and viewing angle properties improve.

Example 2

In Example 2, modifications of Example 1 and Modification-1 to Modification-12 of Example 1 will be described.

Figure 22:
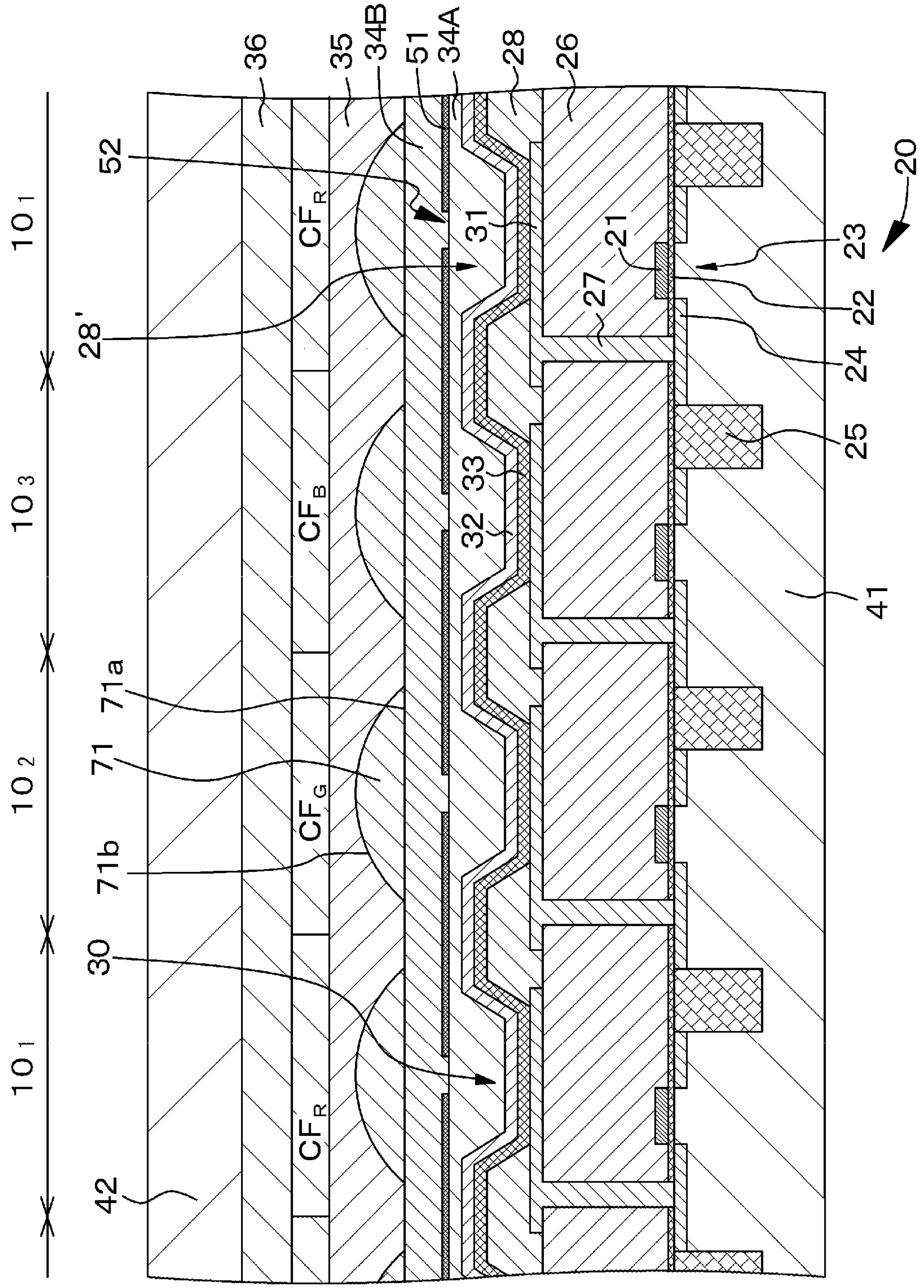
FIG. 22 is a schematic and partial sectional view of a light emitting element and a display apparatus of Example 2.

In Example 2 illustrated in the schematic and partial sectional view of FIG. 22, the color filter layer is provided on the second substrate side. Specifically, the color filter layer CF is provided on or above the optical path control unit 71 (in the illustrated example, above the optical path control unit 71). More specifically, the optical path control unit 71 is provided on the planarization layer 34B, the underlayer 36 and the color filter layer CF are sequentially provided on the inner surface of the second substrate 42, and a part of the planarization layer 34B and the optical path control unit 71 are bonded to the color filter layer CF by the bonding member 35.

Figure 23:
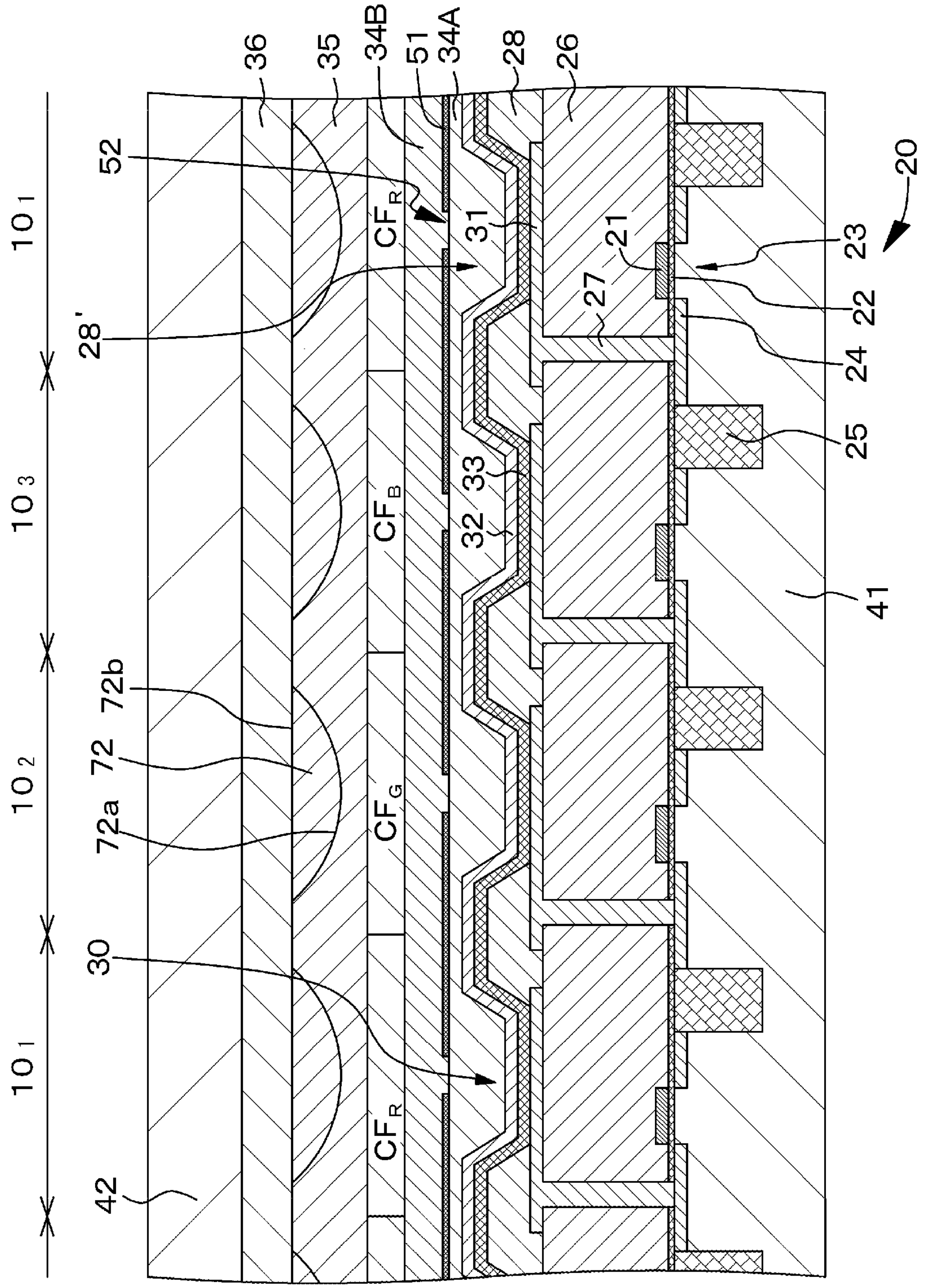
FIG. 23 is a schematic and partial sectional view of Modification-1 of the light emitting element and display apparatus of Example 2.

FIG. 23 is a schematic and partial sectional view of Modification-1 of the light emitting element and the display apparatus of Example 2, where the optical path control unit 72 is provided on the second substrate side. The color filter layer CF is provided on the first substrate side. The optical path control unit 72 is formed of a plano-convex lens having a convex shape in a direction toward the second electrode 32. That is, a light incident surface 72*a* of the optical path control unit 72 has a convex shape, and a light emission surface 72*b* is flat, for example.

Figure 24:
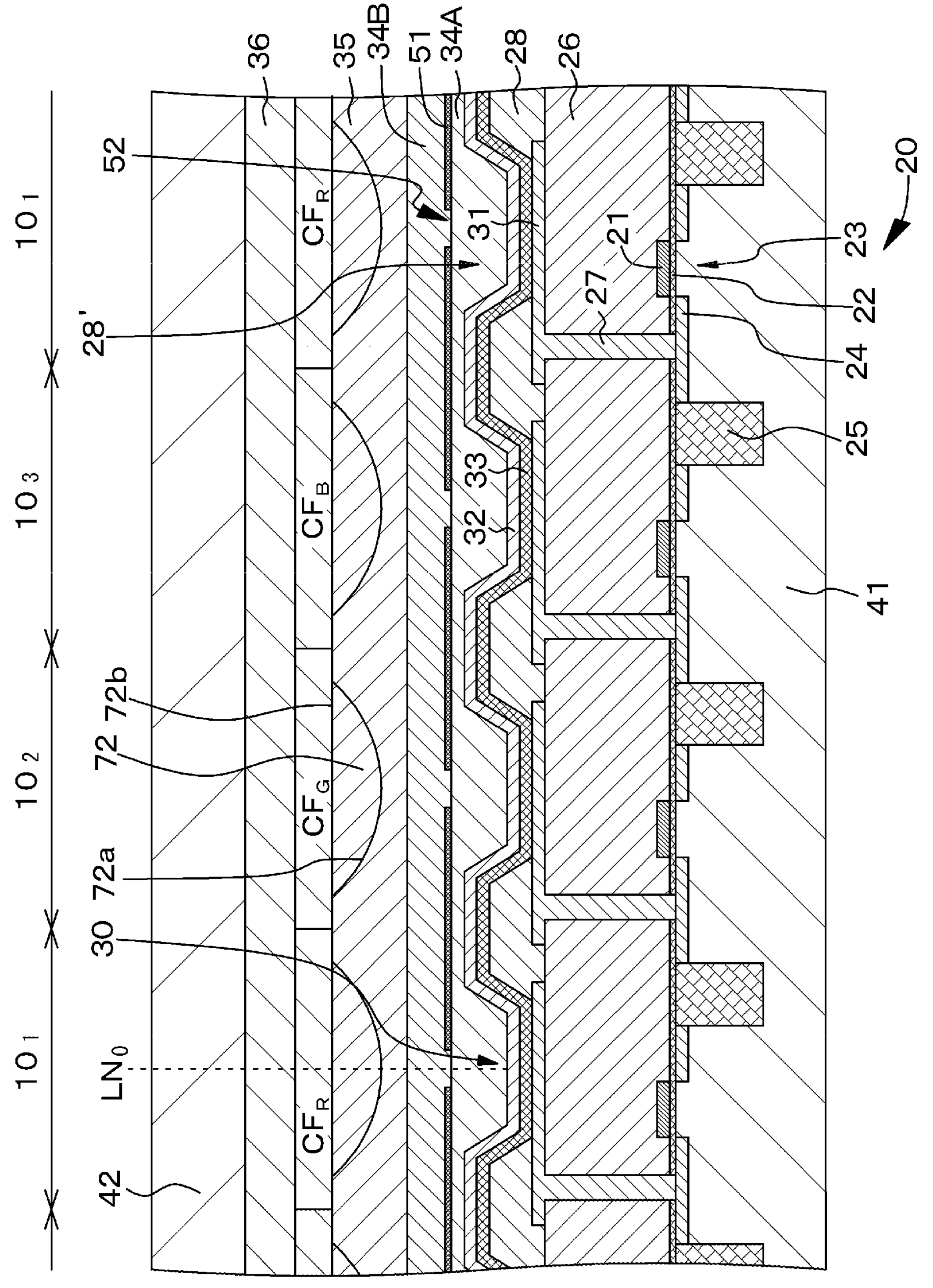
FIG. 24 is a schematic and partial sectional view of Modification-2 of the light emitting element and display apparatus of Example 2.

FIG. 24 is a schematic and partial sectional view of Modification-2 which is a modification of Modification-1 of the light emitting element and the display apparatus of Example 2. The color filter layer CF may be provided on the second substrate side. Specifically, the color filter layer CF may be provided between the second substrate 42 and the optical path control unit 72 (more specifically, between the underlayer 36 and the optical path control unit 72).

Figure 25:
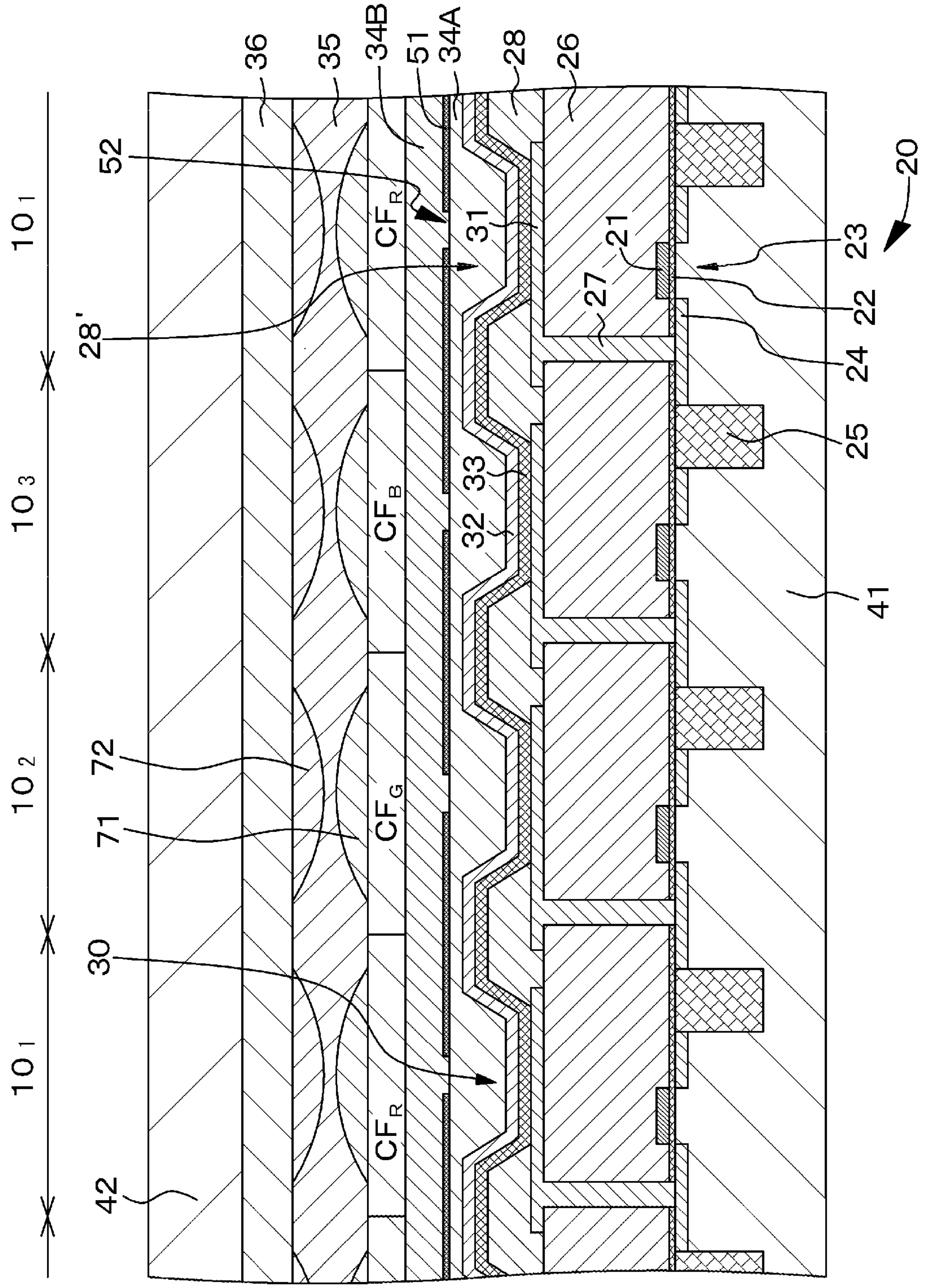
FIG. 25 is a schematic and partial sectional view of Modification-3 of the light emitting element and display apparatus of Example 2.

FIG. 25 is a schematic and partial sectional view of Modification-3 of the light emitting element and the display apparatus of Example 2, in which the light emitting element 10 includes:

a first optical path control unit (specifically, first lens member) 71 that receives light emitted from the light emitting region and has a positive optical power; and a second optical path control unit (specifically, second lens member) 72 that receives light emitted from the first optical path control unit 71 and has a positive optical power, wherein the bonding member 35 (sealing resin layer) is interposed between the first optical path control unit 71 and the second optical path control unit 72. The first optical path control unit 71 and the second optical path control unit 72 are separated from each other.

Further, $$n'_1 > n_0$$

and $$n'_2 > n_0$$

are satisfied where $n_1'$ is a refractive index of the material constituting the first optical path control unit 71, $n_2'$ is a refractive index of the material constituting the second optical path control unit 72, and no is a refractive index of the material constituting the bonding member 35. Specifically, the first optical path control unit 71 and the second optical path control unit 72 are formed of an acrylic adhesive having a refractive index $n_1'=n_2'=1.55$. The bonding member 35 is formed of an acrylic adhesive having a refractive index $n_0=1.35$. The acrylic adhesive constituting the first optical path control unit 71 and the second optical path control unit 72 is different from the acrylic adhesive constituting the bonding member 35. The first optical path control unit 71 and the second optical path control unit 72 are bonded together by the bonding member 35.

Figure 26:
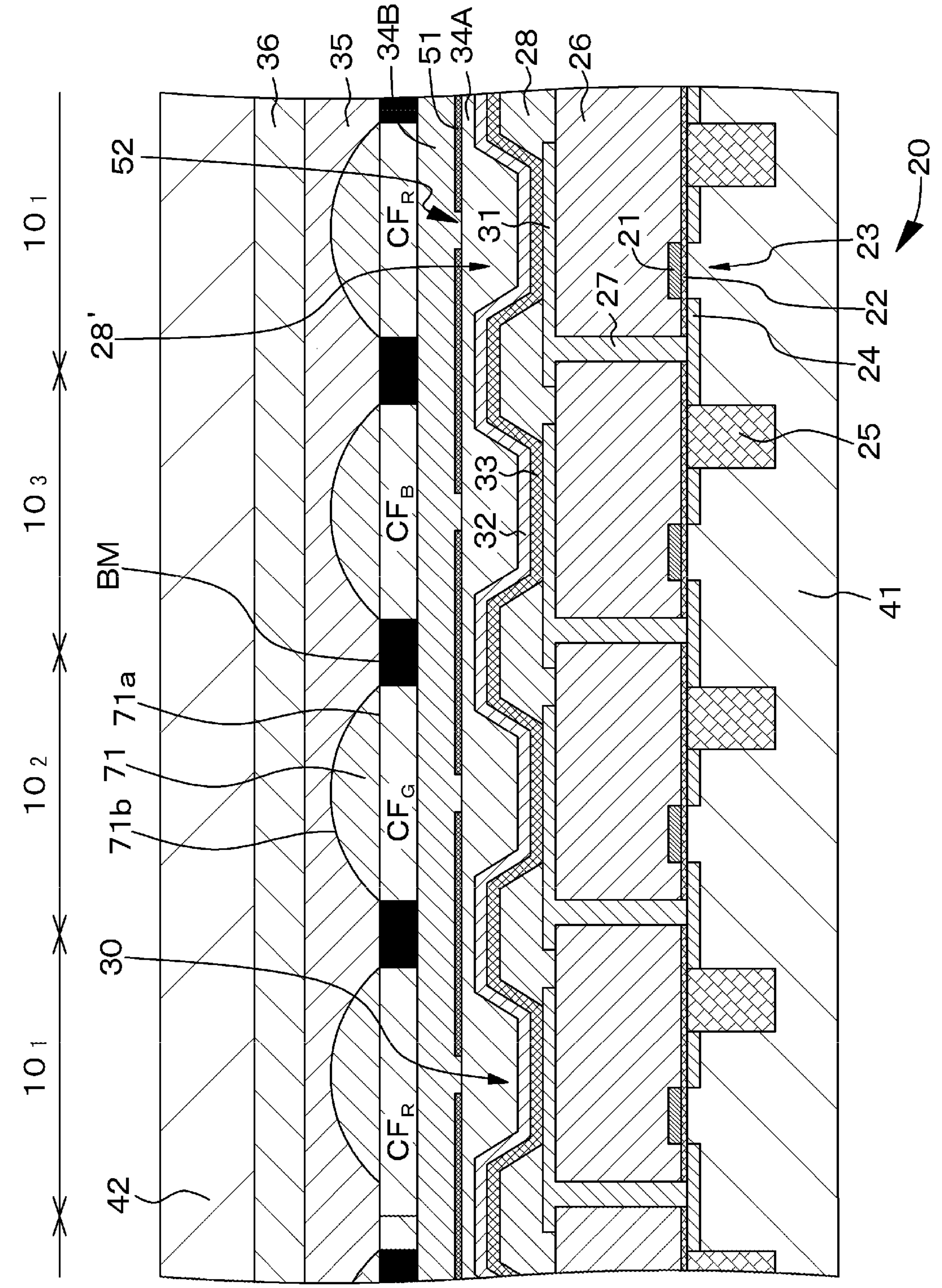
FIG. 26 is a schematic and partial sectional view of Modification-4 of the light emitting element and display apparatus of Example 2.
Figure 27:
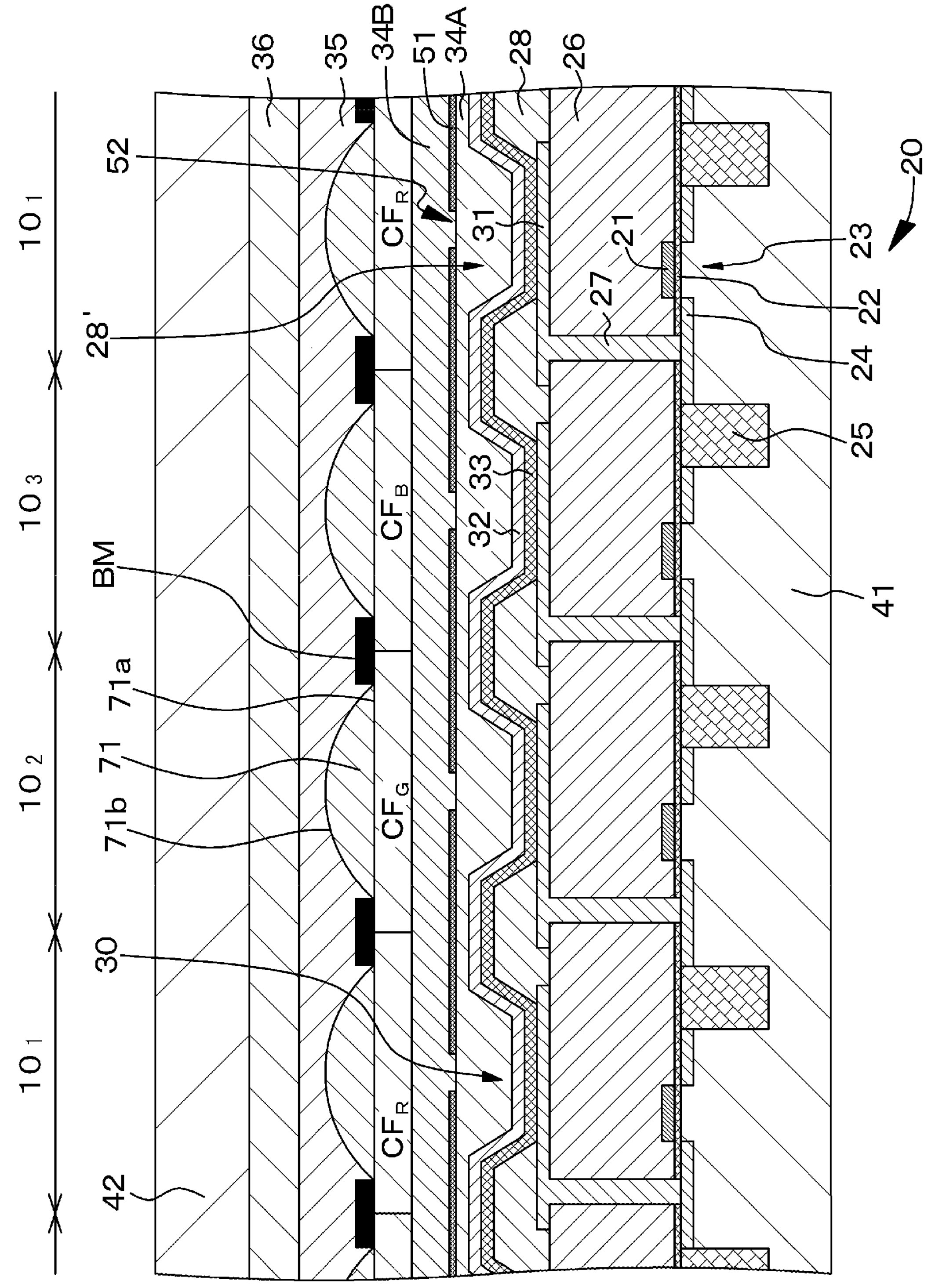
FIG. 27 is a schematic and partial sectional view of Modification-5 of the light emitting element and display apparatus of Example 2.

FIG. 26 is a schematic and partial sectional view of Modification-4 of the light emitting element and the display apparatus of Example 2. A light absorbing layer (black matrix layer) BM may be formed between the wavelength selection units CF of adjacent light emitting elements. FIG. 27 is a schematic and partial sectional view of Modification-5 of the light emitting element and the display apparatus of Example 2. The light absorption layer (black matrix layer) BM may be formed between the optical path control unit 71 and the optical path control unit 71 of adjacent light emitting elements. The black matrix layer BM is formed of, for example, a black resin film (specifically, for example, a black polyimide resin) mixed with a black colorant and having an optical density of 1 or more. These Modification-1, Modification-2, Modification-3, Modification-4, and Modification-5 may be appropriately applied to Example 1 and Modification-1 to Modification-12 of Example 1, and they may also be applied to other Examples.

Example 3

Example 3 is a modification of Examples 1 and 2. The organic EL display apparatus preferably includes a resonator structure to further improve the light extraction efficiency. Specifically, light emitted from the light emitting layer is caused to resonate between a first interface composed of an interface between the first electrode and the organic layer (alternatively, in a structure in which an interlayer insulating material layer is provided beneath the first electrode and a light reflection layer is provided beneath the interlayer insulating material layer, a first interface composed of an interface between the light reflection layer and the interlayer insulating material layer) and a second interface composed of an interface between the second electrode and the organic layer, and part of the light is emitted from the second electrode. The following Formulas (1-1) and (1-2) may be satisfied where $OL_1$ is the optical distance from the maximum light emission position of the light emitting layer to the first interface, $OL_2$ is the optical distance from the maximum light emission position of the light emitting layer to the second interface, and $m_1$ and $m_2$ are integers.

$$0.7\{-\Phi_1/(2\pi)+m_1\} \le 2\times OL_1/\lambda \le 1.2\{-\Phi_1/(2\pi)+m_1\} \quad (1\text{-}1)$$

$$0.7\{-\Phi_2/(2\pi)+m_2\} \le 2\times OL_2/\lambda \le 1.2\{-\Phi_2/(2\pi)+m_2\} \quad (1\text{-}2)$$

where $\lambda$: a maximum peak wavelength of spectrum of light generated in the light emitting layer (or a desired wavelength in light generated in the light emitting layer)

$\Phi_1$: a phase shift amount (unit: radian) of light reflected at the first interface where $-2\pi<\Phi_1\le 0$ $\Phi_2$: a phase shift amount (unit: radian) of light reflected at the second interface where $-2\pi<\Phi_2\le 0$.

The value of $m_1$ is a value of 0 or more, and the value of $m_2$ is a value of 0 or more independently of the value of $m_1$. Examples thereof include $(m_1, m_2)=(0, 0)$, $(m_1, m_2)=(0, 1)$, $(m_1, m_2)=(1, 0)$, and $(m_1, m_2)=(1, 1)$.

The distance $SD_1$ from the maximum light emission position of the light emitting layer to the first interface refers to an actual distance (physical distance) from the maximum light emission position of the light emitting layer to the first interface. The distance $SD_2$ from the maximum light emission position of the light emitting layer to the second interface refers to an actual distance (physical distance) from the maximum light emission position of the light emitting layer to the second interface. The optical distance is also referred to as an optical path length, and it typically refers to $n\times SD$ when a light beam passes through a medium having a refractive index n by a distance SD. The same applies hereinafter. Thus, $$OL_1 = SD_1 \times n_{ave}$$

$$OL_2 = SD_2 \times n_{ave}$$

are satisfied where $n_{ave}$ is an average refractive index. Here, the average refractive index $n_{ave}$ is obtained by summing up the product of the refractive index and the thickness of each layer constituting the organic layer (or, the organic layer, the first electrode, and the interlayer insulating material layer) and dividing the sum by the thickness of the organic layer (or, the organic layer, the first electrode, and the interlayer insulating material layer).

The light emitting element may be designed by determining a desired wavelength $\lambda$ (specifically, a red wavelength, a green wavelength, or a blue wavelength, for example) in light generated in the light emitting layer and obtaining various parameters such as $OL_1$ and $OL_2$ in the light emitting element based on Formulas (1-1) and (1-2).

The first electrode or the light reflection layer and the second electrode absorb part of incident light and reflect the rest. Thus, a phase shift occurs in the reflected light. The phase shift amounts $\Phi_1$ and $\Phi_2$ may be obtained by measuring the values of the real number part and the imaginary number part of the complex refractive index of the materials constituting the first electrode or the light reflection layer and the second electrode using, for example, an ellipsometer, and performing calculation based on these values (see, for example, "Principles of Optic", Max Born and Emil Wolf, 1974 (PERGAMON PRESS)). The refractive index of the organic layer, the interlayer insulating material layer, or the like, the refractive index of the first electrode, or the refractive index of the first electrode in a case where the first electrode absorbs part of incident light and reflect the rest may also be determined by a measurement using an ellipsometer.

Examples of the material constituting the light reflection layer include the materials exemplified as the material constituting the light reflection film, and the light reflection layer may be formed based on the same forming method as the method for forming the light reflection film.

In this manner, in the organic EL display apparatus having a resonator structure, in practice, the light emitting unit constituting a red light emitting element causes white light emitted from the organic layer to resonate and emits reddish light (light having a light spectrum peak in a red region) from the second electrode. The light emitting unit constituting a green light emitting element causes white light emitted from the organic layer to resonate and emits greenish light (light having a light spectrum peak in a green region) from the second electrode. The light emitting unit constituting a blue light emitting element causes white light emitted from the organic layer to resonate and emits bluish light (light having a light spectrum peak in a blue region)

from the second electrode. That is, each light emitting element may be designed by determining a desired wavelength λ (specifically, a red wavelength, a green wavelength, or a blue wavelength) in light generated in the light emitting layer and obtaining various parameters such as $OL_1$ and $OL_2$ in each of the red light emitting element, green light emitting element, and blue light emitting element based on Formulas (1-1) and (1-2). For example, paragraph [0041] of JP 2012-216495 A discloses an organic EL element having a resonator structure in which an organic layer serves as a resonance unit, and it describes that a film thickness of the organic layer is preferably 80 nm or more and 500 nm or less, and more preferably 150 nm or more and 350 nm or less because a distance from a light emitting point (light emitting surface) to a reflection surface can be appropriately adjusted. Usually, the value of ($SD_1+SD_2=SD_{12}$) is different in the red light emitting element, the green light emitting element, and the blue light emitting element.

The resonator structure in Examples 1 and 2 is a resonator structure in which the organic layer 33, serving as a resonance unit, is sandwiched between the first electrode 31 and the second electrode 32. That is, light emitted from the light emitting layer is caused to resonate between a first interface formed of an interface between the first electrode 31 and the organic layer 33 and a second interface formed of an interface between the second electrode 32 and the organic layer 33, and part of the light is emitted from the second electrode. The above-described Formulas (1-1) and (1-2) may be satisfied where the optical distance from the maximum light emission position of the light emitting layer to the first interface is $OL_1$, the optical distance from the maximum light emission position of the light emitting layer to the second interface is $OL_2$, and $m_1$ and $m_2$ are integers.

On the other hand, Example 3 specifically has a structure in which an interlayer insulating material layer 38 is provided beneath the first electrode 31, the light reflection layer 37 is provided beneath the interlayer insulating material layer 38, light emitted from the light emitting layer is caused to resonate between the first interface formed of the interface between the light reflection layer 37 and the interlayer insulating material layer 38 and the second interface formed of the interface between the second electrode 32 and the organic layer 33, and part of the light is emitted from the second electrode 32. The above-described Formulas (1-1) and (1-2) may be satisfied where the optical distance from the maximum light emission position of the light emitting layer to the first interface is $OL_1$, the optical distance from the maximum light emission position of the light emitting layer to the second interface is $OL_2$, and $m_1$ and $m_2$ are integers.

Figure 28:
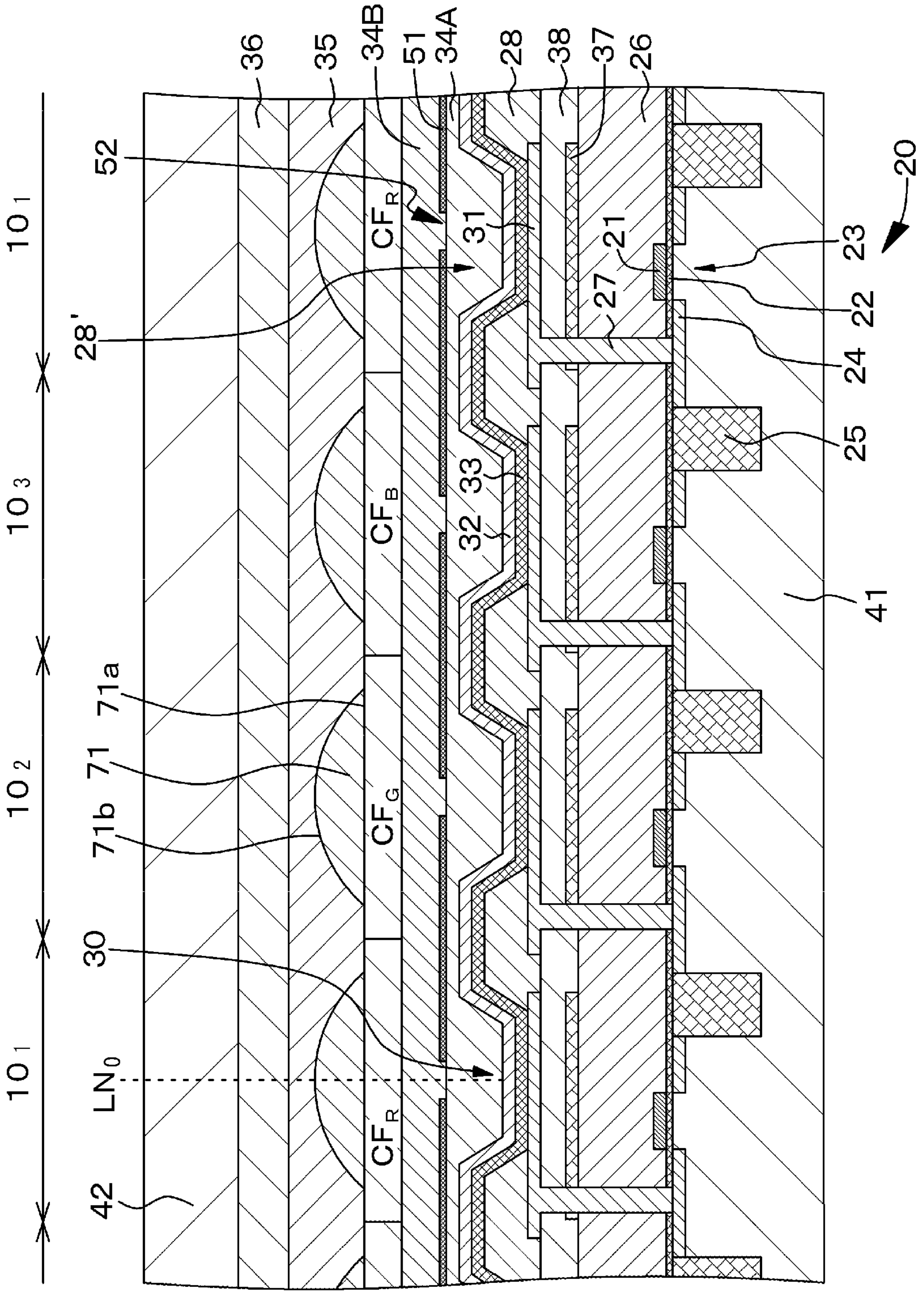
FIG. 28 is a schematic and partial sectional view of a light emitting element and a display apparatus of Example 3.

FIG. 28 is a schematic and partial sectional view of the display apparatus of Example 3. In the display apparatus of Example 3, each of the light emitting elements 10 has a resonator structure, the first light emitting element $\mathbf{10}_1$ emits red light, the second light emitting element $\mathbf{10}_2$ emits green light, and the third light emitting element $\mathbf{10}_3$ emits blue light, the first light emitting element $\mathbf{10}_1$ is provided with the wavelength selection unit $CF_R$ that transmits the emitted red light, the second light emitting element $\mathbf{10}_2$ is provided with the wavelength selection unit $CF_G$ that transmits the emitted green light, and the third light emitting element $\mathbf{10}_3$ is provided with the wavelength selection unit $CF_B$ that transmits the emitted blue light.

Alternatively, the display apparatus of Example 3 includes:

the first substrate 41 and the second substrate 42; and a plurality of light emitting element units each including the first light emitting element $\mathbf{10}_1$, the second light emitting element $\mathbf{10}_2$, and the third light emitting element $\mathbf{10}_3$ provided on the first substrate 41, wherein each of the light emitting elements 10 includes the light emitting unit 30 provided above the first substrate 41, each of the light emitting elements 10 has a resonator structure, the first light emitting element $\mathbf{10}_1$ emits red light, the second light emitting element $\mathbf{10}_2$ emits green light, and the third light emitting element $\mathbf{10}_3$ emits blue light, the first light emitting element $\mathbf{10}_1$ is provided with the wavelength selection unit $CF_R$ that transmits the emitted red light, the second light emitting element $\mathbf{10}_2$ is provided with the wavelength selection unit $CF_G$ that transmits the emitted green light, and the third light emitting element $\mathbf{10}_3$ is provided with the wavelength selection unit $CF_B$ that transmits the emitted blue light.

Optimum $OL_1$ and $OL_2$ may be obtained in each of the first light emitting element $\mathbf{10}_1$ to display red, the second light emitting element $\mathbf{10}_2$ to display green, and the third light emitting element $\mathbf{10}_3$ to display blue based on the above-described Formulas (1-1) and (1-2), with which an emission spectrum having a sharp peak can be obtained in each light emitting element. The first light emitting element $\mathbf{10}_1$, the second light emitting element $\mathbf{10}_2$, and the third light emitting element $\mathbf{10}_3$ have the same configuration and structure except for the color filter layers $CF_R$, $CF_G$, and $CF_B$, and the resonator structure (configuration of the light emitting layer).

Figure 29:
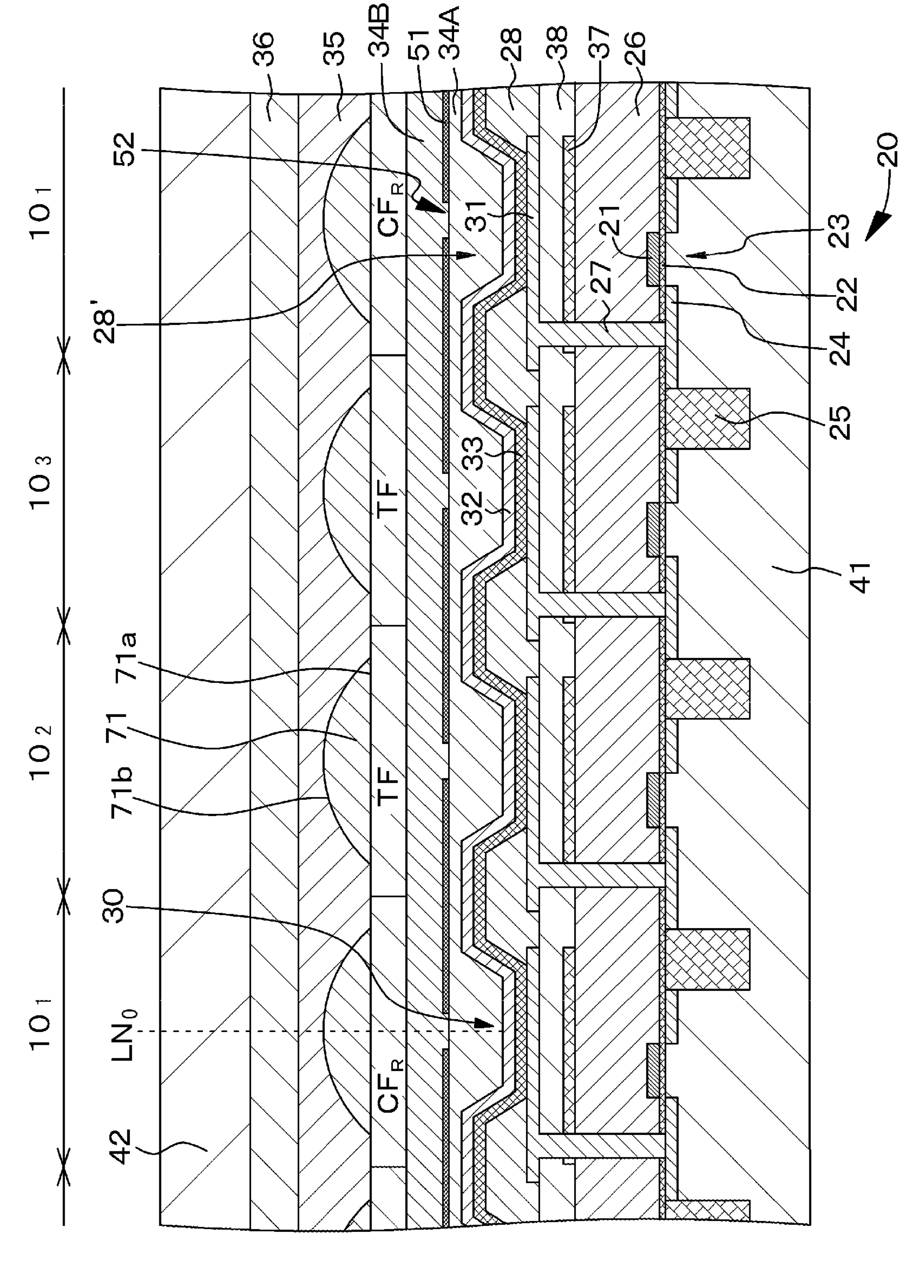
FIG. 29 is a schematic and partial sectional view of Modification-1 of the light emitting element and display apparatus of Example 3.

FIG. 29 is a schematic and partial sectional view of Modification-1 of the light emitting element and the display apparatus of Example 3. Unlike the example illustrated in FIG. 28, the second light emitting element $\mathbf{10}_2$ and the third light emitting element $\mathbf{10}_3$ are not provided with the wavelength selection unit CF. In the second light emitting element $\mathbf{10}_2$ and the third light emitting element $\mathbf{10}_3$, a transparent filter layer TF is provided instead of the color filter layer.

Then, optimum $OL_1$ and $OL_2$ may be obtained in each of the first light emitting element $\mathbf{10}_1$ to display red, the second light emitting element $\mathbf{10}_2$ to display green, and the third light emitting element $\mathbf{10}_3$ to display blue based on the above-described Formulas (1-1) and (1-2), with which an emission spectrum having a sharp peak can be obtained in each light emitting element. The first light emitting element $\mathbf{10}_1$, the second light emitting element $\mathbf{10}_2$, and the third light emitting element $\mathbf{10}_3$ have the same configuration and structure except for the color filter layer $CF_R$, the filter layer TF, and the resonator structure (configuration of the light emitting layer).

In some cases, in addition to the maximum peak wavelength $\lambda_R$ (red) of the spectrum of light generated in the light emitting layer provided in the first light emitting element $\mathbf{10}_1$ to display red, light having a wavelength $\lambda_R'$ shorter than $\lambda_R$ resonates in the resonator structure, depending on the settings of $m_1$ and $m_2$. Similarly, in addition to the maximum peak wavelength $\lambda_G$ (green) of the spectrum of light generated in the light emitting layer provided in the second light emitting element $\mathbf{10}_2$ to display green, light having a wavelength $\lambda_G'$ shorter than $\lambda_G$ resonates in the resonator structure in some cases. In addition to the maximum peak wavelength $\lambda_B$ (blue) of the spectrum of light generated in the light emitting layer provided in the third light emitting element $10_3$ to display blue, light having a wavelength $\lambda_B'$ shorter than $\lambda_B$ resonates in the resonator structure in some cases. Usually, light having wavelengths $\lambda_G'$ and $\lambda_B'$ is out of the range of visible light, and thus it is not observed by an observer of the display apparatus. However, light having a wavelength $\lambda_R'$ may be observed as blue by an observer of the display apparatus.

Thus, in such a case, there is no need to provide the wavelength selection unit CF in the second light emitting element $10_2$ or the third light emitting element $10_3$, but it is preferable to provide the wavelength selection unit $CF_R$ that transmits the emitted red light in the first light emitting element $10_1$. Thus, it is possible to display an image with high color purity with the first light emitting element $10_1$, and it is possible to achieve high light emission efficiency in the second light emitting element $10_2$ and the third light emitting element $10_3$ because the wavelength selection unit CF is not provided in the second light emitting element $10_2$ or the third light emitting element $10_3$.

Specifically, the resonator structure may be made of a material that reflects light with high efficiency as described above as a material constituting the first electrode 31. When the light reflection layer 37 is provided below the first electrode 31 (on the first substrate 41 side), the resonator structure may be made of the transparent conductive material described above as the material constituting the first electrode 31. When the light reflection layer 37 is provided on the base 26, and the first electrode 31 is provided on the interlayer insulating material layer 38 covering the light reflection layer 37, the first electrode 31, the light reflection layer 37, and the interlayer insulating material layer 38 may be made of the above-described materials. The light reflection layer 37 may be connected to the contact hole (contact plug) 27 (see FIGS. 28 and 29) but does not have to be connected to the contact hole (contact plug) 27, which is not illustrated.

Hereinafter, the resonator structure will be described based on first to eighth examples with reference to FIGS. 30A (first example), 30B (second example), 31A (third example), 31B (fourth example), 32A (fifth example), 32B (sixth example), 33A (seventh example), and 33B and 33C (eighth example). In the first to fourth examples and the seventh example, the first electrode has the same thickness in the light emitting units, and the second electrode has the same thickness in the light emitting units. In the fifth to sixth examples, the first electrode has different thicknesses in the light emitting units, and the second electrode has the same thickness in the light emitting units. In the eighth example, the first electrode may have different thicknesses or may have the same thickness in the light emitting units, and the second electrode has the same thickness in the light emitting units.

In the following description, the light emitting unit constituting the first light emitting element $10_1$, the second light emitting element $10_2$, and the third light emitting element $10_3$ is denoted by reference numerals $30_1$, $30_2$, $30_3$, the first electrode is denoted by reference numerals $31_1$, $31_2$, $31_3$, the second electrode is denoted by reference numerals $32_1$, $32_2$, $32_3$, the organic layer is denoted by reference numerals $33_1$, $33_2$, $33_3$, the light reflection layer is denoted by reference numerals $37_1$, $37_2$, $37_3$, and the interlayer insulating material layer is denoted by reference numerals $38_1$, $38_2$, $38_3$, $38_1'$, $38_2'$, $38_3'$. In the following description, the materials to be used are examples, and they may be changed as appropriate.

In the illustrated examples, the resonator lengths of the first light emitting element $10_1$, the second light emitting element $10_2$, and the third light emitting element $10_3$ derived from Formulas (1-1) and (1-2) are shortened in the order of the first light emitting element $10_1$, the second light emitting element $10_2$, and the third light emitting element $10_3$, that is, the value of $SD_{12}$ is shortened in the order of the first light emitting element $10_1$, the second light emitting element $10_2$, and the third light emitting element $10_3$, but the resonator lengths are not limited to this configuration, and the optimum resonator length may be determined by appropriately setting the values of $m_1$ and $m_2$.

Figure 30A:
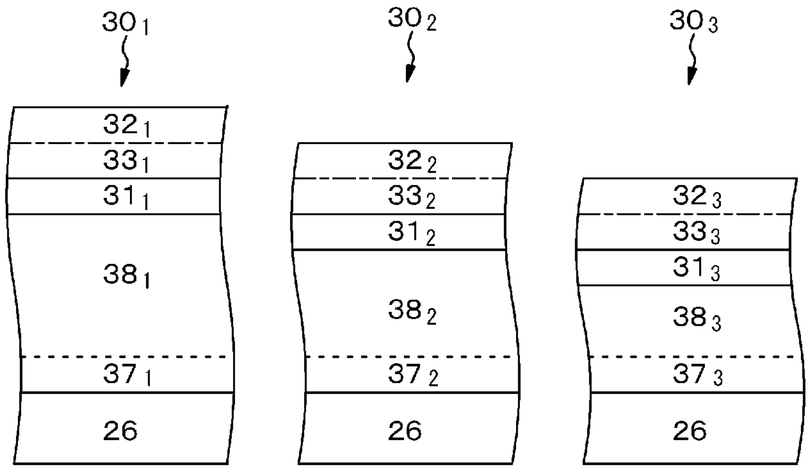
FIG. 30A is a conceptual diagram of light emitting elements having a first example of a resonator structure in Example 3.
Figure 30B:
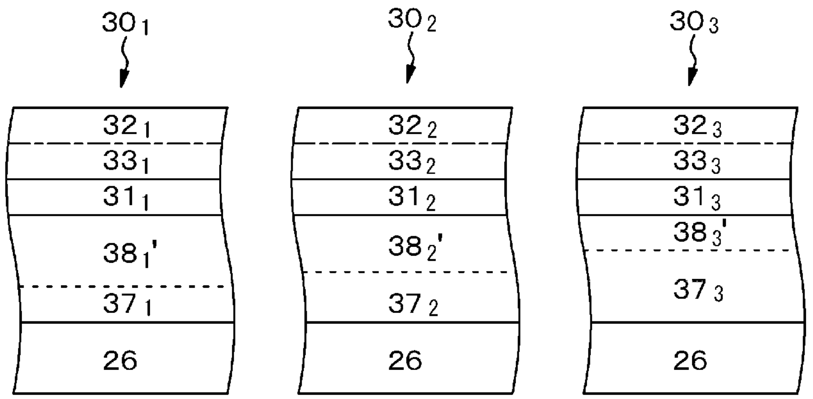
FIG. 30B is a conceptual diagram of light emitting elements having a second example of the resonator structure in Example 3.
Figure 31A:
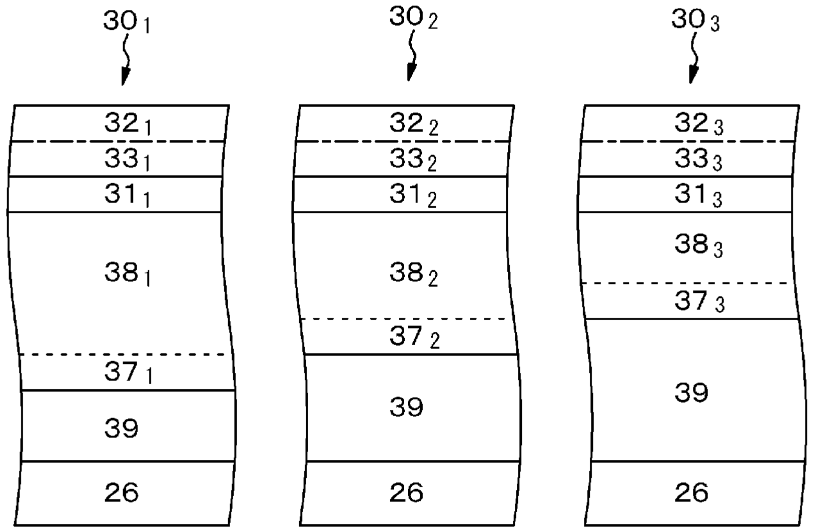
FIG. 31A is a conceptual diagram of light emitting elements having a third example of the resonator structure in Example 3.
Figure 31B:
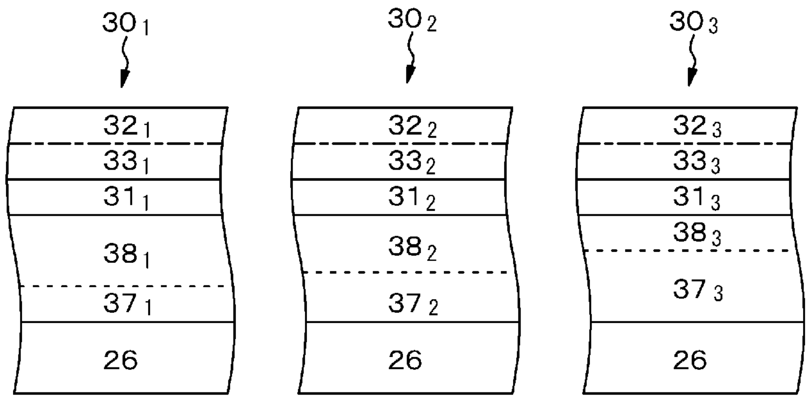
FIG. 31B is a conceptual diagram of light emitting element having a fourth example of the resonator structure in Example 3.
Figure 32A:
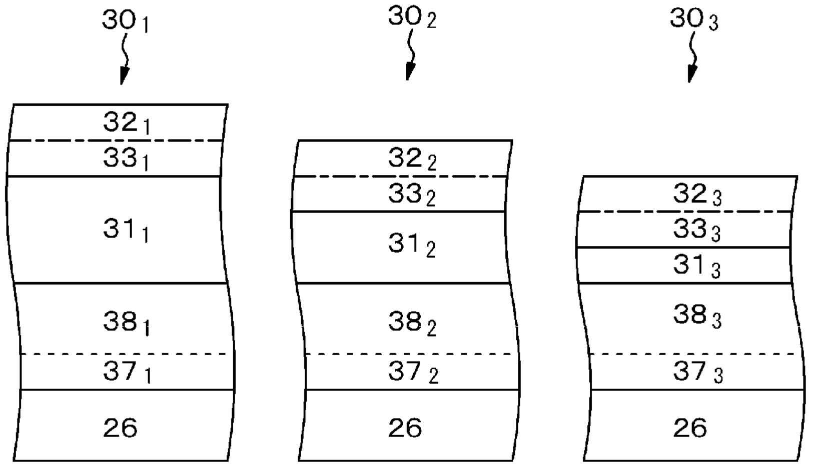
FIG. 32A is a conceptual diagram of light emitting elements having a fifth example of the resonator structure in Example 3.
Figure 32B:
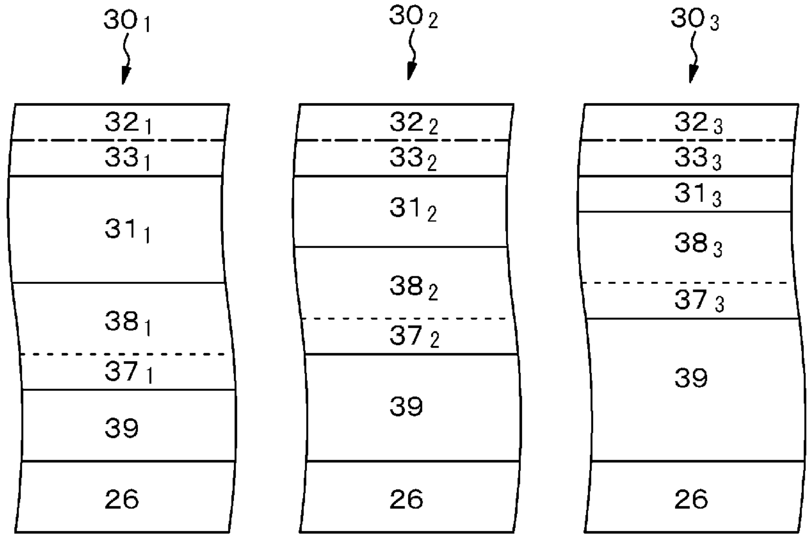
FIG. 32B is a conceptual diagram of light emitting elements having a sixth example of the resonator structure in Example 3.
Figure 33A:
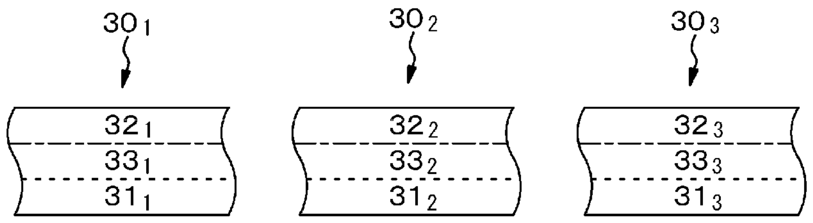
FIG. 33A is a conceptual diagram of light emitting elements having a seventh example of the resonator structure in Example 3.
Figure 33B:
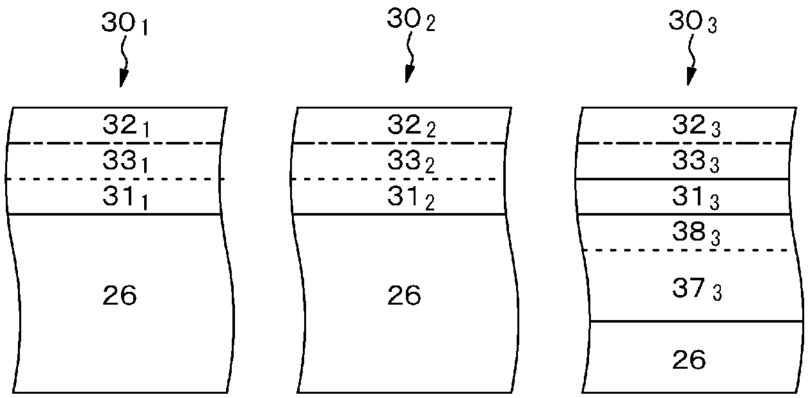
FIG. 33B is a conceptual diagram of light emitting elements having an eighth example of the resonator structure in Example 3.
Figure 33C:
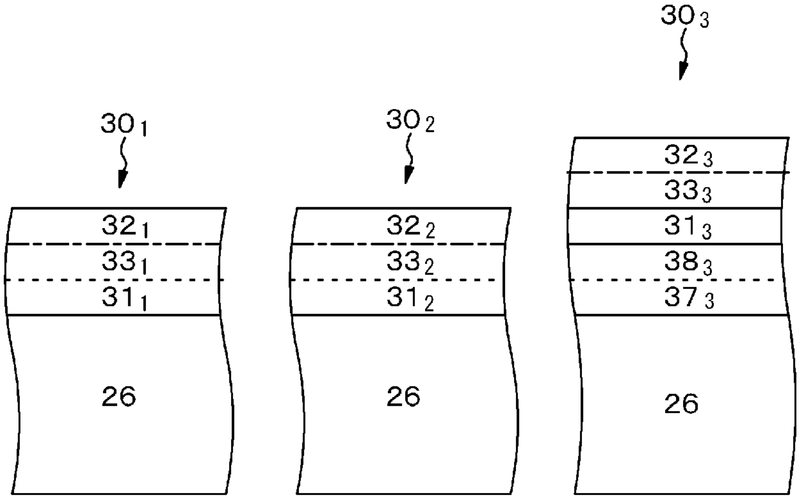
FIG. 33C is a conceptual diagram of light emitting elements having the eighth example of the resonator structure in Example 3.

FIG. 30A is a conceptual diagram of light emitting elements having a resonator structure of the first example. FIG. 30B is a conceptual diagram of light emitting elements having a resonator structure of the second example. FIG. 31A is a conceptual diagram of light emitting elements having a resonator structure of the third example. FIG. 31B is a conceptual diagram of light emitting elements having a resonator structure of the fourth example. In a part of the first to sixth examples and the eighth example, the interlayer insulating material layers 38, 38' are formed beneath the first electrode 31 of the light emitting unit 30 and the light reflection layer 37 is formed beneath the interlayer insulating material layers 38, 38'. In the first to fourth examples, the thicknesses of the interlayer insulating material layers 38, 38' are different in the light emitting units $30_1$, $30_2$, $30_3$. By appropriately setting the thicknesses of the interlayer insulating material layers $38_1$, $38_2$, $38_3$, $38_1'$, $38_2'$, $38_3'$, it is possible to set an optical distance at which optimum resonance is generated with respect to the emission wavelength of the light emitting unit 30.

In the first example, the first interface (indicated by a dotted line in the drawings) is at the same level in the light emitting units $30_1$, $30_2$, $30_3$, while the second interface (indicated by one-dot chain line in the drawings) is at different levels in the light emitting units $30_1$, $30_2$, $30_3$. In the second example, the first interface is at different levels in the light emitting units $30_1$, $30_2$, $30_3$, while the second interface is at the same level in the light emitting units $30_1$, $30_2$, $30_3$.

In the second example, the interlayer insulating material layers $38_1'$, $38_2'$, $38_3'$ are formed of an oxide film in which the surface of the light reflection layer 37 is oxidized. The interlayer insulating material layer 38' composed of an oxide film is made of, for example, aluminum oxide, tantalum oxide, titanium oxide, magnesium oxide, zirconium oxide, or the like depending on the material constituting the light reflection layer 37. The surface of the light reflection layer 37 may be oxidized by, for example, the following method. That is, immerse the first substrate 41 on which the light reflection layer 37 is formed in an electrolytic solution filled in a container. Dispose a cathode to face the light reflection layer 37. Then, anodize the light reflection layer 37 using the light reflection layer 37 as an anode. The film thickness of the oxide film formed through the anodization is proportional to the potential difference between the light reflection layer 37 as an anode and the cathode. Thus, anodization is performed in a state where voltages corresponding to the light emitting units $30_1$, $30_2$, $30_3$ are applied to the light reflection layers $37_1$, $37_2$, $37_3$, respectively. The interlayer insulating material layers $38_1'$, $38_2'$, $38_3'$ formed of oxide films having different thicknesses may be thus collectively formed on the surface of the light reflection layer 37. The thicknesses of the light reflection layers $37_1$, $37_2$, $37_3$ and the thicknesses of the interlayer insulating material layers $38_1'$, $38_2'$, $38_3'$ are different in the light emitting units $30_1$, $30_2$, $30_3$.

In the third example, an underlying film 39 is disposed beneath the light reflection layer 37, and the underlying film 39 has different thicknesses in the light emitting units $\mathbf{30}_1$, $\mathbf{30}_2$, $\mathbf{30}_3$. That is, in the illustrated example, the thickness of the underlying film 39 is increased in the order of the light emitting unit $\mathbf{30}_1$, the light emitting unit $\mathbf{30}_2$, and the light emitting unit $\mathbf{30}_3$.

In the fourth example, the thicknesses of the light reflection layers $\mathbf{37}_1$, $\mathbf{37}_2$, $\mathbf{37}_3$ at the time of film formation are different in the light emitting units $\mathbf{30}_1$, $\mathbf{30}_2$, $\mathbf{30}_3$. In the third and fourth examples, the second interface is at the same level in the light emitting units $\mathbf{30}_1$, $\mathbf{30}_2$, $\mathbf{30}_3$, while the first interface is at different levels in the light emitting units $\mathbf{30}_1$, $\mathbf{30}_2$, $\mathbf{30}_3$.

In the fifth and sixth examples, the thicknesses of the first electrodes $\mathbf{31}_1$, $\mathbf{31}_2$, $\mathbf{31}_3$ are different in the light emitting units $\mathbf{30}_1$, $\mathbf{30}_2$, $\mathbf{30}_3$. The light reflection layer 37 has the same thickness in the light emitting units 30.

In the fifth example, the first interface is at the same level in the light emitting units $\mathbf{30}_1$, $\mathbf{30}_2$, $\mathbf{30}_3$, while the second interface is at different levels in the light emitting units $\mathbf{30}_1$, $\mathbf{30}_2$, $\mathbf{30}_3$.

In the sixth example, the underlying film 39 is disposed beneath the light reflection layer 37, and the underlying film 39 has different thicknesses in the light emitting units $\mathbf{30}_1$, $\mathbf{30}_2$, $\mathbf{30}_3$. That is, in the illustrated example, the thickness of the underlying film 39 is increased in the order of the light emitting unit $\mathbf{30}_1$, the light emitting unit $\mathbf{30}_2$, and the light emitting unit $\mathbf{30}_3$. In the sixth example, the second interface is at the same level in the light emitting units $\mathbf{30}_1$, $\mathbf{30}_2$, $\mathbf{30}_3$, while the first interface is at different levels in the light emitting units $\mathbf{30}_1$, $\mathbf{30}_2$, $\mathbf{30}_3$.

In the seventh example, the first electrodes $\mathbf{31}_1$, $\mathbf{31}_2$, $\mathbf{31}_3$ also serve as light reflection layers, and the optical constant (specifically, the phase shift amount) of the material constituting the first electrodes $\mathbf{31}_1$, $\mathbf{31}_2$, $\mathbf{31}_3$ is different in the light emitting units $\mathbf{30}_1$, $\mathbf{30}_2$, $\mathbf{30}_3$. For example, the first electrode $\mathbf{31}_1$ of the light emitting unit $\mathbf{30}_1$ may be made of copper (Cu), and the first electrode $\mathbf{31}_2$ of the light emitting unit $\mathbf{30}_2$ and the first electrode $\mathbf{31}_3$ of the light emitting unit $\mathbf{30}_3$ may be made of aluminum (Al).

In the eighth example, the first electrodes $\mathbf{31}_1$, $\mathbf{31}_2$ also serve as light reflection layers, and the optical constant (specifically, the phase shift amount) of the material constituting the first electrodes $\mathbf{31}_1$, $\mathbf{31}_2$ is different in the light emitting units $\mathbf{30}_1$, $\mathbf{30}_2$. For example, the first electrode $\mathbf{31}_1$ of the light emitting unit $\mathbf{30}_1$ may be made of copper (Cu), and the first electrode $\mathbf{31}_2$ of the light emitting unit $\mathbf{30}_2$ and the first electrode $\mathbf{31}_3$ of the light emitting unit $\mathbf{30}_3$ may be made of aluminum (Al). In the eighth example, for example, the seventh example is applied to the light emitting units $\mathbf{30}_1$, $\mathbf{30}_2$, and the first example is applied to the light emitting unit $\mathbf{30}_3$. The thicknesses of the first electrodes $\mathbf{31}_1$, $\mathbf{31}_2$, $\mathbf{31}_3$ may be different or the same.

Example 4

Figure 34:
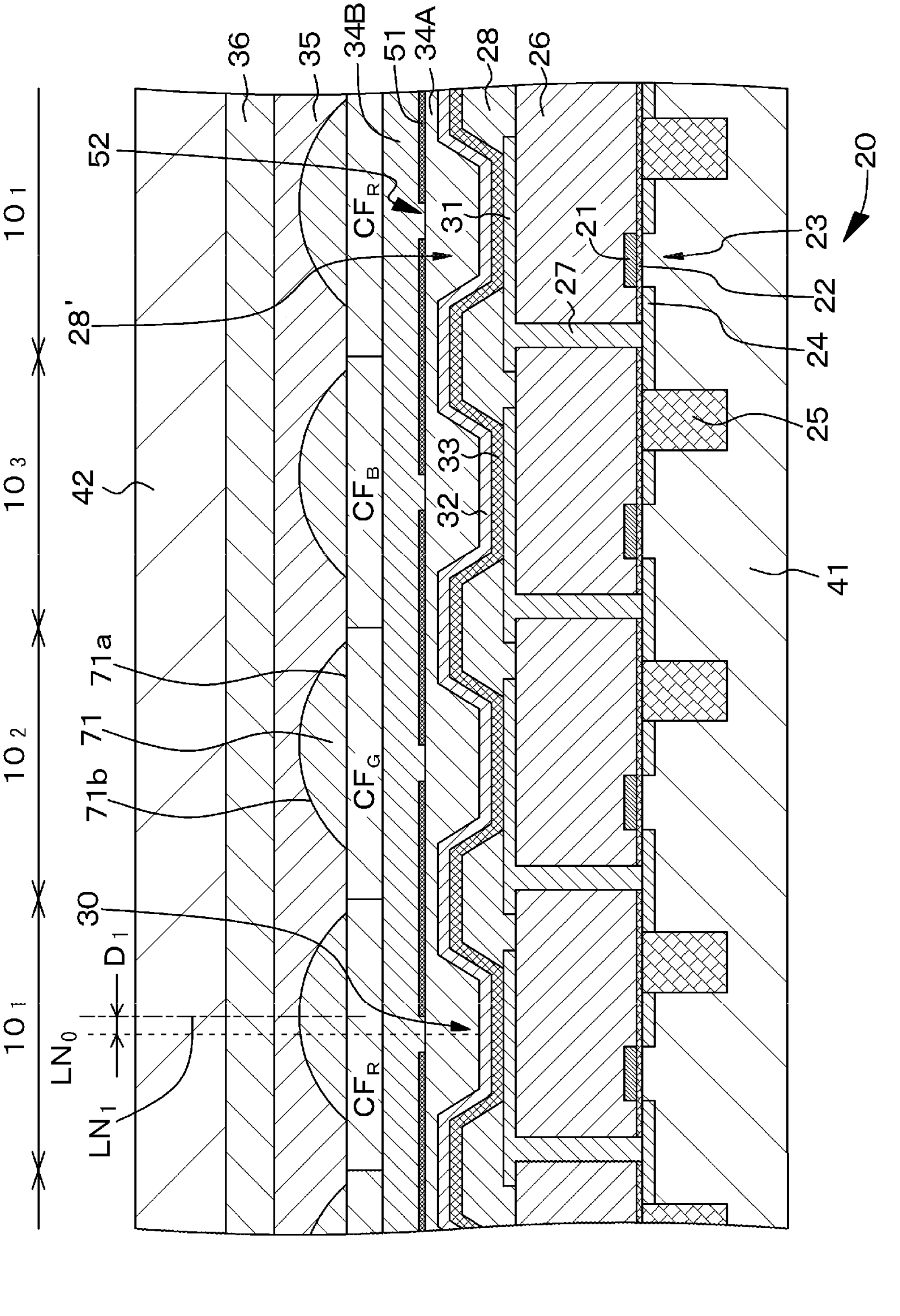
FIG. 34 is a schematic and partial sectional view of a light emitting element and a display apparatus of Example 4.

Example 4 is a modification of Examples 1 to 3. In Example 4, a relationship between the normal line $LN_0$ passing through the center of the light emitting region and the normal line $LN_1$ passing through the centers of the optical path control units 71, 72, the relationship depending on which region of the display panel unit the light emitting element is positioned, and a modification thereof will be described. FIG. 34 is a schematic and partial sectional view of a light emitting element and a display apparatus of Example 4.

In the following description, $D_0$, $D_1$, $D_2$, and $d_0$ are as follows.

$D_0$: Distance from a reference point (reference region) P to the normal line $LN_0$ passing through the center of the light emitting region $D_1$: Distance (offset amount) between the normal line $LN_0$ passing through the center of the light emitting region and the normal line $LN_1$ passing through the centers of the optical path control units 71, 72

$D_2$: Distance (offset amount) between the normal line $LN_0$ passing through the center of the light emitting region and a normal line passing through the center of the opening 52 provided in the light reflection film 51

$d_0$: Distance (offset amount) between the normal line $LN_0$ passing through the center of the light emitting region and the normal line $LN_2$ passing through the center of the wavelength selection unit CF In the light emitting elements 10 of Example 4, in at least some of the light emitting elements constituting the display apparatus, the values of the distances (offset amounts) $D_1$, $D_2$ are not 0. In the display apparatus, the reference point (reference region) P is assumed, and the distances $D_1$, $D_2$ depend on the distance $D_0$ from the reference point (reference region) P to the normal line $LN_0$ passing through the center of the light emitting region. The reference point (reference region) may include a certain extent of spread.

With such a form, the light emitted from each light emitting element may be focused (collected) to a certain region of the space outside the display apparatus, the light emitted from each light emitting element may diverge in the space outside the display apparatus, or the light emitted from each light emitting element may be parallel light.

Whether the light (image) emitted from the entire display apparatus is a focusing system or a diverging system depends on the specification of the display apparatus, and also depends on how much viewing angle dependency and wide viewing angle properties are required for the display apparatus.

The distances $D_1$, $D_2$ may be changed in the subpixels constituting one pixel. That is, the distances $D_1$, $D_2$ may be changed in the plurality of light emitting elements constituting one pixel. For example, when one pixel is composed of three subpixels, the values of $D_1$, $D_2$ may be the same value in the three subpixels constituting one pixel, may be the same value in two subpixels except for one subpixel, or may be different values in the three subpixels.

Figure 35:
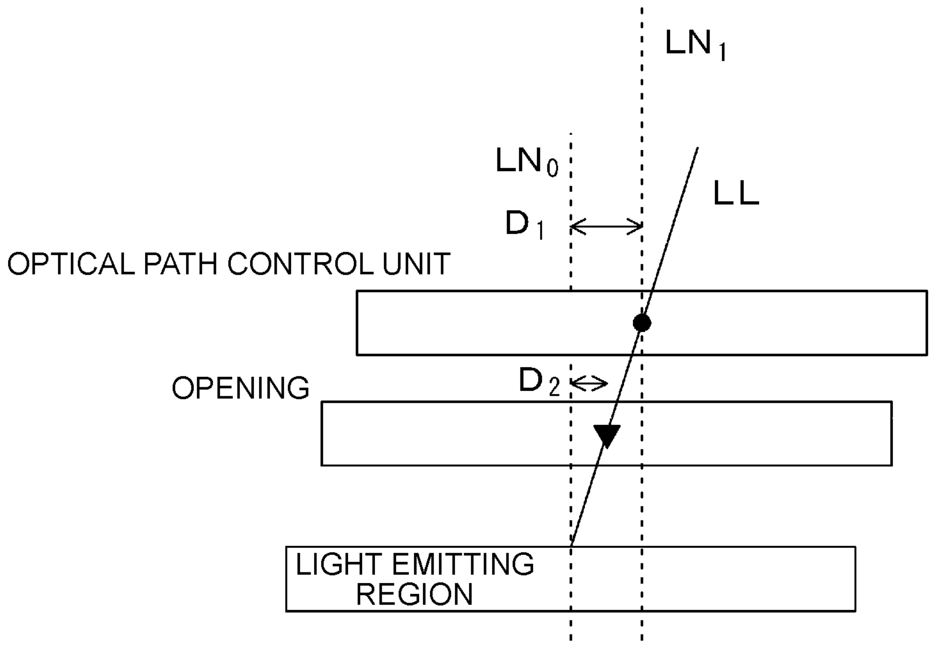
FIG. 35 is a conceptual diagram for explaining a relationship between a normal line $LN_0$ passing through the center of a light emitting region and a normal line $LN_1$ passing through the center of an optical path control unit in the display apparatus of Example 4.

As illustrated in the conceptual diagram in FIG. 35, in the display apparatus of Example 4, as described above, the values of the distances (offset amounts) $D_1$, $D_2$ are not 0 in at least some of the light emitting elements 10 constituting the display apparatus. The straight line LL is a straight line connecting the center of the light emitting region and the centers of the optical path control units 71, 72. The opening 52 provided in the light reflection film 51 is positioned on the straight line LL. In the drawing, the center of the opening 52 provided in the light reflection film 51 is indicated by a downward black triangle. The distance (offset amount) $D_2$ between the normal line $LN_0$ passing through the center of the light emitting region and the normal line passing through the center of the opening 52 provided in the light reflection film 51 depends on the value of the distance (offset amount) $D_1$.

The display apparatus may have a form in which the reference point (reference region) P is assumed, and the distances $D_1$, $D_2$ depend on the distance $D_0$ from the reference point (reference region) P to the normal line $LN_0$ passing through the center of the light emitting region. The reference point (reference region) may include a certain extent of spread. Here, the various normal lines are vertical lines with respect to the first substrate.

The image display area (display panel unit) of the display apparatus of Example 4 including the above preferable forms may have a configuration in which the reference point P is assumed in the display panel unit. In this case, a configuration may be taken in which the reference point P is not positioned in (not included in) the central region of the display panel unit or in which the reference point P is positioned in the central region of the display panel unit. Further, in these cases, one reference point P may be assumed, or a plurality of reference points P may be assumed. In these cases, a configuration may be taken in which the values of the distances $D_1$, $D_2$ are 0 in some light emitting elements, and the value of the distances $D_1$, $D_2$ are not 0 in the remaining light emitting elements.

When one reference point P is assumed in the display apparatus of Example 4 including the above preferable forms, a configuration may be taken in which the reference point P is not included in the central region of the display panel unit, or a configuration may be taken in which the reference point P is included in the central region of the display panel unit. When a plurality of reference points P are assumed, a configuration may be taken in which at least one reference point P is not included in the central region of the display panel unit.

Alternatively, the reference point P may be assumed to be outside the display panel unit. In this case, one reference point P may be assumed, or a plurality of reference points P may be assumed. In these cases, a configuration may be taken in which the values of the distances $D_1$, $D_2$ are not 0 in any of the light emitting elements.

Further, in the display apparatus of Example 4, the value of the distances (offset amounts) $D_1$, $D_2$ may be different depending on the position occupied by the light emitting element in the display panel unit. Specifically, a form may be taken in which the reference point P is set, and the plurality of light emitting elements are arrayed in a first direction and a second direction different from the first direction (for example, a direction orthogonal to the first direction, the same applies hereinafter), when a distance from the reference point P to the normal line $LN_0$ passing through the center of a light emitting region is $D_0$, values of the distance $D_1$ in the first direction and the second direction are $D_{0\text{-}X}$ and $D_{0\text{-}Y}$, respectively, and values of the distance $D_0$ in the first direction and the second direction are $D_{1\text{-}X}$ and $D_{1\text{-}Y}$, respectively, $D_{0\text{-}X}$ changes linearly with respect to a change of $D_{1\text{-}X}$, and $D_{0\text{-}Y}$ changes linearly with respect to a change of $D_{1\text{-}Y}$, or $D_{0\text{-}X}$ changes linearly with respect to a change of $D_{1\text{-}X}$, and $D_{0\text{-}Y}$ changes nonlinearly with respect to a change of $D_{1\text{-}Y}$, or $D_{0\text{-}X}$ changes nonlinearly with respect to a change of $D_{1\text{-}X}$, and $D_{0\text{-}Y}$ changes linearly with respect to a change of $D_{1\text{-}Y}$, or $D_{0\text{-}X}$ changes nonlinearly with respect to a change of $D_{1\text{-}X}$, and $D_{0\text{-}Y}$ changes nonlinearly with respect to a change of $D_{1\text{-}Y}$.

The value of the distance $D_0$ may increase as the values of the distances $D_1$, $D_2$ increase. That is, in the display apparatus of Example 4, a form may be taken in which the reference point P is set, and when a distance from the reference point P to the normal line $LN_0$ passing through the center of a light emitting region is $D_0$, values of the distances $D_1$, $D_2$ increase as a value of the distance $D_0$ increases.

Here, the fact that $D_{0\text{-}X}$ changes linearly with respect to a change of $D_{1\text{-}X}$, and $D_{0\text{-}Y}$ changes linearly with respect to a change of $D_{1\text{-}Y}$ means that $$D_{0-X} = k_X \cdot D_{1-X}$$

$$D_{0-Y} = k_Y \cdot D_{1-Y}$$

are formed. Here, $k_X$ and $k_Y$ are constants. That is, $D_{0\text{-}X}$ and $D_{0\text{-}Y}$ change based on a linear function. On the other hand, the fact that $D_{0\text{-}X}$ changes nonlinearly with respect to a change of $D_{1\text{-}X}$, and $D_{0\text{-}Y}$ changes linearly with respect to a change of $D_{1\text{-}Y}$ means that $$D_{0-X} = f_X(D_{1-X})$$

$$D_{0-Y} = f_Y(D_{1-Y})$$

are formed. Here, $f_X$, $f_Y$ are functions that are not linear functions (for example, quadratic functions).

The change of $D_{0\text{-}X}$ with respect to a change of $D_{1\text{-}X}$ and the change of $D_{0\text{-}Y}$ with respect to a change of $D_{1\text{-}Y}$ may also be stepwise changes. In this case, when the stepwise change is viewed as a whole, the change may be a linear change, or the change may be a non-linear change. Further, when the display panel unit is divided into M×N regions, the change of $D_{0\text{-}X}$ with respect to a change of $D_{1\text{-}X}$ and the change of $D_{0\text{-}Y}$ with respect to a change of $D_{1\text{-}Y}$ may be unchanged or constant in one region. The number of light emitting elements in one region may be, but is not limited to, 10×10.

FIGS. 36A, 36B, 37A, and 37B are schematic diagrams each illustrating a positional relationship between a light emitting element and the reference point in the display apparatus of Example 4, and FIGS. 38A, 38B, 38C, 38D, 39A, 39B, 39C, 39D, 40A, 40B, 40C, 40D, 41A, 41B, 41C, and 41D are schematic diagrams each illustrating a change in $D_{0\text{-}X}$ with respect to a change in $D_{1\text{-}X}$ and a change in $D_{0\text{-}Y}$ with respect to a change in $D_{1\text{-}Y}$.

Figure 36A:
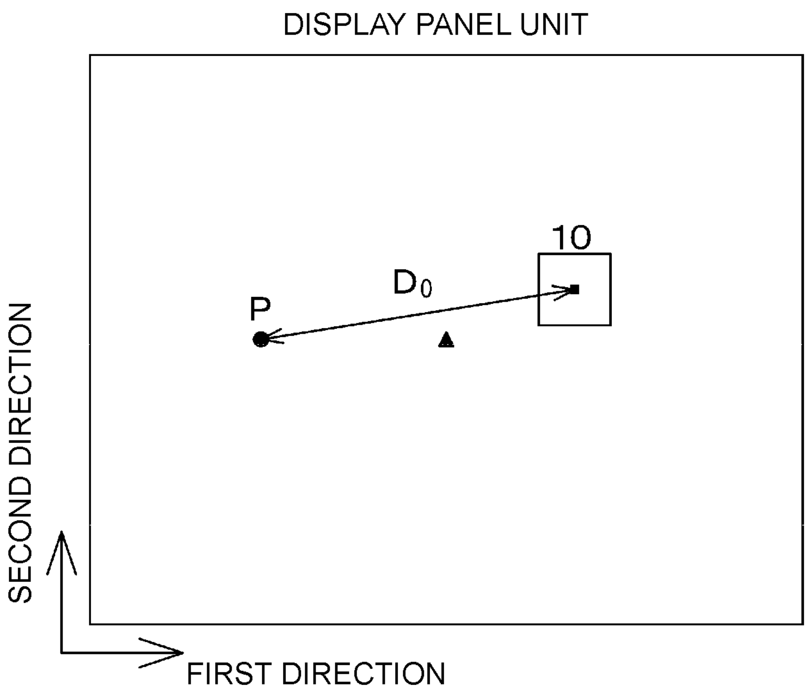
FIG. 36A is a schematic view illustrating a positional relationship between a light emitting element and a reference point in the display apparatus of Example 4.
Figure 36B:
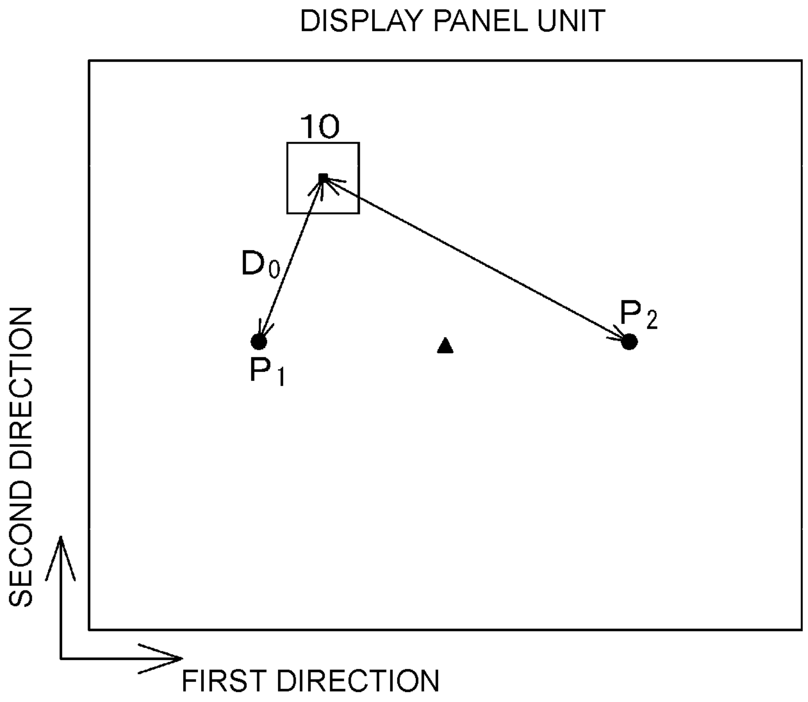
FIG. 36B is a schematic view illustrating a positional relationship between a light emitting element and a reference point in the display apparatus of Example 4.

In the display apparatus of Example 4 in the conceptual diagrams of FIGS. 36A and 36B, the reference point P is assumed in the display apparatus. That is, an orthographic projection image of the reference point P is included in the image display region (display panel unit) of the display apparatus, but the reference point P is not positioned in the central region of the display apparatus (image display region of the display apparatus, display panel unit). In FIGS. 36A, 36B, 37A, and 37B, the central region of the display panel unit is indicated by an upward black triangle, the light emitting element is indicated by a white square, and the center of the light emitting region is indicated by a black square. Then, one reference point P is assumed. The positional relationship between the light emitting element 10 and the reference point P is schematically illustrated in FIGS. 36A and 36B, in which the reference point P is indicated by a black circle. One reference point P is assumed in FIG. 36A, and a plurality of reference points P (two reference points P1, P2 are illustrated in FIG. 36B) are assumed in FIG. 36B. Since the reference point P may include a certain extent of spread, the values of the distances D1, D2 are 0 in some light emitting elements (specifically, one or a plurality of light emitting elements included in the orthographic projection image of the reference point P), and the values of the distances D1, D2 are not 0 in the remaining light emitting elements. The values of the distances (offset amounts) D1, D2 vary depending on the position occupied by the light emitting element in the display panel unit.

In the display apparatus of Example 4, light emitted from each light emitting element 10 is focused (collected) to a certain region in a space outside the display apparatus. Alternatively, light emitted from each light emitting element 10 diverges in a space outside the display apparatus. Alternatively, light emitted from each light emitting element 10 is parallel light. Whether the light emitted from the display apparatus is focused light, divergent light, or parallel light is based on the specifications required for the display apparatus. The power or the like of the optical path control units 71, 72 may be designed based on these specifications. When light emitted from each light emitting element is focused light, the position of the space in which the image emitted from the display apparatus is formed may be on the normal line of the reference point P or is not on the normal line of the reference point P in some cases, which depends on the specifications required for the display apparatus. A light emitting element through which the image emitted from the display apparatus passes may be disposed to control the display dimension, the display position, and the like of the image emitted from the display apparatus. The type of light emitting element to be disposed depends on the specifications required for the display apparatus, and a lens system, such as an imaging lens system, may be given as an example.

In the display apparatus of Example 4, the reference point P is set, and the plurality of light emitting elements 10 are arrayed in the first direction and the second direction different from the first direction. When the distance from the reference point P to the normal line $LN_0$ passing through the center of the light emitting region is $D_0$, values of the distance $D_1$ in the first direction and the second direction are $D_{0\text{-}X}$ and $D_{0\text{-}Y}$, respectively, and values of the distance $D_0$ in the first direction and the second direction are $D_{1\text{-}X}$ and $D_{1\text{-}Y}$, respectively, the display apparatus may have

[A] a design in which $D_{0\text{-}X}$ changes linearly with respect to a change of $D_{1\text{-}X}$, and $D_{0\text{-}Y}$ changes linearly with respect to a change of $D_{1\text{-}Y}$,

[B] a design in which $D_{0\text{-}X}$ changes linearly with respect to a change of $D_{1\text{-}X}$, and $D_{0\text{-}Y}$ changes nonlinearly with respect to a change of $D_{1\text{-}Y}$,

[C] a design in which $D_{0\text{-}X}$ changes nonlinearly with respect to a change of $D_{1\text{-}X}$, and $D_{0\text{-}Y}$ changes linearly with respect to a change of $D_{1\text{-}Y}$, or

[D] a design in which $D_{0\text{-}X}$ changes nonlinearly with respect to a change of $D_{1\text{-}X}$, and $D_{0\text{-}Y}$ changes nonlinearly with respect to a change of $D_{1\text{-}Y}$.

FIGS. 38A, 38B, 38C, 38D, 39A, 39B, 39C, 39D, 40A, 40B, 40C, 40D, 41A, 41B, 41C, and 41D schematically illustrate a change of $D_{0\text{-}X}$ with respect to a change of $D_{1\text{-}X}$ and a change of $D_{0\text{-}Y}$ with respect to a change of $D_{1\text{-}Y}$. In these drawings, outlined arrows indicate linear changes and black arrows indicate non-linear changes. When the arrows are directed to the outside of the display panel unit, it indicates that light passing through the optical path control units 71, 72 is divergent light, and when the arrows are directed to the inside of the display panel unit, it indicates that light passing through the optical path control units 71, 72 is focused light or parallel light.

Alternatively, when the reference point P is set and the distance from the reference point P to the normal line $LN_0$ passing through the center of the light emitting region is $D_0$, the values of the distances $D_1$, $D_2$ may be designed to increase as the value of the distance $D_0$ increases.

That is, the changes of $D_{0\text{-}X}$, $D_{0\text{-}Y}$ depending on the changes of $D_{1\text{-}X}$, $D_{1\text{-}Y}$ may be determined based on the specifications required for the display apparatus.

Figure 42:
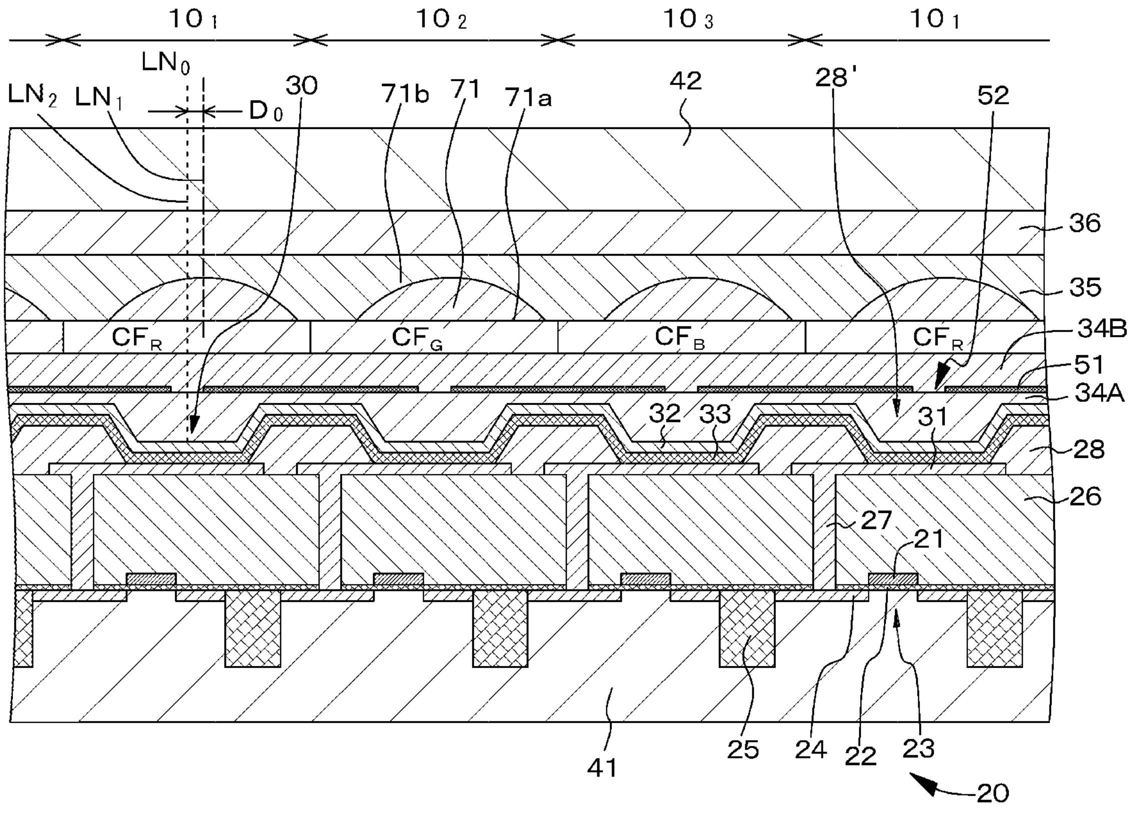
FIG. 42 is a schematic and partial sectional view of a light emitting element and a display apparatus of Example 5.

The orthogonal projection images of the optical path control units 71, 72 are included in the orthogonal projection images of the wavelength selection units $CF_R$, $CF_G$, $CF_B$. The outer shapes of the light emitting unit 30, the wavelength selection unit CF, and the optical path control units 71, 72 are circular for the sake of convenience, but they are not limited to such shapes. Further, in the light emitting element 10 in which the values of the distances $D_1$, $D_2$ are not 0, the normal line $LN_2$ passing through the centers of the wavelength selection units $CF_R$, $CF_G$, $CF_B$ matches the normal line $LN_0$ passing through the center of the light emitting region, as illustrated in FIG. 42, for example.

The display apparatus of Example 4, in which the values of the distances $D_1$, $D_2$ are not 0 in at least some of the light emitting elements constituting the display apparatus, can reliably and accurately control the traveling direction of light emitted from the organic layer and passing through the optical path control units 71, 72 depending on the position of the light emitting element in the display apparatus. That is, it is possible to reliably and accurately control where in the external space to emit an image from the display apparatus and in what state. In addition, by providing the optical path control units 71, 72, not only an increase in brightness (luminance) of an image emitted from the display apparatus and prevention of color mixture between adjacent pixels can be achieved, but also light can be appropriately diverged according to a required viewing angle, and it is possible to realize a long life and high luminance of the light emitting element and the display apparatus. Thus, it is possible to achieve downsizing, weight reduction, and high quality of the display apparatus. In addition, the light emitting element can be applied to a remarkably expanded range of eyewear, augmented reality (AR) glasses, and EVR.

Figure 37A:
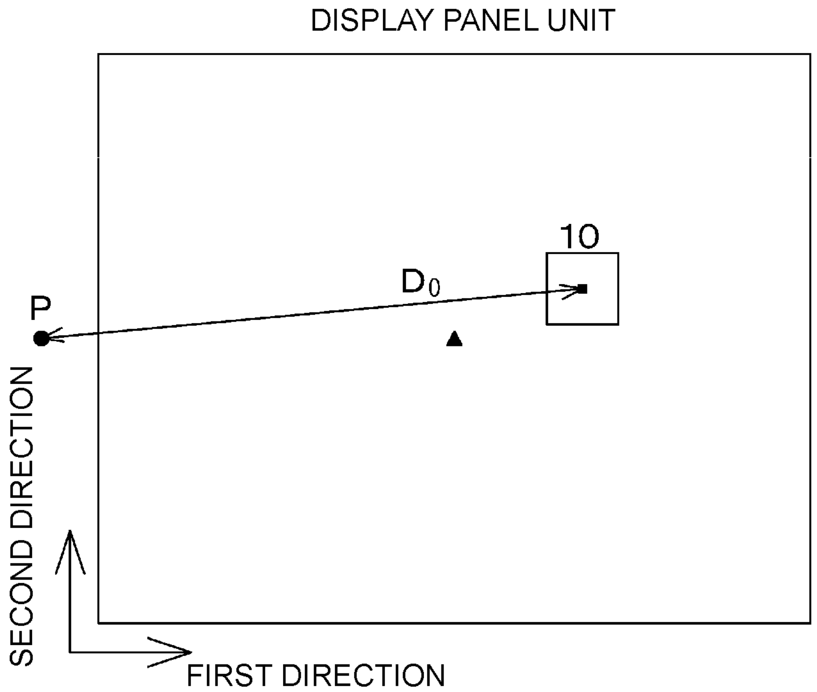
FIG. 37A is a diagram schematically illustrating a positional relationship between a light emitting element and a reference point in a modification of the display apparatus of Example 4.
Figure 37B:
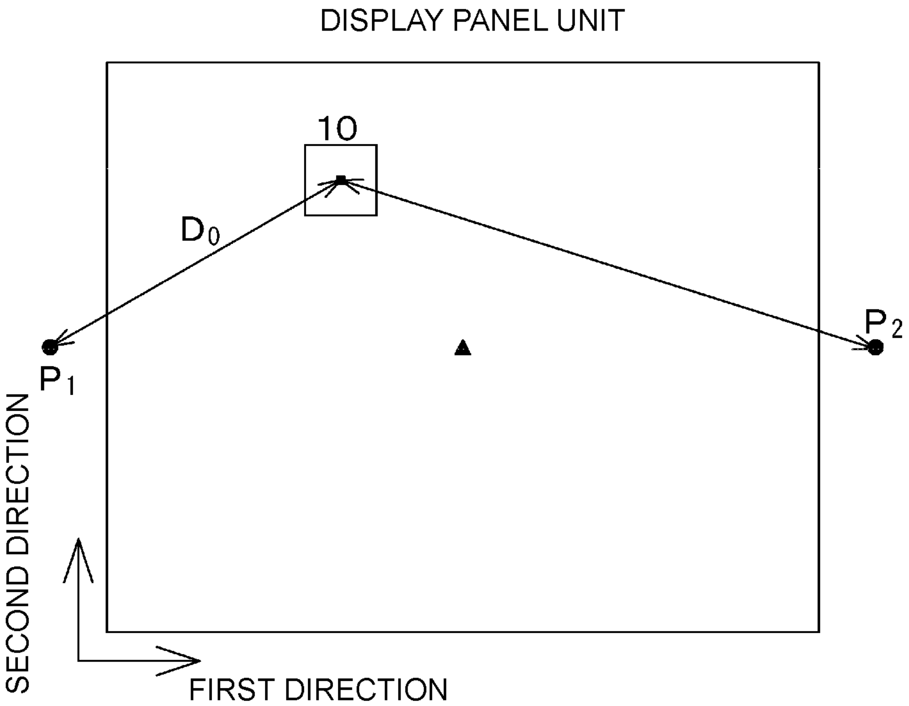
FIG. 37B is a diagram schematically illustrating a positional relationship between a light emitting element and a reference point in a modification of the display apparatus of Example 4.
Figure 38A:
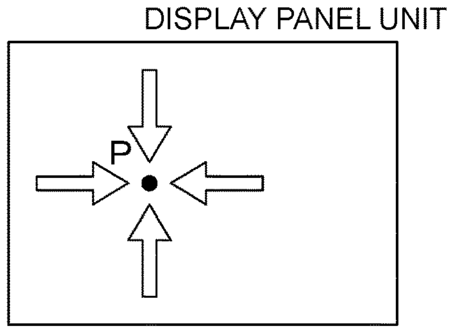
FIG. 38A is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 38B:
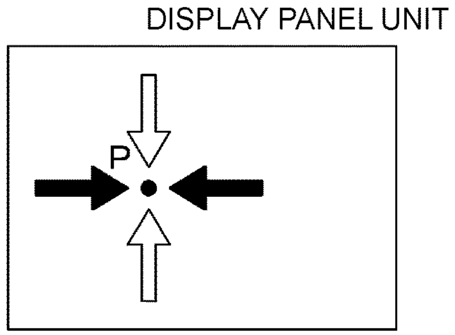
FIG. 38B is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 38C:
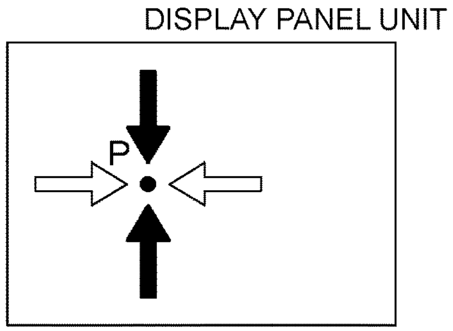
FIG. 38C is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 38D:
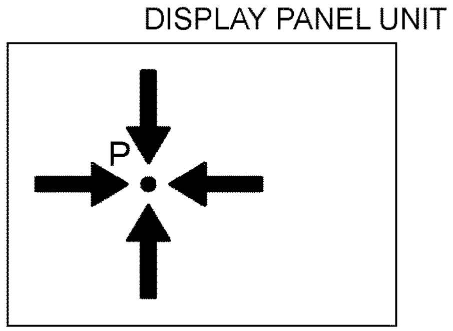
FIG. 38D is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 39A:
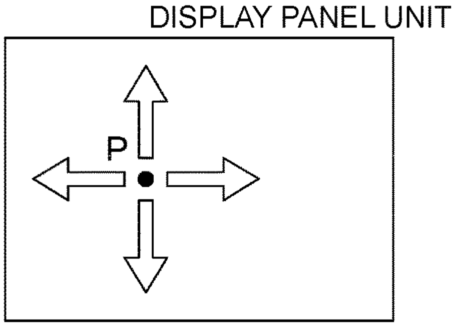
FIG. 39A is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 39B:
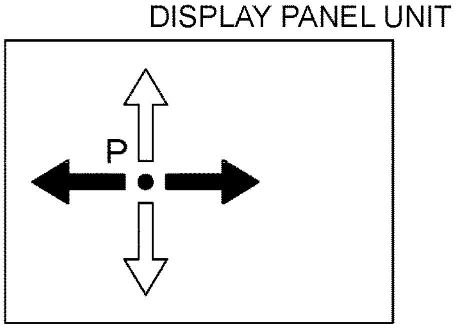
FIG. 39B is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 39C:
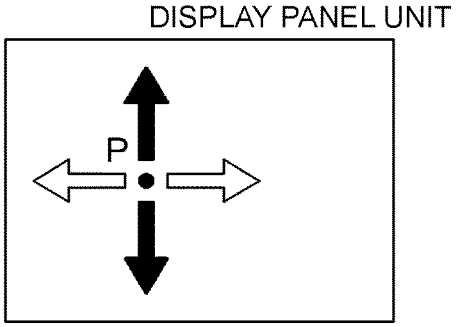
FIG. 39C is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 39D:
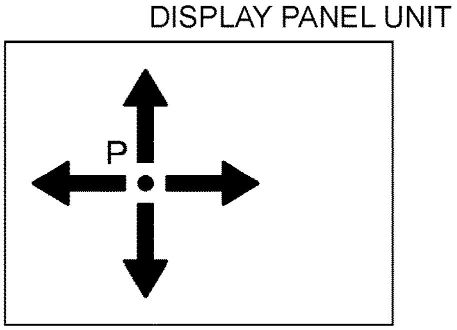
FIG. 39D is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 40A:
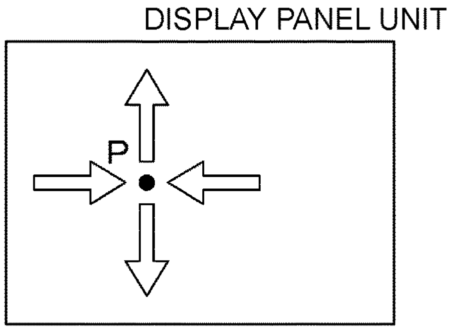
FIG. 40A is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 40B:
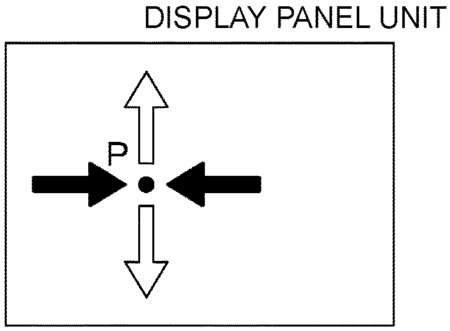
FIG. 40B is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 40C:
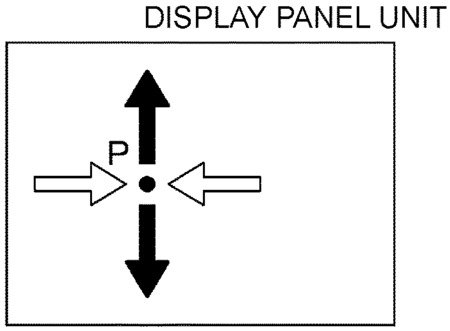
FIG. 40C is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 40D:
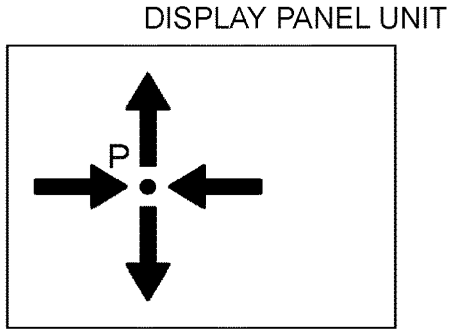
FIG. 40D is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 41A:
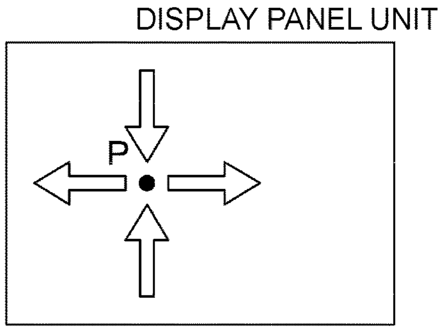
FIG. 41A is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 41B:
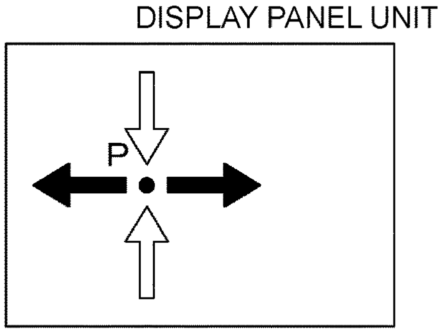
FIG. 41B is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 41C:
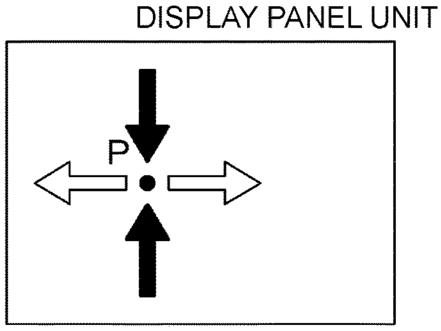
FIG. 41C is a diagram schematically illustrating a change of $D_{0-X}$ with respect to a change of $D_{1-X}$ and a change of $D_{0-Y}$ with respect to a change of $D_{1-Y}$ in the display apparatus of Example 4.
Figure 41D:
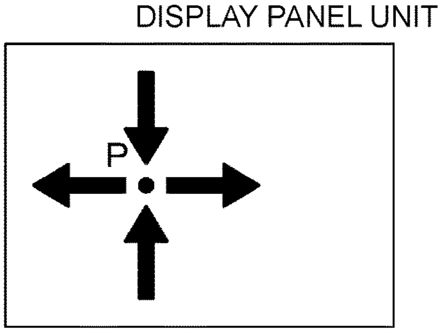
FIG. 41D is a diagram schematically illustrating a change of $D_{0-X}$ with respect to a change of $D_{1-X}$ and a change of $D_{0-Y}$ with respect to a change of $D_{1-Y}$ in the display apparatus of Example 4.

Alternatively, in a modification of the display apparatus of Example 4, the reference point P is assumed to be outside the display panel unit. FIGS. 37A and 37B schematically illustrate the positional relationship between the light emitting element 10 and the reference points P, $P_1$, $P_2$. One reference point P may be assumed (see FIG. 37A), or a plurality of reference points P (two reference points $P_1$, $P_2$ are illustrated in FIG. 37B) may be assumed. With the center of the display panel unit as a symmetry point, the two reference points $P_1$, $P_2$ are disposed in two-fold rotationally symmetric positions. Here, at least one reference point P is not included in the central region of the display panel unit. In the illustrated example, two reference points $P_1$, $P_2$ are not included in the central region of the display panel unit. The values of the distances $D_1$, $D_2$ are 0 in some light emitting elements (specifically, one or a plurality of light emitting elements included in the reference point P), and the values of the distances $D_1$, $D_2$ are not 0 in the remaining light emitting elements. For the distance $D_0$ from the reference point P to the normal line $LN_0$ passing through the center of the light emitting region, the distance from the normal line $LN_0$ passing through the center of a certain light emitting region to a closer reference point P is defined as the distance $D_0$. Alternatively, the values of the distances $D_1$, $D_2$ are not 0 in any of the light emitting elements. For the distance $D_0$ from the reference point P to the normal line $LN_0$ passing through the center of the light emitting region, the distance from the normal line $LN_0$ passing through the center of a certain light emitting region to a closer reference point P is defined as the distance $D_0$. In these cases, light emitted from the light emitting unit 30 constituting each light emitting element 10 and passing through the optical path control units 71, 72 is focused (collected) in a certain region of the space outside the display apparatus. Alternatively, light emitted from the light emitting unit 30 constituting each light emitting element 10 and passing through the optical path control units 71, 72 diverges in the space outside the display apparatus.

Example 5

Example 5 is a modification of Examples 1 to 4. In Example 5, a relationship between the normal line $LN_0$ passing through the center of the light emitting region, the normal line $LN_1$ passing through the centers of the optical path control units 71, 72, and the normal line $LN_2$ passing through the center of the wavelength selection unit (color filter layer) CF, and a modification thereof will be described. FIG. 42 is a schematic and partial sectional view of a light emitting element and a display apparatus of Example 5.

In Example 5, a positional relationship of the light emitting region, the wavelength selection unit CF, and the optical path control units 71 and 72 will be described. Here, in a light emitting element in which the values of the distances $D_1$, $D_2$ are not 0, (a) a form in which the normal line $LN_2$ passing through the center of the wavelength selection unit CF matches the normal line $LN_0$ passing through the center of the light emitting region, (b) a form in which the normal line $LN_2$ passing through the center of the wavelength selection unit CF matches the normal line $LN_1$ passing through the centers of the optical path control units 71, 72, or (c) a form in which the normal line $LN_2$ passing through the center of the wavelength selection unit CF does not match the normal line $LN_0$ passing through the center of the light emitting region, and the normal line $LN_2$ passing through the center of the wavelength selection unit CF does not match the normal line $LN_1$ passing through the centers of the optical path control units 71, 72 may be taken. Adopting (b) or (c) the latter configuration can reliably reduce occurrence of color mixture between adjacent light emitting elements.

Figure 43A:
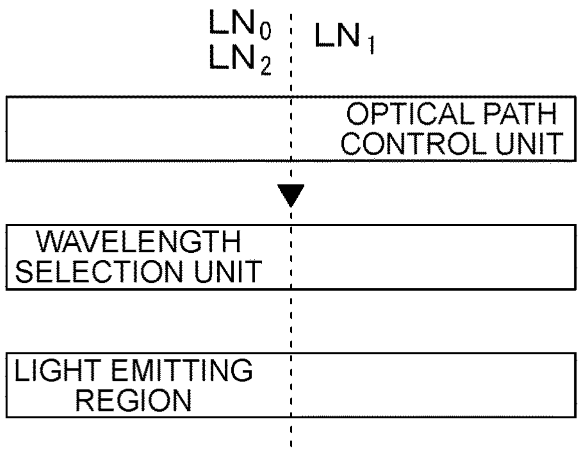
FIG. 43A is a conceptual diagram for explaining a relationship between the normal line $LN_0$ passing through the center of a light emitting region, the normal line $LN_1$ passing through the center of an optical path control unit, and a normal line $LN_2$ passing through the center of a wavelength selection unit in the display apparatus of Example 5.

As illustrated in the conceptual diagram of FIG. 43A, the normal line $LN_0$ passing through the center of the light emitting region, the normal line $LN_2$ passing through the center of the wavelength selection unit CF, and the normal line $LN_1$ passing through the centers of the optical path control units 71, 72 may match each other. That is, $D_1=D_2=d_0=0$. As described above, $d_0$ is the distance (offset amount) between the normal line $LN_0$ passing through the center of the light emitting region and the normal line $LN_2$ passing through the center of the wavelength selection unit CF. The center of the opening 52 provided in the light reflection film 51 is indicated by a downward black triangle.

For example, when one pixel is composed of three subpixels, the values of $d_0$, $D_1$, $D_2$ may be the same value in the three subpixels constituting one pixel, may be the same value in two subpixels except for one subpixel, or may be different values in the three subpixels.

Figure 43B:
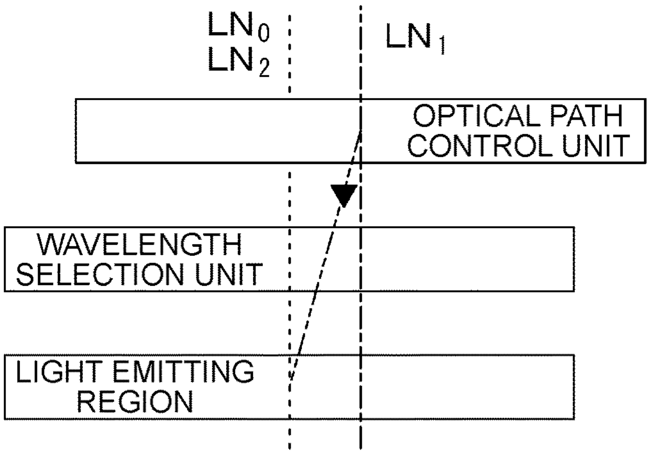
FIG. 43B is a conceptual diagram for explaining a relationship between the normal line $LN_0$ passing through the center of the light emitting region, the normal line $LN_1$ passing through the center of the optical path control unit, and the normal line $LN_2$ passing through the center of the wavelength selection unit in the display apparatus of Example 5.

As illustrated in the conceptual diagram of FIG. 43B, the normal line $LN_0$ passing through the center of the light emitting region matches the normal line $LN_2$ passing through the center of the wavelength selection unit CF, but the normal line $LN_0$ passing through the center of the light emitting region and the normal line $LN_2$ passing through the center of the wavelength selection unit CF do not match the normal line $LN_1$ passing through the centers of the optical path control units 71, 72 in some cases. That is, $D_1 \neq d_0=0$.

Figure 43C:
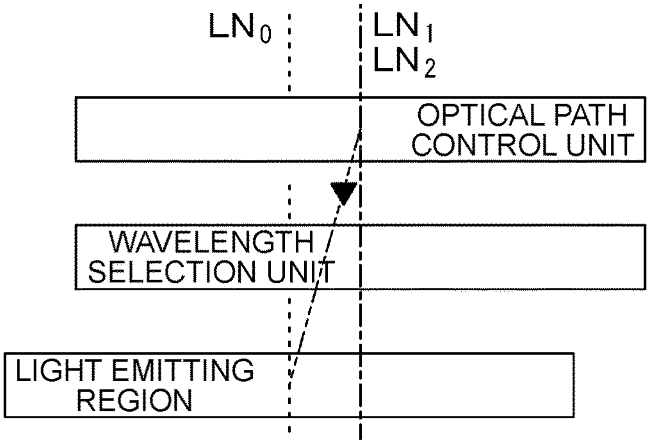
FIG. 43C is a conceptual diagram for explaining a relationship between the normal line $LN_0$ passing through the center of the light emitting region, the normal line $LN_1$ passing through the center of the optical path control unit, and the normal line $LN_2$ passing through the center of the wavelength selection unit in the display apparatus of Example 5.

Further, as illustrated in the conceptual diagram of FIG. 43C, the normal line $LN_0$ passing through the center of the light emitting region does not match the normal line $LN_2$ passing through the center of the wavelength selection unit CF or the normal line $LN_1$ passing through the centers of the optical path control units 71, 72, and the normal line $LN_2$ passing through the center of the wavelength selection unit CF matches the normal line $LN_1$ passing through the centers of the optical path control units 71, 72 in some cases. That is, $D_1=d_0>0$.

Figure 44:
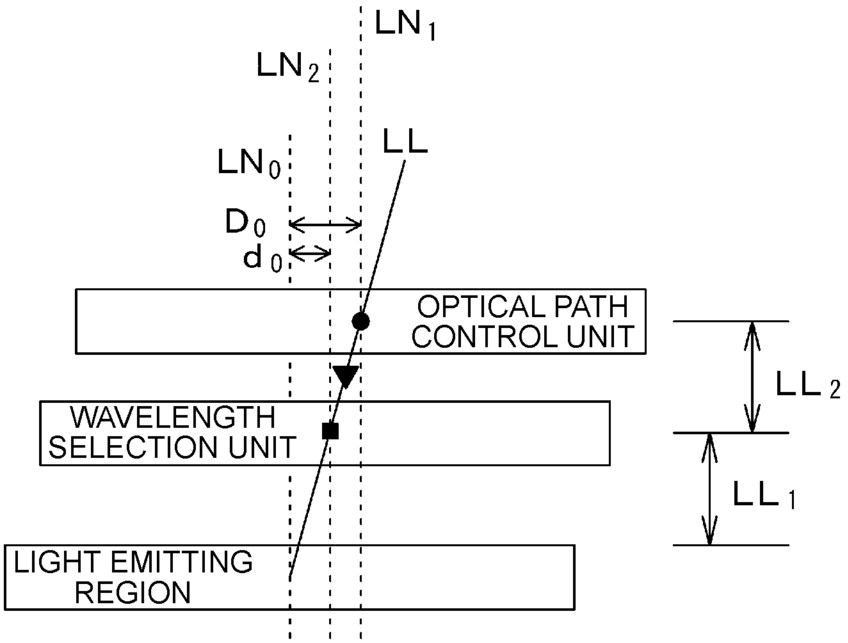
FIG. 44 is a conceptual diagram for explaining a relationship between the normal line $LN_0$ passing through the center of the light emitting region, the normal line $LN_1$ passing through the center of the optical path control unit, and the normal line $LN_2$ passing through the center of the wavelength selection unit in the display apparatus of Example 5.

Further, as illustrated in the conceptual diagram of FIG. 44, the normal line $LN_0$ passing through the center of the light emitting region does not match the normal line $LN_2$ passing through the center of the wavelength selection unit CF or the normal line $LN_1$ passing through the centers of the optical path control units 71, 72, and the normal line $LN_1$ passing through the centers of the optical path control units 71, 72 does not match the normal line $LN_0$ passing through the center of the light emitting region or the normal line $LN_2$ passing through the center of the wavelength selection unit CF in some cases. Here, the center (indicated by a black square in FIG. 44) of the wavelength selection unit CF is preferably positioned on the straight line LL connecting the center of the light emitting region and the center (indicated by a black circle in FIG. 44) of the optical path control units 71, 72. Specifically, when the distance in the thickness direction from the center of the light emitting region to the center of the wavelength selection unit CF is $LL_1$, and the distance in the thickness direction from the center of the wavelength selection unit CF to the centers of the optical path control units 71, 72 is $LL_2$, $$D_1 > d_0 > 0$$

is satisfied, and considering variations in production, $$d_0 : D_1 = LL_1 : (LL_1 + LL_2)$$

is preferably satisfied.

Figure 45A:
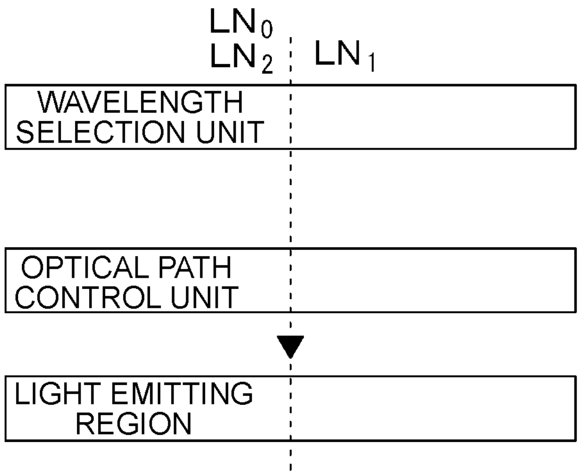
FIG. 45A is a conceptual diagram for explaining a relationship between the normal line $LN_0$ passing through the center of the light emitting region, the normal line $LN_1$ passing through the center of the optical path control unit, and the normal line $LN_2$ passing through the center of the wavelength selection unit in the display apparatus of Example 5.

Alternatively, as illustrated in the conceptual diagram of FIG. 45A, the normal line $LN_0$ passing through the center of the light emitting region, the normal line $LN_2$ passing through the center of the wavelength selection unit CF, and the normal line $LN_1$ passing through the centers of the optical path control units 71, 72 match each other in some cases. That is, $D_1=d_0=0$.

Figure 45B:
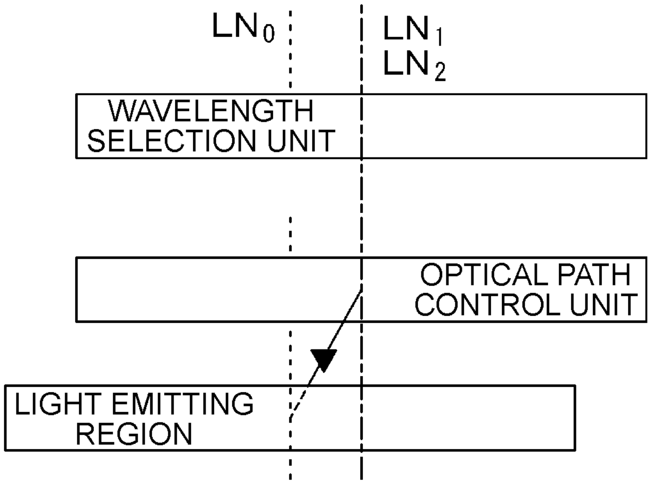
FIG. 45B is a conceptual diagram for explaining a relationship between the normal line $LN_0$ passing through the center of the light emitting region, the normal line $LN_1$ passing through the center of the optical path control unit, and the normal line $LN_2$ passing through the center of the wavelength selection unit in the display apparatus of Example 5.

As illustrated in the conceptual diagram of FIG. 45B, the normal line $LN_0$ passing through the center of the light emitting region does not match the normal line $LN_2$ passing through the center of the wavelength selection unit CF or the normal line $LN_1$ passing through the centers of the optical path control units 71, 72, and the normal line $LN_2$ passing through the center of the wavelength selection unit CF and the normal line $LN_1$ passing through the centers of the optical path control units 71, 72 match each other in some cases. That is, $D_1=d_0>0$.

Figure 46:
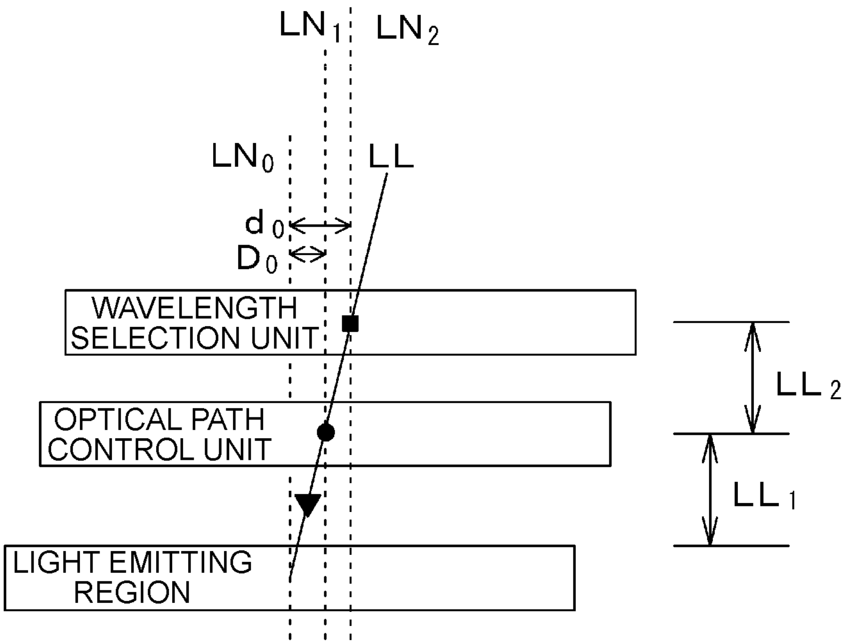
FIG. 46 is a conceptual diagram for explaining a relationship between the normal line $LN_0$ passing through the center of the light emitting region, the normal line $LN_1$ passing through the center of the optical path control unit, and the normal line $LN_2$ passing through the center of the wavelength selection unit in the display apparatus of Example 5.

Further, as illustrated in the conceptual diagram of FIG. 46, the normal line $LN_0$ passing through the center of the light emitting region does not match the normal line $LN_2$ passing through the center of the wavelength selection unit CF or the normal line $LN_1$ passing through the centers of the optical path control units 71, 72, and the normal line $LN_1$ passing through the center of the optical path control units 71, 72 does not match the normal line $LN_0$ passing through the center of the light emitting region or the normal line $LN_2$ passing through the center of the wavelength selection unit CF in some cases. Here, the center of the wavelength selection unit CF is preferably positioned on the straight line LL connecting the center of the light emitting region and the centers of the optical path control units 71, 72. Specifically, when the distance in the thickness direction from the center of the light emitting region to the centers (indicated by a black circle in FIG. 46) of the optical path control units 71, 72 is $LL_1$, and the distance from the centers of the optical path control units 71, 72 to the center (indicated by a black square in FIG. 46) of the wavelength selection unit CF is $LL_2$, $$d_0 > D_1 > 0$$

is satisfied, and considering variations in production, $$D_1 : d_0 = LL_1 : (LL_1 + LL_2)$$

is preferably satisfied.

The present disclosure has been described above based on preferred Examples. The present disclosure is not limited to these Examples. The configurations and structures of the display apparatus (organic EL display apparatus) and the light emitting element (organic EL element) described in Examples are examples and may be appropriately changed, and the production methods of the light emitting element and the display apparatus are also examples and may be appropriately changed.

In Examples, an organic EL element has been described as an example of the light emitting element, but the light emitting element is not limited to the organic EL element. In the light emitting element of the present disclosure including the various preferable forms and configurations described above, the light emitting unit 30 may be composed of a known light emitting diode (LED).

The light emitting diode may have a form including at least a stacked light emitting body structure formed of a first compound semiconductor layer, an active layer, and a second compound semiconductor layer. The stacked light emitting body structure in which the first compound semiconductor layer, the active layer, and the second compound semiconductor layer are stacked may include, for example, a GaN compound semiconductor including AlGaN mixed crystal, AlInGaN mixed crystal, and a GaInN mixed crystal), an AlGaInAs compound semiconductor, an AlGaInP compound semiconductor, a ZnSe compound semiconductor (including ZnS, ZnSSe, and ZnMgSSe, for example), and a ZnO compound semiconductor. More specific examples of the AlInGaN compound semiconductor include GaN, AlGaN, InGaN, and AlInGaN. Further, these compound semiconductors may contain a boron (B) atom, a thallium (Tl) atom, an arsenic (As) atom, a phosphorus (P) atom, or an antimony (Sb) atom as desired. Examples of a material constituting an electrode connected to the stacked light emitting body structure for driving the stacked light emitting body structure include Pd, ITO, an AuGe/NiAu stacked structure, a Ti/Pt/Au stacked structure, and a Ni/Au stacked structure.

The active layer desirably has a quantum well structure. Specifically, the active layer may have a single quantum well structure (SQW structure) or a multiple quantum well structure (MQW structure). The active layer having a quantum well structure has a structure in which at least one well layer and one barrier layer are stacked, and examples of the combination of (compound semiconductor constituting the well layer, compound semiconductor constituting the barrier layer) include ($In_yGa_{(1-y)}N$, GaN), ($In_yGa_{(1-y)}N$, $In_zGa_{(1-z)}N$) [where y>z], and ($In_yGa_{(1-y)}N$, AlGaN). The first compound semiconductor layer may be composed of a compound semiconductor of a first conductivity type (for example, n-type), and the second compound semiconductor layer may be composed of a compound semiconductor of a second conductivity type (for example, p-type) different from the first conductivity type. The first compound semiconductor layer and the second compound semiconductor layer are also referred to as a first cladding layer and a second cladding layer. Each of the first compound semiconductor layer and the second compound semiconductor layer may be a single structure layer, a multilayer structure layer, or a superlattice structure layer. Further, each of the layers may be a layer including a composition gradient layer or a concentration gradient layer.

Examples of group III atoms constituting the stacked structure include gallium (Ga), indium (In), and aluminum (Al), and examples of group V atoms constituting the stacked structure include arsenic (As), phosphorus (P), antimony (Sb), and nitrogen (N). Specific examples thereof include AlAs, GaAs, AlGaAs, AlP, GaP, GaInP, AlInP, AlGaInP, AlAsP, GaAsP, AlGaAsP, AlInAsP, GaInAsP, AlInAs, GaInAs, AlGaInAs, AlAsSb, GaAsSb, AlGaAsSb, AlN, GaN, InN, AlGaN, GaNAs, and GaInNAs. Specific examples of the compound semiconductor constituting the active layer include GaAs, AlGaAs, GaInAs, GaInAsP, GaInP, GaSb, GaAsSb, GaN, InN, GaInN, GaInN, GaInNAs, and GaInNAsSb.

Examples of the quantum well structure include a two-dimensional quantum well structure, a one-dimensional quantum well structure (quantum wire), and a zero-dimensional quantum well structure (quantum dot). Examples of a material constituting the quantum well include, but are not limited to, Si; Se; CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$, which are chalcopyrite compounds; perovskite materials; GaAs, GaP, InP, AlGaAs, InGaP, AlGaInP, InGaAsP, GaN, InAs, InGaAs, GaInNAs, GaSb, and GaAsSb, which are group III-V compounds; CdSe, CdSeS, CdS, CdTe, $In_2Se_3$, $In_2S_3$, $Bi_2Se_3$, $Bi_2S_3$, ZnSe, ZnTe, ZnS, HgTe, HgS, PbSe, PbS, and $TiO_2$.

The light emitting diode may be provided with a wavelength conversion material layer (color conversion material layer). In this case, white light may be emitted via the wavelength conversion material layer (color conversion material layer). When blue light is emitted from the stacked light emitting body structure, white light may be emitted via the wavelength conversion material layer by adopting the following forms.

[A] White light in which blue and yellow are mixed is obtained as light emitted from the wavelength conversion material layer by using a wavelength conversion material layer that converts blue light emitted from the stacked light emitting body structure into yellow light.

[B] White light in which blue and orange are mixed is obtained as light emitted from the wavelength conversion material layer by using a wavelength conversion material layer that converts blue light emitted from the stacked light emitting body structure into orange light.

[C] White light in which blue, green, and red are mixed is obtained as light emitted from the wavelength conversion material layer by using a wavelength conversion material layer that converts blue light emitted from the stacked light emitting body structure into green light and a wavelength conversion material layer that converts the blue light into red light.

Alternatively, when ultraviolet rays are emitted from the stacked light emitting body structure, white light may be emitted via the wavelength conversion material layer by adopting the following forms.

[D] White light in which blue and yellow are mixed is obtained as light emitted from the wavelength conversion material layer by using a wavelength conversion material layer that converts light of ultraviolet rays emitted from the stacked light emitting body structure into blue light and a wavelength conversion material layer that converts the light of ultraviolet rays into yellow light.

[E] White light in which blue and orange are mixed is obtained as light emitted from the wavelength conversion material layer by using a wavelength conversion material layer that converts light of ultraviolet rays emitted from the stacked light emitting body structure into blue light and a wavelength conversion material layer that converts the light of ultraviolet rays into orange light.

[F] White light in which blue, green, and red are mixed is obtained as light emitted from the wavelength conversion material layer by using a wavelength conversion material layer that converts light of ultraviolet rays emitted from the stacked light emitting body structure into blue light, a wavelength conversion material layer that converts the light of ultraviolet rays into green light, and a wavelength conversion material layer that converts the light of ultraviolet rays into red light.

Here, examples of the wavelength conversion material that is excited by blue light and emits red light include, specifically, red light-emitting phosphor particles, more specifically, (ME:Eu)S ["ME" is at least one atom selected from the group consisting of Ca, Sr, and Ba, the same applies hereinafter], $(M:Sm)_x(Si,Al)_{12}(O,N)_{16}$ ["M" is at least one atom selected from the group consisting of Li, Mg, and Ca, the same applies hereinafter], $ME_2Si_5N_8$:Eu, (Ca:Eu)$SiN_2$, and (Ca:Eu)$AlSiN_3$. Examples of the wavelength conversion material that is excited by blue light and emits green light include, specifically, green-emitting phosphor particles, more specifically, (ME:Eu)$Ga_2S_4$, $(M:RE)_x(Si,Al)_{12}(O,N)_{16}$ ["RE" is Tb and Yb], $(M:Tb)_x(Si,Al)_{12}(O,N)_{16}$, $(M:Yb)_x(Si,Al)_{12}(O,N)_{16}$, and $Si_{6-Z}Al_ZO_ZN_{8-Z}$:Eu. Examples of the wavelength conversion material that is excited by blue light and emits yellow light include, specifically, yellow-emitting phosphor particles, more specifically, YAG (yttrium aluminum garnet) phosphor particles. The wavelength conversion material may be used singly or in combination of two or more thereof. Further, emission light of colors other than yellow, green, and red may be emitted from a wavelength conversion material mixture product by using a mixture of two or more of wavelength conversion materials. Specifically, for example, cyan light may be emitted, and in this case, a mixture of green-emitting phosphor particles (for example, $LaPO_4$:Ce Tb, $BaMgAl_{10}O_{17}$:Eu,Mn, $Zn_2SiO_4$:Mn, $MgAl_{11}O_{19}$:Ce,Tb, $Y_2SiO_5$:Ce, Tb, $MgAl_{11}O_{19}$:CE,Tb, Mn) and blue-emitting phosphor particles (for example, $BaMgAl_{10}O_{17}$:Eu,$BaMg_2Al_{16}O_{27}$:Eu, $Sr_2P_2O_7$:Eu, $Sr_5(PO_4)_3Cl$:Eu, $(Sr,Ca,Ba,Mg)_5(PO_4)_3Cl$:Eu, $CaWO_4$, $CaWO_4$:Pb) may be used.

Examples of the wavelength conversion material that is excited by ultraviolet rays and emits red light include, specifically, red-emitting phosphor particles, more specifically, $Y_2O_3$:Eu, $YVO_4$:Eu, $Y(P,V)O_4$:Eu, $3.5MgO{\cdot}0.5MgF_2{\cdot}Ge_2$:Mn, $CaSiO_3$:Pb,Mn $Mg_6AsO_{11}$:Mn, $(Sr,Mg)_3(PO_4)_3$:Sn, $La_2O_2S$:Eu, and $Y_2O_2S$:Eu. Examples of the wavelength conversion material that is excited by ultraviolet rays and emits green light include, specifically, green-emitting phosphor particles, more specifically, $LaPO_4$:Ce, Tb, $BaMgAl_{10}O_{17}$:Eu, Mn, $Zn_2SiO_4$:Mn, $MgAl_{11}O_{19}$:Ce,Tb, $Y_2SiO_5$:Ce,Tb, $MgAl_{11}O_{19}$:CE, Tb, Mn, and $Si_{6-Z}Al_ZO_ZN_{8-Z}$:Eu. Examples of the wavelength conversion material that is excited by ultraviolet rays and emits blue light include, specifically, blue-emitting phosphor particles, more specifically, $BaMgAl_{10}O_{17}$:Eu, $BaMg_2Al_{16}O_{27}$:Eu, $Sr_2P_2O_7$:Eu, $Sr_5(PO_4)_3Cl$:Eu, $(Sr,Ca,Ba,Mg)_5(PO_4)_3Cl$:Eu, $CaWO_4$, and $CaWO_4$:Pb. Examples of the wavelength conversion material that is excited by ultraviolet rays and emits yellow light include, specifically, yellow-emitting phosphor particles, more specifically, YAG phosphor particles. The wavelength conversion material may be used singly or in combination of two or more thereof. Further, emission light of colors other than yellow, green, and red may be emitted from a wavelength conversion material mixture product by using a mixture of two or more of wavelength conversion materials. Specifically, cyan light may be emitted, and in this case, a mixture of the above-described green-emitting phosphor particles and blue-emitting phosphor particles may be used.

The wavelength conversion material (color conversion material) is not limited to phosphor particles. Examples of the material include light emitting particles in which a wave function of carriers is localized and a quantum well structure, such as a two-dimensional quantum well structure, a one-dimensional quantum well structure (quantum wire), or a zero-dimensional quantum well structure (quantum dot) using a quantum effect, is applied in an indirect transition type silicon-based material to efficiently convert carriers into light as in a direct transition type, and light emitting particles to which a technology of adding rare earth atoms to a semiconductor material, which are known to sharply emit light because of intra-shell transition, is applied.

Examples of the wavelength conversion material (color conversion material) include quantum dots as described above. As the size (diameter) of the quantum dot decreases, the band gap energy increases, and the wavelength of light emitted from the quantum dot decreases. That is, as the size of the quantum dot is smaller, light having a shorter wavelength (light on the blue light side) is emitted, and as the size is larger, light having a longer wavelength (light on the red light side) is emitted. Thus, it is possible to obtain a quantum dot that emits light having a desired wavelength (performs color conversion to a desired color) by using the same material constituting the quantum dot and adjusting the size of the quantum dot. Specifically, the quantum dot preferably has a core-shell structure. Examples of a material constituting the quantum dot include, but are not limited to, Si; Se; CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, $AgInSe_2$, which are chalcopyrite compounds; perovskite materials; GaAs, GaP, InP, InAs, InGaAs, AlGaAs, InGaP, AlGaInP, InGaAsP, GaN, which are III-V group compounds;

CdSe, CdSeS, CdS, CdTe, $In_2Se_3$, $In_2S_3$, $Bi_2Se_3$, $Bi_2S_3$, ZnSe, ZnTe, ZnS, HgTe, HgS, PbSe, PbS, and $TiO_2$.

In Examples, one pixel is mostly composed of three subpixels with a combination of a white light emitting element and a color filter layer, but for example, one pixel may be composed of four subpixels including a light emitting element that emits white light. Alternatively, the light emitting elements may be a red light emitting element in which an organic layer generates red, a green light emitting element in which an organic layer generates green, and a blue light emitting element in which an organic layer generates blue, and one pixel may be composed of a combination of these three types of light emitting elements (subpixels). In Examples, the light emitting element drive unit (drive circuit) is composed of a MOSFET, but it may be composed of a TFT. The first electrode and the second electrode may have a single-layer structure or a multilayer structure.

Figure 47:
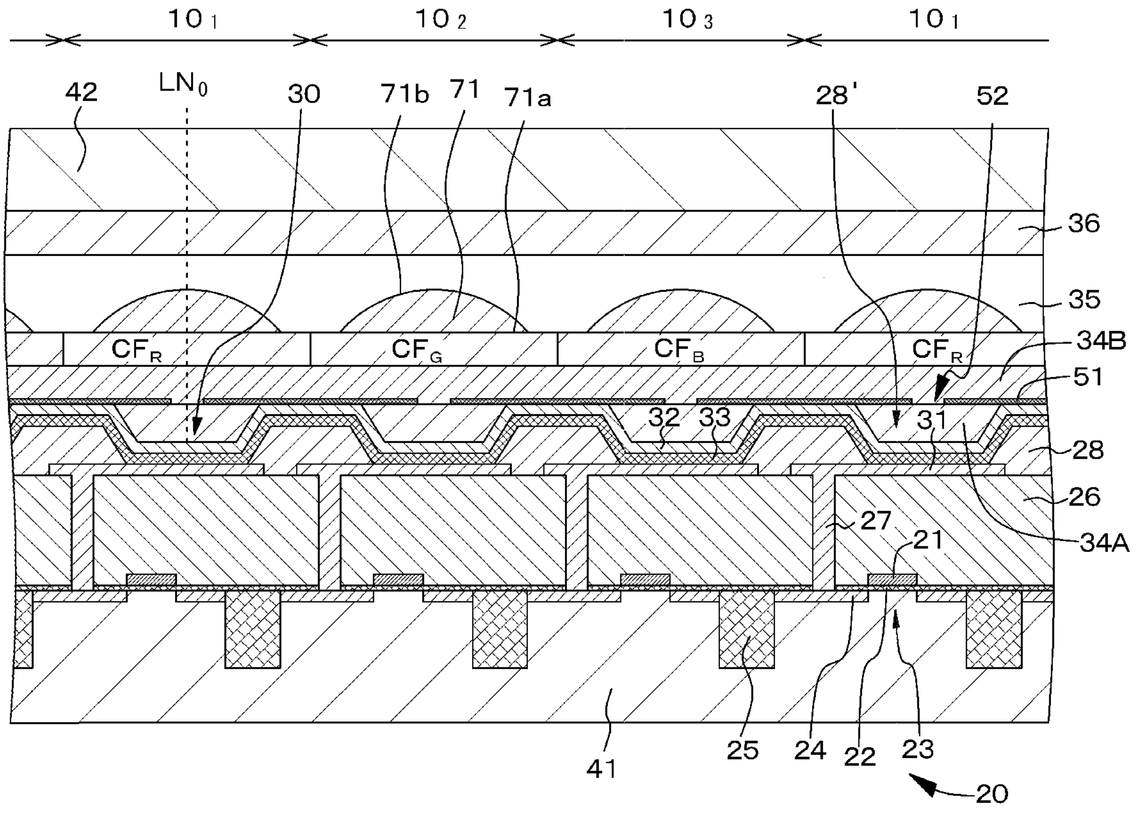
FIG. 47 is a schematic and partial sectional view of still another modification of the light emitting element and display apparatus of Example 1.

As illustrated in the schematic and partial sectional view of FIG. 47, in some cases, a form may be taken in which the protective layer 34A is not present between the top surface of the region of the insulating layer 28 surrounding the light emitting region and the light reflection film 51, that is, a form in which the top surface of the region of the insulating layer 28 surrounding the light emitting region and the light reflection film 51 are in contact with each other.

A light shielding unit may be provided between light emitting elements to prevent light emitted from a light emitting unit constituting a certain light emitting element from entering a light emitting element adjacent to the certain light emitting element and causing optical crosstalk. That is, a groove region may be formed between the light emitting elements, and the light shielding unit may be formed by embedding the groove region with a light shielding material. With the light shielding unit provided in this manner, it is possible to reduce probability of entering of light emitted from a light emitting unit constituting a certain light emitting element into an adjacent light emitting element, and it is possible to reduce occurrence of a phenomenon in which color mixture occurs and chromaticity of the entire pixel deviates from desired chromaticity. Since color mixture can be prevented, the color purity when the pixel emits light in a single color is increased, and the chromaticity point is deepened. Thus, the color gamut is widened, and the range of color representation of the display apparatus is widened. Specific examples of the light shielding material constituting the light shielding unit include materials capable of shielding light, such as titanium (Ti), chromium (Cr), tungsten (W), tantalum (Ta), aluminum (Al), and $MoSi_2$. The light shielding layer may be formed by vapor deposition methods including an electron beam vapor deposition method, a hot filament vapor deposition method, and a vacuum vapor deposition method, sputtering methods, CVD methods, ion plating methods, and the like. In addition, the color filter layer disposed for each pixel to increase the color purity may be thinned or omitted depending on the configuration of the light emitting element, which enables light absorbed in the color filter layer to be extracted, resulting in improvement in the light emission efficiency. Alternatively, a light shielding property may be imparted to the black matrix layer BM.

Figure 48A:
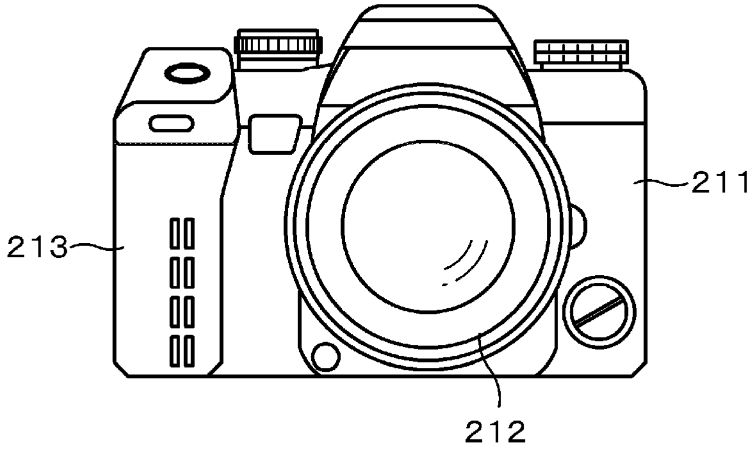
FIG. 48A is a front view of a digital still camera illustrating an example in which a display apparatus of the present disclosure is applied to a mirrorless interchangeable lens digital still camera.
Figure 48B:
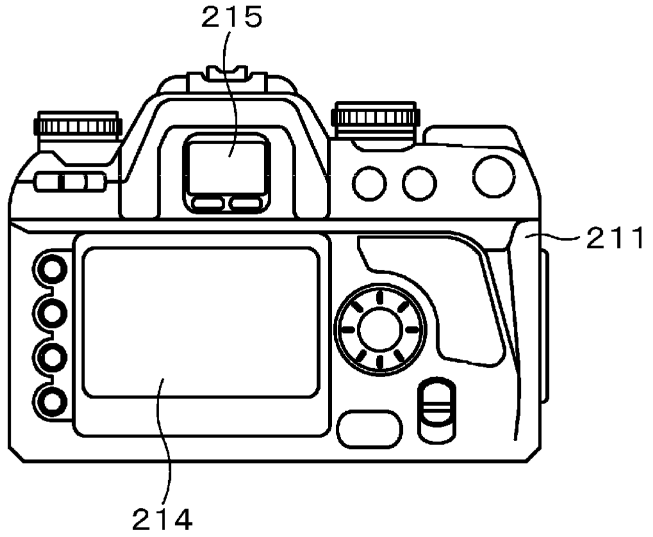
FIG. 48B is a back view of the digital still camera illustrating the example in which the display apparatus of the present disclosure is applied to a mirrorless interchangeable lens digital still camera.

The display apparatus of the present disclosure may be applied to a mirrorless interchangeable lens digital still camera. FIG. 48A is a front view of a digital still camera. FIG. 48B is a back view of the digital still camera. This mirrorless interchangeable lens digital still camera includes, for example, an interchangeable imaging lens unit (interchangeable lens) 212 on the front right side of a camera body 211, and a grip 213 to be held by a photographer on the front left side. A monitor device 214 is provided substantially at the center of the back surface of the camera body 211. An electronic view finder (eyepiece window) 215 is provided above the monitor device 214. The photographer can visually recognize an optical image of a subject guided from the imaging lens unit 212 and determine a composition by looking into the electronic view finder 215. The display apparatus of the present disclosure may be used as the electronic view finder 215 in a mirrorless interchangeable lens digital still camera having such a configuration.

Figure 49:
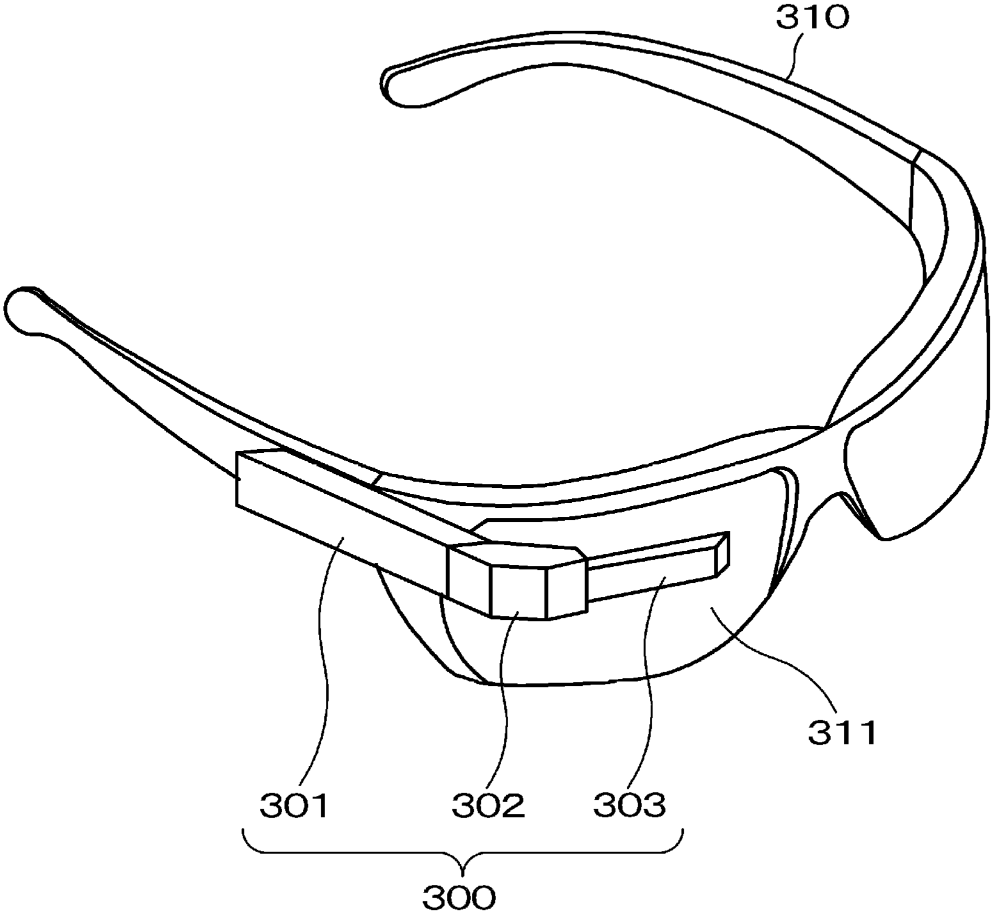
FIG. 49 is an external view of a head mounted display illustrating an example in which the display apparatus of the present disclosure is applied to a head mounted display.

The display apparatus of the present disclosure may also be applied to a head mounted display. As illustrated in the external view of FIG. 49, a head mounted display 300 is a transmissive head mounted display including a main body 301, an arm 302, and a lens barrel 303. The main body 301 is connected to the arm 302 and eyeglasses 310. Specifically, an end of the main body 301 in a long side direction is attached to the arm 302. One side surface of the main body 301 is connected to the eyeglasses 310 via a connection member (not illustrated). The main body 301 may be directly mounted on the head of a human body. The main body 301 incorporates a control board and a display unit for controlling the operation of the head mounted display 300. The arm 302 connects the main body 301 and the lens barrel 303 to support the lens barrel 303 with respect to the main body 301. Specifically, the arm 302 is coupled to an end of the main body 301 and an end of the lens barrel 303 to fix the lens barrel 303 to the main body 301. The arm 302 incorporates a signal line for communicating data related to an image provided from the main body 301 to the lens barrel 303. The lens barrel 303 projects image light provided from the main body 301 via the arm 302 toward the eyes of a user wearing the head mounted display 300 through a lens 311 of the eyeglasses 310. The display apparatus of the present disclosure may be used as the display unit incorporated in the main body 301 in the head mounted display 300 having the above configuration.

The optical path control unit may include a light emission direction control member described below. That is, the light emission direction control member constituting the optical path control unit may have a flat plate shape.

To increase the light use efficiency of the entire display apparatus, it is preferable to effectively collect light at the outer edge of the light emitting element. In a hemispherical lens or a lens formed of a part of sphere, the effect of collecting light near the center of the light emitting element to the front is large, but the effect of collecting light near the outer edge of the light emitting element may be small.

The side surfaces of the light emission direction control member constituting the optical path control unit are surrounded by a material or layer having a refractive index $n_5$ lower than the refractive index $n_4$ of the material constituting the light emission direction control member. Alternatively, the optical path control unit made of a material having the refractive index $n_4$ is surrounded by a material having the refractive index $n_5$. Thus, the light emission direction control member has a function as a kind of lens, and it can effectively enhance the light collection effect in the vicinity of the outer edge of the light emission direction control member. In geometrical optics, when a light beam enters a side surface of the light emission direction control member, the incident angle and the reflection angle is equal, and thus it is difficult to improve the extraction of light in the front direction. However, in wave motion analysis (FDTD), the light extraction efficiency in the vicinity of the outer edge of the light emission direction control member improves. Thus, light in the vicinity of the outer edge of the light emitting element can be effectively collected, and as a result, the light extraction efficiency in the front direction of the entire light emitting element can improve. This can achieve high light emission efficiency of the display apparatus. That is, it is possible to realize high luminance and low power consumption of the display apparatus. In addition, the light emission direction control member, which has a flat plate shape, can be formed easily, and the production process can be simplified.

Specifically, examples of the three-dimensional shape of the light emission direction control member include a columnar shape, an elliptical columnar shape, an oval columnar shape, a cylindrical shape, a prismatic shape (including a quadrangular prism, a hexagonal prism, an octagonal prism, and a prism with rounded ridges), a truncated conical shape, and a truncated pyramid (including a truncated pyramid with rounded ridges). The prism shape and the truncated pyramid include a regular prism shape and a regular truncated pyramid. A ridge part where a side surface of the light emission direction control member intersects the top surface may be rounded. The bottom surface of the truncated pyramid may be positioned on the first substrate side or on the second electrode side. Specific examples of the planar shape of the light emission direction control member include a circle, an ellipse, an oval, and a polygon including a triangle, a quadrangle, a hexagon, and an octagon. The polygon includes a regular polygon (including a regular polygon such as a square or a regular hexagon (honeycomb shape)). The light emission direction control member may be made of, for example, a transparent resin material, such as an acrylic resin, an epoxy resin, a polycarbonate resin, or a polyimide resin, or a transparent inorganic material, such as $SiO_2$. The “oval” refers to a figure in which ends of two semicircles are connected by line segments.

The sectional shape of the side surfaces of the light emission direction control member in the thickness direction may be linear, convexly curved, or concavely curved. That is, the side surfaces of the prism or the truncated pyramid shape may be flat, convexly curved, or concavely curved. A light emission direction control member extending part having a thickness smaller than the thickness of the light emission direction control member may be formed between light emission direction control members adjacent to each other.

The top surface of the light emission direction control member may be flat, may have an upward convex shape, or may have an upward concave shape, but from the viewpoint of improving the luminance in the front direction of the image display region (display panel unit) of the display apparatus, the top surface of the light emission direction control member is preferably flat. The light emission direction control member may be obtained by, for example, a combination of a photolithography technique and an etching method or may be formed based on a nanoimprint method.

The size of the planar shape of the light emission direction control member may be changed depending on the light emitting element. For example, when one pixel is composed of three subpixels, the size of the planar shape of the light emission direction control member may have the same value in the three subpixels constituting one pixel, may have the same value in two subpixels except for one subpixel, or may have different values in the three subpixels. The refractive index of the material constituting the light emission direction control member may also be changed depending on the light emitting element. For example, when one pixel is composed of three subpixels, the refractive index of the material constituting the light emission direction control member may have the same value in the three subpixels constituting one pixel, may have the same value in two subpixels except for one subpixel, or may have different values in the three subpixels.

The planar shape of the light emission direction control member is preferably similar to the light emitting region, or the light emitting region is preferably included in an orthogonal projection image of the light emission direction control member.

The side surfaces of the light emission direction control member are preferably vertical or substantially vertical. Specifically, examples of the inclination angle of the side surfaces of the light emission direction control member may include 80 degrees to 100 degrees, preferably 81.8 degrees or more and 98.2 degrees or less, more preferably 84.0 degrees or more and 96.0 degrees or less, still more preferably 86.0 degrees or more and 94.0 degrees or less, particularly preferably 88.0 degrees or more and 92.0 degrees or less, and most preferably 90 degrees.

Examples of the average height of the light emission direction control member may include 1.5 μm or more and 2.5 μm or less, with which the light collection effect in the vicinity of the outer edge of the light emission direction control member can be effectively enhanced. The height of the light emission direction control member may be changed depending on the light emitting element. For example, when one pixel is composed of three subpixels, the height of the light emission direction control member may have the same value in the three subpixels constituting one pixel, may have the same value in two subpixels except for one subpixel, or may have different values in the three subpixels.

The shortest distance between the side surfaces of adjacent light emission direction control members may be 0.4 μm or more and 1.2 μm or less, preferably 0.6 μm or more and 1.2 μm or less, more preferably 0.8 μm or more and 1.2 μm or less, and still more preferably 0.8 μm or more and 1.0 μm or less. By setting the minimum value of the shortest distance between the side surfaces of adjacent light emission direction control members to be 0.4 μm, the shortest distance between the adjacent light emission direction control members can be set to be about the same as the lower limit value of the wavelength band of visible light, and thus, it is possible to reduce the functional degradation of the material or layer surrounding the light emission direction control member, and as a result, it is possible to effectively enhance the light collection effect in the vicinity of the outer edge of the light emission direction control member. On the other hand, by setting the maximum value of the shortest distance between the side surfaces of adjacent light emission direction control members to be 1.2 μm, the size of the light emission direction control members can be reduced, and as a result, the light collection effect in the vicinity of the outer edge of the light emission direction control member can be effectively enhanced.

The distance between the centers of adjacent light emission direction control members is preferably 1 μm or more and 10 μm or less. With the distance set to 10 μm or less, the wave property of light remarkably appears, and thus, a high light collection effect can be imparted to the light emission direction control members.

The maximum distance (maximum distance in a height direction) from the light emitting region to the bottom surface of the light emission direction control member is desirably more than 0.35 μm and 7 μm or less, preferably 1.3 μm or more and 7 μm or less, more preferably 2.8 μm or more and 7 μm or less, and still more preferably 3.8 μm or more and 7 μm or less. By setting the maximum distance from the light emitting region to the light emission direction control member to be more than 0.35 μm, the light collection effect in the vicinity of the outer edge of the light emission direction control member can be effectively enhanced. On the other hand, by setting the maximum distance from the light emitting region to the light emission direction control member to be 7 μm or less, deterioration of the viewing angle properties can be reduced.

The number of light emission direction control members for one pixel may essentially take any number, and the number is one or more. For example, when one pixel is composed of a plurality of subpixels, one light emission direction control member may be provided corresponding to one subpixel, one light emission direction control member may be provided corresponding to a plurality of subpixels, or a plurality of light emission direction control members may be provided corresponding to one subpixel. When p×q of light emission direction control members are provided corresponding to one subpixel, the values of p, q may be 10 or less, preferably 5 or less, and more preferably 3 or less.

Figure 50:
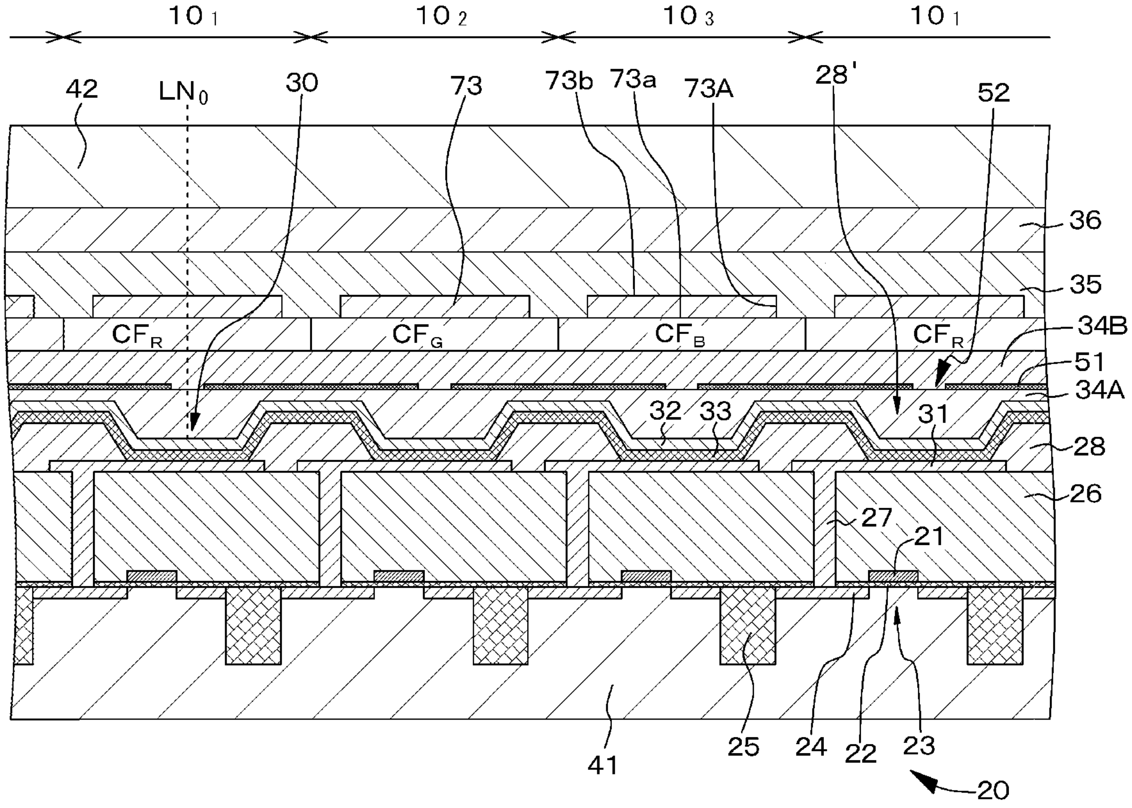
FIG. 50 is a schematic and partial sectional view of a display apparatus provided with a light emission direction control member.

As illustrated in the schematic and partial sectional view in FIG. 50, a light emission direction control member 73 as an optical path control unit is provided above the light emitting units 30, 30', specifically, at the same position as the optical path control units 71, 72. When the light emission direction control member is cut along a virtual plane (vertical virtual plane) including a thickness direction of the light emission direction control member 73, the sectional shape of the light emission direction control member 73 is rectangular. The three-dimensional shape of the light emission direction control member 73 is, for example, a quadrangular prism. With the material constituting the light emission direction control member 73 having a refractive index of $n_4$ and the material constituting the bonding member 35 having a refractive index of $n_0$ ($n_0=n_5<n_4$), the light emission direction control member 73 has a function as a kind of lens, and the light collection effect in the vicinity of the outer edge of the light emission direction control member 73 can be effectively enhanced, since the light emission direction control member 73 is surrounded by the bonding member 35 in the example illustrated in FIG. 50. In addition, the light emission direction control member 73, which has a flat plate shape, can be formed easily, and the production process can be simplified. The light emission direction control member 73 may be surrounded by a material different from the material constituting the bonding member 35 as long as the refractive index condition ($n_5<n_4$) is satisfied. Alternatively, the light emission direction control member 73 may be surrounded by, for example, an air layer or a decompression layer (vacuum layer). A light incident surface 73*a* and a light emission surface 73*b* of the light emission direction control member 73 are flat. The reference numeral 73A indicates a side surface of the light emission direction control member 73. The light emission direction control member 73 may be applied to various Examples and modifications thereof. In such a case, the refractive index of the material surrounding the light emission direction control member 73 may be appropriately selected.

The present disclosure may also have the following configurations.

[A01]<<Light Emitting Element>>

A light emitting element comprising:

a light emitting unit; and an optical path control unit provided above the light emitting unit, wherein a light reflection film including an opening is disposed between the light emitting unit and the optical path control unit.

[A02] The light emitting element according to [A01], wherein light emitted by the light emitting unit is emitted outside via at least the opening provided in the light reflection film and the optical path control unit.

[A03] The light emitting element according to [A01] or [A02], wherein a size of the light emitting unit (light emitting region) is larger than a size of the opening.

[A04] The light emitting element according to any one of [A01] to [A03], wherein $$1 \le \theta_{CA\text{-}2}/\theta_{CA\text{-}1}$$

is satisfied where $\theta_{CA\text{-}1}$ is a maximum complementary angle of an angle formed by a normal line $LN_0$ passing through a center of the light emitting unit and a straight line $LL_1$ connecting the center of the light emitting unit and an end of the optical path control unit, the straight line $LL_1$ forming the angle with which the maximum complementary angle is obtained, and $\theta_{CA\text{-}2}$ is a complementary angle of an angle formed by a straight line $LL_2$ and the normal line $LN_0$ passing through the center of the light emitting unit, the straight line $LL_2$ connecting an end of the opening included in a virtual plane including the straight line $LL_1$ and the normal line $LN_0$ and the center of the light emitting unit.

[A05] The light emitting element according to [A01] to [A04], wherein $$(b/2)^2 \le Dist \cdot \lambda_0$$

is satisfied where b is a width of the opening, Dist is a distance from the opening to the optical path control unit, and $\lambda_0$ is a wavelength of light emitted from the light emitting unit.

[A06] The light emitting element according to [A01] to [A05], wherein $$(b/2) \ge \lambda_0$$

is satisfied where b is a width of the opening, and $\lambda_0$ is a wavelength of the light emitted from the light emitting unit.

[A07] The light emitting element according to any one of [A01] to [A06], wherein a planar shape of the opening and a planar shape of the optical path control unit have a similar relationship or an approximate relationship.

[A08] The light emitting element according to any one of [A01] to [A07], wherein a protective layer and a planarization layer are formed between the light emitting unit and the optical path control unit from the light emitting unit side, and the light reflection film is disposed between the protective layer and the planarization layer.

[A09] The light emitting element according to [A08], wherein light emitted by the light emitting unit is emitted outside via at least the protective layer, the opening provided in the light reflection film, the planarization layer, and the optical path control unit.

[A10] The light emitting element according to [A08] or [A09], wherein the light reflection film has a convex shape in a direction away from the light emitting unit.

[A11] The light emitting element according to [A08] or [A09], wherein the light emitting unit has a convex shape in a direction away from the planarization layer.

[A12] The light emitting element according to any one of [A08] to [A11], wherein a transparent thin film is formed between a portion of the protective layer positioned at a bottom of the opening and the planarization layer.

[A13] The light emitting element according to any one of [A08] to [A12], wherein a first light scattering layer is formed beneath the light emitting unit.

[A14] The light emitting element according to any one of [A08] to [A13], wherein a second light scattering layer is formed at least in a portion of the protective layer positioned at a bottom of the opening.

[A15] The light emitting element according to any one of [A01] to [A14], wherein the light reflection film has an edge portion.

[A16] The light emitting element according to [A15], wherein a light absorbing material layer is formed on a region of a protective layer positioned outside the edge portion of the light reflection film.

[A17] The light emitting element according to [A15], wherein a groove is formed in a region of a protective layer positioned outside the edge portion of the light reflection film, and a planarization layer is extended in the groove.

[A18] The light emitting element according to [A17], wherein the light reflection film is extended on a side wall of the groove formed in the protective layer.

[A19] The light emitting element according to any one of [A01] to [A18], wherein the light emitting unit has a stacked structure of a first electrode, an organic layer, and a second electrode, and the light reflection film is formed above the second electrode.

[A20] The light emitting element according to [A19], wherein the organic layer includes a light emitting layer including an organic electroluminescence layer.

[A21] The light emitting element according to any one of [A01] to [A07], wherein the light emitting unit includes a light emitting diode.

[B01]<<Display Apparatus: First Aspect>>

A display apparatus comprising a plurality of light emitting elements each including: a light emitting unit; and an optical path control unit provided above the light emitting unit, wherein a light reflection film including an opening is disposed between the light emitting unit and the optical path control unit.

[B02]

A display apparatus including a plurality of the light emitting elements according to any one of [A01] to [A21].

[B03]<<Display Apparatus: Second Aspect>>

A display apparatus comprising:

a first substrate and a second substrate; and a plurality of light emitting element units each including a first light emitting element, a second light emitting element, and a third light emitting element provided on the first substrate, wherein each of the light emitting elements includes a light emitting unit provided above the first substrate and an optical path control unit provided above the light emitting unit, and a light reflection film including an opening is disposed between the light emitting unit and the optical path control unit.

[B04]

A display apparatus including:

a first substrate and a second substrate; and a plurality of light emitting element units each including a first light emitting element, a second light emitting element, and a third light emitting element provided on the first substrate, wherein each of the light emitting elements is the light emitting element according to any one of [A01] to [A21].

REFERENCE SIGNS LIST

10, 10$_1$, 10$_2$, 10$_3$ LIGHT EMITTING ELEMENT
20 TRANSISTOR
21 GATE ELECTRODE
22 GATE INSULATING LAYER
23 CHANNEL FORMATION REGION
24 SOURCE/DRAIN REGION
25 ELEMENT ISOLATION REGION
26 BASE
26A SURFACE OF BASE
27 CONTACT PLUG
28 INSULATING LAYER
28' OPENING REGION
29 RECESS
29A SLOPE OF RECESS
29B BOTTOM OF RECESS
30, 30', 30$_1$, 30$_2$, 30$_3$ LIGHT EMITTING UNIT
31, 31$_1$, 31$_2$, 31$_3$ FIRST ELECTRODE
32, 32$_1$, 32$_2$, 32$_3$ SECOND ELECTRODE
33, 33$_1$, 33$_2$, 33$_3$ ORGANIC LAYER
34A PROTECTIVE LAYER
34B PLANARIZATION LAYER
34B' EXTENDING PART OF PLANARIZATION LAYER
35 BONDING MEMBER (SEALING RESIN LAYER)
36 UNDERLAYER
37, 37$_1$, 37$_2$, 37$_3$ LIGHT REFLECTION LAYER
38, 38', 38$_1$, 38$_2$, 38$_3$, 38$_1$', 38$_2$', 38$_3$' INTERLAYER INSULATING MATERIAL LAYER
39 UNDERLYING FILM
41 FIRST SUBSTRATE
42 SECOND SUBSTRATE
51 LIGHT REFLECTION FILM
51' DISCONTINUOUS PORTION OF LIGHT REFLECTION FILM
51" EXTENDING PART OF LIGHT REFLECTION FILM
52 OPENING
52$_{END}$ END OF OPENING
53 PHOTONIC CRYSTAL LAYER
54 TRANSPARENT THIN FILM
55 FIRST LIGHT SCATTERING LAYER
56A, 56B SECOND LIGHT SCATTERING LAYER
57 PHOTONIC CRYSTAL LAYER
58 LIGHT ABSORBING MATERIAL LAYER
59 GROOVE
61 MASK LAYER
62, 63, 64 RESIST LAYER
65 OPENING REGION
71, 72 OPTICAL PATH CONTROL UNIT

71*a*, 72*a* LIGHT INCIDENT SURFACE OF OPTICAL PATH CONTROL UNIT (LENS MEMBER)
71*b*, 72*b* LIGHT EMISSION SURFACE OF OPTICAL PATH CONTROL UNIT (LENS MEMBER)
$\mathbf{71}_{END}$ END OF OPTICAL PATH CONTROL UNIT
73 LIGHT EMISSION DIRECTION CONTROL MEMBER
73*a* LIGHT INCIDENT SURFACE OF LIGHT EMISSION DIRECTION CONTROL MEMBER
73*b* LIGHT EMISSION SURFACE OF LIGHT EMISSION DIRECTION CONTROL MEMBER
211 CAMERA BODY
212 PHOTOGRAPHING LENS UNIT (INTERCHANGEABLE LENS)
213 GRIP
214 MONITOR DEVICE
215 ELECTRONIC VIEW FINDER (EYEPIECE WINDOW)
300 HEAD MOUNTED DISPLAY
301 MAIN BODY
302 ARM
303 LENS BARREL
310 EYEGLASSES
CF, $CF_R$, $CF_G$, $CF_B$ WAVELENGTH SELECTION UNIT (COLOR FILTER LAYER)
TF TRANSPARENT FILTER LAYER
BM LIGHT ABSORBING LAYER (BLACK MATRIX LAYER)
$LN_0$ NORMAL LINE PASSING THROUGH CENTER OF LIGHT EMITTING REGION (LIGHT EMITTING UNIT)
$LN_1$ OPTICAL AXIS OF SECOND OPTICAL PATH CONTROL UNIT
$LN_2$ NORMAL LINE PASSING THROUGH CENTER OF WAVELENGTH SELECTION UNIT
$LL_1$ STRAIGHT LINE CONNECTING CENTER OF LIGHT EMITTING UNIT AND END OF OPTICAL PATH CONTROL UNIT
$LL_2$ STRAIGHT LINE CONNECTING END OF OPENING INCLUDED IN VIRTUAL PLANE INCLUDING STRAIGHT LINE $LL_1$ AND NORMAL LINE $LN_0$ AND CENTER OF LIGHT EMITTING UNIT

The invention claimed is:

1. A light emitting element, comprising:
a light emitting unit; and
an optical path control unit above the light emitting unit;
a protective layer and a planarization layer between the light emitting unit and the optical path control unit from a side of the light emitting unit; and
a light reflection film between the protective layer and the planarization layer, wherein
the light reflection film includes an opening, and
the light reflection film has a convex shape in a direction away from the light emitting unit.

2. The light emitting element according to claim 1, wherein the light emitting unit is configured to emit light outside via at least the opening in the light reflection film and the optical path control unit.

3. The light emitting element according to claim 1, wherein $$1 \leq \theta_{CA\text{-}2}/\theta_{CA\text{-}1}$$

is satisfied where
$\theta_{CA\text{-}1}$ is a maximum complementary angle of an angle formed by a normal line $LN_0$ passing through a center of the light emitting unit and a straight line $LL_1$ connecting the center of the light emitting unit and an end of the optical path control unit,
the straight line $LL_1$ forming the angle with which the maximum complementary angle is obtained, and
$\theta_{CA\text{-}2}$ is a complementary angle of an angle formed by a straight line $LL_2$ and the normal line $LN_0$ passing through the center of the light emitting unit,
the straight line $LL_2$ connecting an end of the opening included in a virtual plane including the straight line $LL_1$ and the normal line $LN_0$ and the center of the light emitting unit.

4. The light emitting element according to claim 1, wherein a planar shape of the opening and a planar shape of the optical path control unit have a similar relationship or an approximate relationship.

5. The light emitting element according to claim 1, wherein the light emitting unit is configured to emit light outside via at least the protective layer, the opening in the light reflection film, the planarization layer, and the optical path control unit.

6. The light emitting element according to claim 1, wherein the light emitting unit has the convex shape in a direction away from the planarization layer.

7. The light emitting element according to claim 1, further comprising a transparent thin film between a portion of the protective layer and the planarization layer, wherein the portion of the protective layer is at a bottom of the opening.

8. The light emitting element according to claim 1, further comprising a first light scattering layer is beneath the light emitting unit.

9. The light emitting element according to claim 1, further comprising a second light scattering layer at least in a portion of the protective layer at a bottom of the opening.

10. The light emitting element according to claim 1, wherein the light reflection film has an edge portion.

11. The light emitting element according to claim 10, further comprising a light absorbing material layer on a region of the protective layer, wherein the region of the protective layer is outside the edge portion of the light reflection film.

12. The light emitting element according to claim 10, further comprising a groove in a region of the protective layer, wherein
the region of the protective layer is outside the edge portion of the light reflection film, and
the planarization layer is extended in the groove.

13. The light emitting element according to claim 12, wherein the light reflection film is extended on a side wall of the groove in the protective layer.

14. The light emitting element according to claim 1, wherein
the light emitting unit has a stacked structure of a first electrode, an organic layer, and a second electrode, and
the light reflection film is above the second electrode.

15. The light emitting element according to claim 14, wherein
the organic layer includes a light emitting layer, and
the light emitting layer includes an organic electroluminescence layer.

16. The light emitting element according to claim 1, wherein the light emitting unit includes a light emitting diode.

17. A display apparatus, comprising:
a plurality of light emitting elements, wherein each light emitting element of the plurality of light emitting elements includes:

a light emitting unit; and an optical path control unit above the light emitting unit;

a protective layer and a planarization layer between the light emitting unit and the optical path control unit from a side of the light emitting unit; and a light reflection film between the protective layer and the planarization layer, wherein the light reflection film includes an opening, and the light reflection film has a convex shape in a direction away from the light emitting unit.

18. A display apparatus, comprising:

a first substrate and a second substrate; and a plurality of light emitting element units, wherein each light emitting element unit of the plurality of light emitting element units includes a plurality of light emitting elements, the plurality of light emitting elements includes a first light emitting element, a second light emitting element, and a third light emitting element on the first substrate, and each light emitting element of the plurality of light emitting elements includes:

a light emitting unit above the first substrate;

an optical path control unit above the light emitting unit;

a protective layer and a planarization layer between the light emitting unit and the optical path control unit from a side of the light emitting unit; and a light reflection film between the protective layer and the planarization layer, wherein the light reflection film includes an opening, and the light reflection film has a convex shape in a direction away from the light emitting unit.

* * * * *